(12) United States Patent
Ikezawa et al.

(10) Patent No.: US 7,397,139 B2
(45) Date of Patent: Jul. 8, 2008

(54) EPOXY RESIN MOLDING MATERIAL FOR SEALING USE AND SEMICONDUCTOR DEVICE

(75) Inventors: Ryoichi Ikezawa, Tsukuba (JP); Naoki Nara, Tochigi (JP); Hideyuki Chaki, Oyama (JP); Yoshihiro Mizukami, Chikusei (JP); Yoshinori Endou, Chikusei (JP); Takaki Kashihara, Oyama (JP); Fumio Furusawa, Yuki (JP); Masaki Yoshii, Yokohama (JP); Shinsuke Hagiwara, Chikusei (JP); Mitsuo Katayose, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 106 days.

(21) Appl. No.: 10/552,441

(22) PCT Filed: Apr. 7, 2004

(86) PCT No.: PCT/JP2004/005004

§ 371 (c)(1),
(2), (4) Date: Oct. 7, 2005

(87) PCT Pub. No.: WO2004/090033

PCT Pub. Date: Oct. 21, 2004

(65) Prior Publication Data

US 2006/0214153 A1     Sep. 28, 2006

(30) Foreign Application Priority Data

| Apr. 7, 2003 | (JP) | ............................. | 2003-103346 |
| Apr. 7, 2003 | (JP) | ............................. | 2003-103357 |
| Apr. 7, 2003 | (JP) | ............................. | 2003-103435 |
| Apr. 7, 2003 | (JP) | ............................. | 2003-103438 |
| Apr. 7, 2003 | (JP) | ............................. | 2003-103443 |

(51) Int. Cl.
*H01L 23/28* (2006.01)

(52) U.S. Cl. ........................ 257/787; 257/789; 257/792; 257/793; 257/794; 257/795; 257/E23.107; 257/E23.121

(58) Field of Classification Search ................. 257/787, 257/E23.119
See application file for complete search history.

(56) References Cited

U.S. PATENT DOCUMENTS 5,137,940 A * 8/1992 Tomiyoshi et al. .......... 523/220

(Continued)

FOREIGN PATENT DOCUMENTS

JP          63-245947          10/1988

(Continued)

OTHER PUBLICATIONS

Notice of Rejection (Official Action), for Japanese Patent Application No. 2003-103346, mailed Sep. 19, 2006.

(Continued)

*Primary Examiner*—Jasmine J Clark
(74) *Attorney, Agent, or Firm*—Antonelli, Terry, Stout & Kraus, LLP.

(57) ABSTRACT

An encapsulating epoxy resin molding material, comprising (A) an epoxy resin, (B) a curing agent, and (C) an inorganic filler, wherein the inorganic filler (C) has an average particle size of 12 μm or less and a specific surface area of 3.0 m$^2$/g or more.

25 Claims, 2 Drawing Sheets

U.S. PATENT DOCUMENTS

| | | | |
|---|---|---|---|
| 5,908,882 A * | 6/1999 | Togashi et al. | 523/443 |
| 6,207,296 B1 * | 3/2001 | Higuchi et al. | 428/620 |
| 6,297,306 B1 * | 10/2001 | Osada et al. | 524/406 |
| 6,319,619 B1 * | 11/2001 | Yamamoto et al. | 428/620 |
| 6,376,923 B1 * | 4/2002 | Sumita et al. | 257/791 |
| 2003/0148109 A1 * | 8/2003 | Timberlake et al. | 428/417 |
| 2003/0151032 A1 * | 8/2003 | Ito et al. | 252/570 |
| 2003/0201548 A1 * | 10/2003 | Ikezawa et al. | 257/793 |
| 2006/0014873 A1 * | 1/2006 | Ikezawa et al. | 524/413 |
| 2006/0142438 A1 * | 6/2006 | Ishii et al. | 524/100 |

FOREIGN PATENT DOCUMENTS

| | | |
|---|---|---|
| JP | 03-177450 | 8/1991 |
| JP | 05-175262 | 7/1993 |
| JP | 07-122683 | 5/1995 |
| JP | 07-242731 | 9/1995 |
| JP | 07-273251 | 10/1995 |
| JP | 10-101906 | 4/1998 |
| JP | 10-114853 | 5/1998 |
| JP | 10-158365 | 6/1998 |
| JP | 11-106480 | 4/1999 |
| JP | 11-288979 | 10/1999 |
| JP | 11-302506 | 11/1999 |
| JP | 11-323090 | 11/1999 |
| JP | 2000-053844 | 2/2000 |
| JP | 2000-273287 | 10/2000 |
| JP | 2001-131391 | 5/2001 |
| JP | 2001-151866 | 6/2001 |
| JP | 2002-097258 | 4/2002 |
| JP | 2002-322345 | 11/2002 |
| JP | 2002-348442 | 12/2002 |
| JP | 2003-026769 | 1/2003 |
| JP | 2003-082243 | 3/2003 |
| JP | 2003-321694 | 11/2003 |
| JP | 2004-059779 | 2/2004 |
| WO | WO 02/24808 | 3/2002 |

OTHER PUBLICATIONS

Notice of Rejection (Official Action), for Japanese Patent Application No. 2003-103357, mailed Sep. 19, 2006.
Notice of Rejection (Official Action), for Japanese Patent Application No. 2003-103435, mailed Sep. 19, 2006.
Notice of Rejection (Official Action), for Japanese Patent Application No. 2003-103438, mailed Sep. 19, 2006.
Notice of Rejection (Official Action), for Japanese Patent Application No. 2003-103443, mailed Sep. 19, 2006.
Taiwanese Office Action of Application No. 093109601dated Apr. 10, 2006 with an English language translation.
Official Action, for Japanese Patent Application No. 2003-103346, mailed Mar. 20, 2007.
Official Action, for Japanese Patent Application No. 2003-103357, mailed Mar. 20, 2007.
Official Action, for Japanese Patent Application No. 2003-103443, mailed Mar. 20, 2007.

* cited by examiner

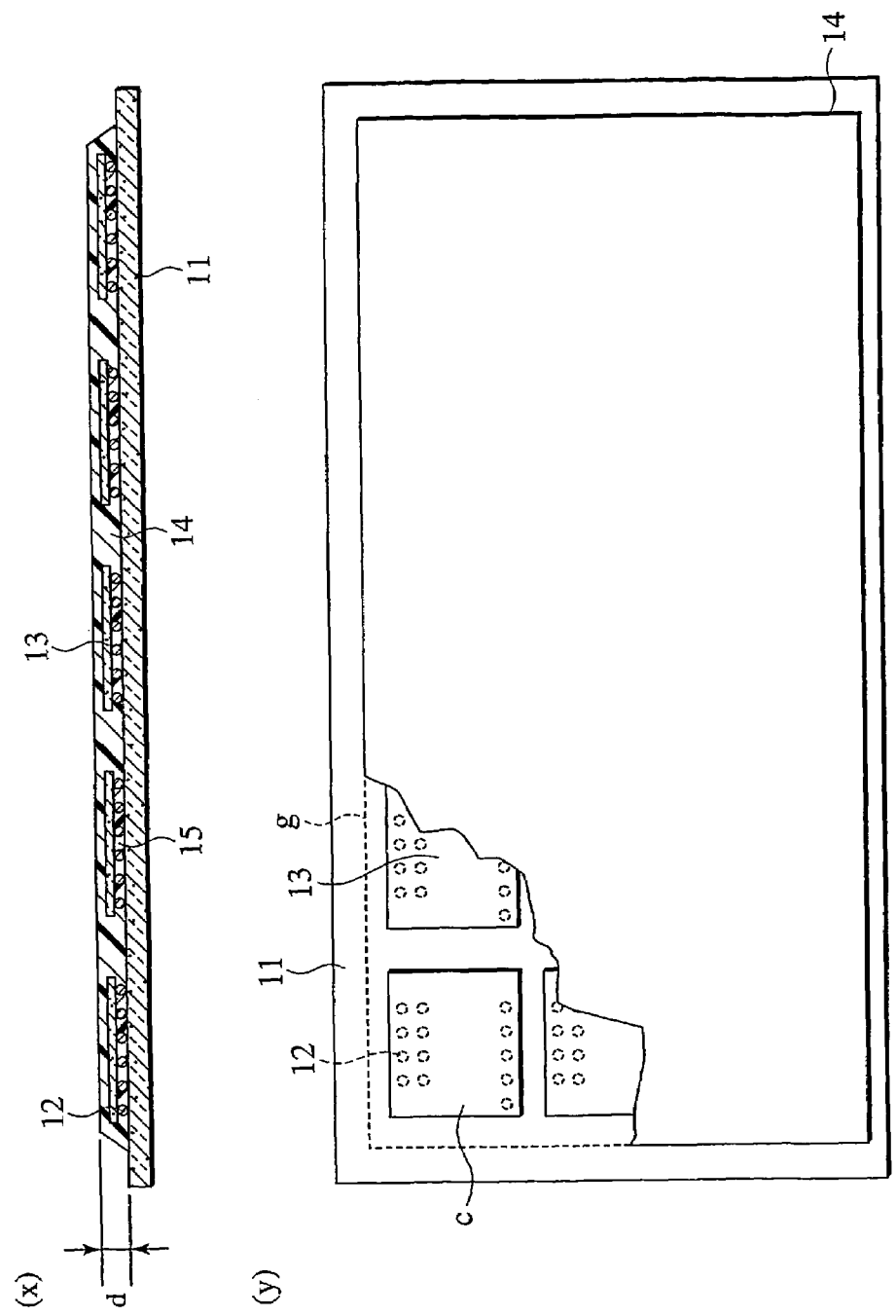

ns based on Japanese Patent Application No. 2003-
EPOXY RESIN MOLDING MATERIAL FOR SEALING USE AND SEMICONDUCTOR DEVICE The present application is an application with priority claims based on Japanese Patent Application No. 2003-103346 (filing date: Apr. 7, 2003), Japanese Patent Application No. 2003-103357 (filing date: Apr. 7, 2003), Japanese Patent Application No. 2003-103435 (filing date: Apr. 7, 2003), Japanese Patent Application No. 2003-103438 (filing date: Apr. 7, 2003), and Japanese Patent Application No. 2003-103443 (filing date: Apr. 7, 2003). Specifications thereof are incorporated herein for reference.

TECHNICAL FIELD

The present invention relates to an encapsulating epoxy resin molding material and a semiconductor device.

More specifically, the present invention relates to an encapsulating epoxy resin molding material excellent in filling ability suitable as an under filler for mounting a flip chip. The invention also relates to a flip chip package type semiconductor device which has no molding defects such as voids, is good in reliabilities such as reflow resistance and humidity resistance, and is encapsulated by the above-mentioned encapsulating epoxy resin molding material.

BACKGROUND ART

Hitherto, in the field for encapsulating elements in electronic member devices such as transistors and ICs, encapsulation with resin has been becoming the main current from the viewpoint of productivity, costs and others, and epoxy resin molding material has widely been used. This is because epoxy resin is good in balance between various properties, such as electrical property, humidity resistance, heat resistance, mechanical property, and adhesive property to inserted articles.

In recent years, a phenomenon that electronic parts are mounted on a printed-wiring board at a higher density has been making an advance. In connection therewith, about semiconductor devices, surface mounted type packages have been become the main current instead of conventional pin inserted type packages. About surface mounted type ICs, LSIs, or the like, the package thereof is thin and small-sized in order to make the package density high and make the package height low. Thus, the occupation volume of the elements in the package has become large and the thickness of the package has become very small. The elements have come to have a multifunction and a large capacity, and accordingly the area of the chip therefor and the number of pins there for have been increased. Furthermore, on the basis of an increase in the number of pads (electrodes) therefor, the pitch of the pads and the dimensions of the pads have been decreasing. Thus, the so-called pad-pitch-narrowing has also been advancing. In order to cope with a further reduction in the size and the weight, the form of packages has been changing from a quad flat package (QFP) or a small outline package (SOP) to a chip size package (CSP) or a ball grid array (BGA), which copes easily with an increase in pins therein and can attain higher density packaging. About these packages, in recent years, new structure types such as a face-down type, a stacked type, a flip chip type and a wafer level type have been developed in order to realize high operation-speed or multifunctional semiconductor devices.

Flip chip packaging is a connecting technique instead of conventional wire bonding. Solder bumps are stuck onto pads of a semiconductor chip, and the bumps are used to connect them to lands on a wiring board. The chip onto which the solder bumps are stuck is positioned on the wiring board, and then the solder is melted by reflow. Electric and mechanical connections are then formed through a self alignment process. In the thus-packaged device, an under filler is filled into a gap between the chip and the wiring board in order to improve various reliabilities. The under filler is required to have a high filling ability in order to fill the material completely into the narrow gap, wherein the solder bumps are arranged, without generating cavities such as voids.

In order to solve this problem, there has been hitherto adopted a method of using an encapsulating epoxy resin molding material of a solvent or non-solvent liquid type which is made mainly of a bisphenol epoxy resin, penetrating the material into the gap between the chip and the wiring board by use of capillarity, and then curing the material.

However, the liquid type encapsulating epoxy resin molding material is expensive. Thus, from the viewpoint of a reduction in costs, a new vacuum-manner molding technique using a solid type encapsulating epoxy resin molding material has been developed for an under fill for flip chips. However, the conventional solid type molding material has a low filling ability. As a result, it is difficult to encapsulate semiconductor elements without generating defects such as voids in the present circumferences. For example, in the production of a next-generation flip chip type semiconductor device having solder bumps arrange data fine pitch, at the time of encapsulating it with a conventional solid type encapsulating epoxy resin, the filling thereof into an under fill portion is unsatisfactorily because of the generation of voids having a somewhat large size of about 0.1 mm in diameter. Hereafter, a higher filling ability will be required in light of a tendency that the height and pitch of bumps decrease and further the number of the bumps and the chip area increase, following an increase in the number of inputs and outputs.

For this reason, an encapsulating epoxy resin molding material has been desired which is excellent in filling ability suitable as an under filler for flip chip packaging. Furthermore, a flip chip type semiconductor device has been desired which has solder bumps arranged at a fine pitch, has no molding defects, and is good in reliabilities such as reflow resistance and humidity resistance.

Incidentally, for semiconductor devices in an up-to-date field, the mold array package (MAP) molding manner is established instead of lead frames which have been conventionally used as inserts, the MAP molding manner being a manner of mounting plural elements on an organic substrate, a ceramic substrate or the like, package-molding them with an epoxy resin molding material, and then cutting and separating the elements. This manner has been becoming the main current of molding manners from the viewpoint of a reduction in member costs and an improvement in productivity. In this case, there has been developed a method called flip chip packaging, wherein solder balls are fitted to elements instead of Au lines used as connectors between the elements and wiring and then the solder balls are used to connect the elements to lands on a wiring board, from the viewpoint of high-speed operability and high functionalization of the elements. A chip onto which solder balls are stuck is positioned on a wiring board, and then the solder is melted by reflow. Through a self-alignment process, electrical and mechanical connections are then formed therein.

However, according to flip chip packaging, the surface of elements and solder ball portions contact outer air. Therefore, the reliability is remarkably lowered. For this reason, investigations have been made for improving the reliability, making the size of semiconductors small, making the operating speed thereof high, and improving the productivity thereof by combining the packaging with the above-mentioned MAP molding manner.

Problems caused by combining the flip chip packaging with the MAP molding manner are a warp of a molded substrate, and a warp of packages cut into individual pieces. The substrate warp remarkably causes difficulties in the step of cutting and separating molded semiconductors into individual pieces or at the time of fitting solder bumps. Furthermore, the package warp causes poor connection at the time of mounting the package on a wiring board since the package is poor in flatness.

In order to solve this problem, a method of filling a liquid resin called an under filler has been hitherto investigated as a technique for encapsulating the surface of elements and solder ball portions. However, the liquid resin is more expensive than epoxy resin molding material, and easily causes a substrate warp after the curing of the resin is finished. For this reason, this method does not cope with encapsulation of large-sized substrates for an improvement in productivity. Thus, investigation on the application of epoxy resin molding material, which is inexpensive and is excellent in dimension stability, thereto has been started.

A new vacuum-manner molding technique using an encapsulating epoxy resin molding material of a solid type has been developed for an under fill for a flip chip. However, about conventional solid type molding material, there is adopted a method of making the amount of the filler lower than that of epoxy resin molding material for SMD from the viewpoint of an improvement in filling ability. Accordingly, a substrate warp and a package warp are easily generated by a shrinkage in the epoxy resin molding material after the material is cured.

Accordingly, there have been desired: an encapsulating epoxy resin molding material which keeps filling ability suitable for an under filler for flip chip packaging and less causes a substrate warp and a package warp after the substrate is encapsulated by the material; and a flip chip package type semiconductor device which is encapsulated by this material, has no molding defects such as voids, and is good in reliabilities such as reflow resistance and humidity resistance.

According to a first aspect of the present invention, an encapsulating epoxy resin molding material which is suitable for encapsulating a flip chip type package type semiconductor device and which has bumps arranged at a fine pitch and has a large number of inputs and outputs (a large number of the bumps) is provided. A flip chip type package type semiconductor device which has bumps arranged at a fine pitch, has a large number of inputs and outputs (a large number of the bumps) and is encapsulated by the encapsulating epoxy resin molding material according to the present invention is also provided.

According to a second aspect of the present invention, an encapsulating epoxy resin molding material which causes a decrease in the following: inconveniences in production which are caused by a warp of an encapsulated substrate of a flip chip package type semiconductor device; and a failure in mounting onto a wiring board, the failure being based on a warp of the package is provided. A flip chip package type semiconductor device which is encapsulated by the encapsulating epoxy resin molding material according to the present invention and causes a decrease in the following: inconveniences in production which are caused by a warp of an encapsulated substrate; and a failure in mounting onto a wiring board, the failure being based on a warp of the package is also provided.

DISCLOSURE OF THE INVENTION

The present invention relates to the following:
1. An encapsulating epoxy resin molding material, comprising (A) an epoxy resin, (B) a curing agent, and (C) an inorganic filler,
   wherein the inorganic filler (C) has an average particle size of 12 μm or less and a specific surface area of 3.0 m²/g or more.
2. An encapsulating epoxy resin molding material, comprising (A) an epoxy resin, (B) a curing agent, and (C) an inorganic filler,
   wherein the inorganic filler (C) comprises 5% or more by weight of an inorganic filler having a maximum particle size of 63 μm or less and particle sizes of 20 μm or more.
3. An encapsulating epoxy resin molding material, comprising (A) an epoxy resin, (B) a curing agent, and (C) an inorganic filler,
   the inorganic filler (C) having an average particle size of 15 μm or less and a specific surface area of 3.0 to 6.0 m²/g, and the molding material being used in a semiconductor device having one or more of the following structures (a1) to (d1):
   (a1) a structure wherein a bump height of a flip chip is 150 μm or less,
   (b1) a structure wherein a bump pitch of the flip chip is 500 μm or less,
   (c1) a structure wherein an area of a semiconductor chip is 25 mm² or more, and
   (d1) a structure wherein a thickness of a package, in which the semiconductor chip is disposed on a mounting substrate, is 2 mm or less.
4. An encapsulating epoxy resin molding material, comprising (A) an epoxy resin, (B) a curing agent and (C) an inorganic filler, and further comprising (D) a coupling agent,
   wherein the specific surface area of the inorganic filler (C) is from 3.0 to 6.0 m²/g.
5. An encapsulating epoxy resin molding material, comprising (A) an epoxy resin, (B) a curing agent, and (C) an inorganic filler,
   the encapsulating epoxy resin molding material satisfying at least one of the following conditions: the glass transition temperature based on TMA method is 150° C. or higher; the bending modulus based on JIS-K 6911 is 19 GPa or less; and the mold shrinkage ratio based on JIS-K 6911 is 0.2% or less.

BRIEF DESCRIPTION OF THE DRAWINGS

FIG. 4 illustrate (x) a sectional view and (y) a top view after over-molding package-encapsulation (MAP molding) of a semiconductor device (flip chip BGA).

EXPLANATION OF REFERENCE NUMERALS

Figure 1:
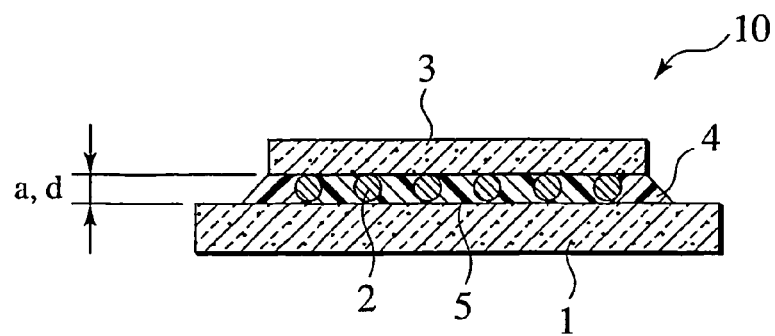
FIG. 1 illustrates a sectional view of a flip chip type BGA (of an under fill type) encapsulated by an encapsulating epoxy resin molding material (encapsulating material).

1: wiring board
2: solder bump
3: semiconductor chip
4: encapsulating material

5: under fill portion
a: bump height
b: bump pitch
c: the area of a semiconductor chip
d: the total thickness of an encapsulating material
11: wiring board
12: solder bump
13: semiconductor chip
14: encapsulating material

PREFERRED EMBODIMENTS FOR CARRYING OUT THE INVENTION

In order to solve the above-mentioned problems, the inventors have repeated eager investigations so as to find out that the above-mentioned objects can be attained by a specific encapsulating epoxy resin molding material for semiconductors which comprises a specific inorganic filler as an essential component, and a semiconductor device encapsulated by this filler. As a result, the present invention has been made.

(Epoxy Resin)

The epoxy resin (A) used in the present invention is a resin which is ordinarily used in encapsulating epoxy resin molding material, and is not particularly limited. Examples thereof include an epoxidized product of a Novolak resin, which is obtained by condensing or co-condensing a phenol compound such as phenol, cresol, xylenol, resorcin, catechol, bisphenol A or bisphenol F and/or a naphthol compound such as α-naphthol, β-naphthol or dihydroxynaphthalene, and a compound having an aldehyde group such as formaldehyde, acetoaldehyde, propionaldehyde, benzaldehyde or salicylaldehyde in the presence of an acidic catalyst, typical examples of the epoxidized product including a phenol Novolak epoxy resin, an o-cresol Novolak epoxy resin and an epoxy resin having a triphenylmethane skeleton, diglycidyl ethers of bisphenol A, bisphenol F, bisphenol S, alkyl-substituted or unsubstituted biphenol or the like, a stylbene epoxy resin, a hydroquinone epoxy resin, a glycidyl ester epoxy resin obtained by reaction of a polybasic acid such as phthalic acid or dimer acid with epichlorohydrin, a glycidylamine epoxy resin obtained by reaction of a polyamine such as diaminodiphenylmethane or isocyanuric acid with epichlorohydrin, an epoxidized product of a co-condensed resin of dicyclopentadiene and a phenol compound, an epoxy resin having a naphthalene ring, an epoxidized product of an aralkyl phenol resin such as a phenol/aralkyl resin or a naphthol/aralkyl resin, a trimethylolpropane epoxy resin, a terpene-modified epoxy resin, a linear aliphatic epoxy resin obtained by oxidizing olefin bonds with a peracid such as a peracetic acid, an alicyclic epoxy resin, and a sulfur-containing epoxy resin. These may be used alone or in combination of two or more thereof.

Among these, a biphenyl epoxy resin, a bisphenol F epoxy resin, a stylbene epoxy resin and a sulfur-containing epoxy resin are preferred from the viewpoint of filling ability and reflow resistance. From the viewpoint of curability, a Novolak epoxy resin is preferred, and from the viewpoint of low hygroscopicity, a dicyclopentadiene epoxy resin is preferred. From the viewpoint of heat resistance and low warping property, a naphthalene epoxy resin and a triphenylmethane epoxy resin are preferred. It is preferred that at least one of these epoxy resins is contained.

An example of the biphenyl epoxy resin is an epoxy resin represented by the following general formula (IV); an example of the bisphenol F epoxy resin is an epoxy resin represented by the following general formula (V); an example of the stylbene epoxy resin is an epoxy resin represented by the following general formula (VI); and an example of the sulfur-containing epoxy resin is an epoxy resin represented by the following general formula (VII):

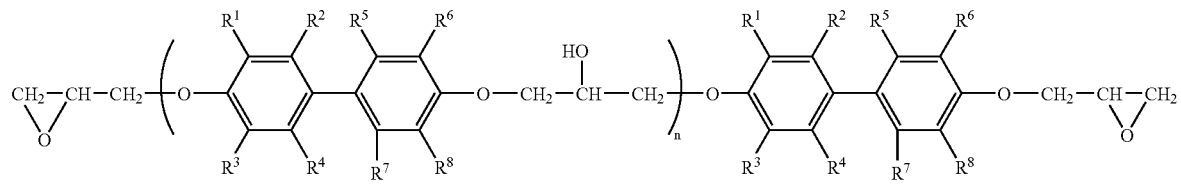

(IV)

wherein $R^1$ to $R^8$, which may be the same or different, are each selected from a hydrogen atom and substituted or unsubstituted monovalent hydrocarbon groups having 1 to 10 carbon atoms, and n represents an integer of 0 to 3,

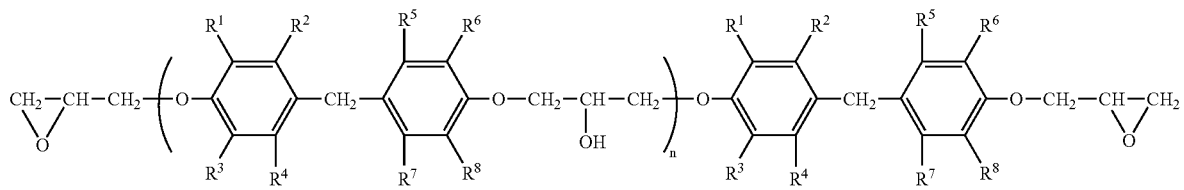

(V)

wherein $R^1$ to $R^8$, which may be the same or different, are each selected from alkyl groups having 1 to 10 carbon atoms, alkoxy groups having 1 to 10 carbon atoms, aryl groups having 6 to 10 carbon atoms, and aralkyl groups having 6 to 10 carbon atoms, and n represents an integer of 0 to 3,

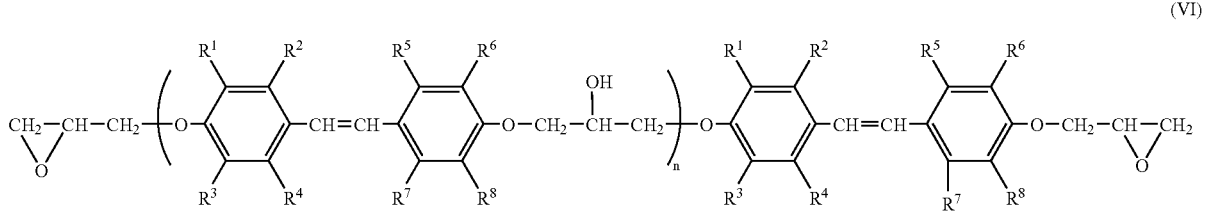

(VI)

wherein $R^1$ to $R^8$, which may be the same or different, are each selected from a hydrogen atom and substituted or unsubstituted monovalent hydrocarbon groups having 1 to 5 carbon atoms, and n represents an integer of 0 to 10,

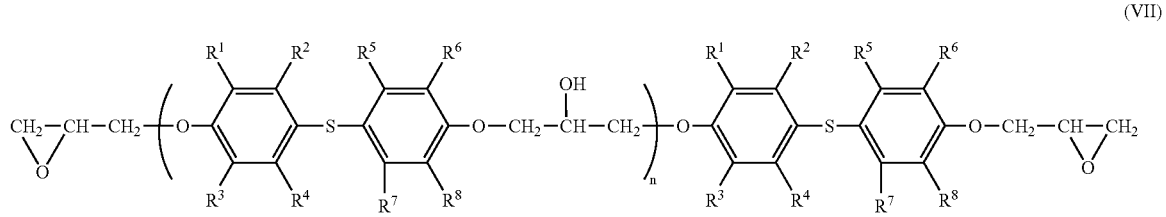

(VII)

wherein $R^1$ to $R^8$, which may be the same or different, are each selected from a hydrogen atom, substituted or unsubstituted alkyl groups having 1 to 10 carbon atoms, and substituted or unsubstituted alkoxy groups having 1 to 10 carbon atoms, and n represents an integer of 0 to 3.

Examples of the biphenyl epoxy resin represented by the general formula (IV) include an epoxy resin made mainly of 4,4'-bis(2,3-epoxypropoxy)biphenyl or 4,4'-bis(2,3-epoxypropoxy)-3,3',5,5'-tetramethylbiphenyl; and an epoxy resin obtained by causing epichlorohydrin to react with 4,4'-biphenyl or 4,4'-(3,3',5,5'-tetramethyl)biphenyl. Among these, preferred is an epoxy resin made mainly of 4,4'-bis(2,3-epoxypropoxy)-3,3',5,5'-tetramethylbipheny.

An example of the bisphenol F epoxy resin represented by the general formula (V) is YSLV-80XY (trade name, manufactured by Nippon Steel Chemical Co., Ltd.), which is made mainly of a component wherein $R^1$, $R^3$, $R^6$ and $R^8$ are each a methyl group and $R^2$, $R^4$, $R^5$ and $R^7$ are each a hydrogen atom, and n is 0, and which is commercially available.

The stylbene epoxy resin represented by the general formula (VI) can be obtained by causing a stylbene phenol compound and epichlorohydrin, which are starting materials, to react with each other in the presence of a basic material. Examples of this stylbene phenol compound, which is one of the starting materials, include 3-t-butyl-4,4'-dihyroxy-3',5,5'-trimethylstylbene, 3-t-butyl-4,4'-dihyroxy-3',5',6-trimethylstylbene, 4,4'-dihyroxy-3,3',5,5'-tetramethylstylbene, 4,4'-dihyroxy-3,3'-di-t-butyl-5,5'-dimethylstylbene, and 4,4'-dihyroxy-3,3'-di-t-butyl-6,6'-dimethylstylbene. Among these, preferred are 3-t-butyl-4,4'-dihyroxy-3',5,5'-trimethylstylbene, and 4,4'-dihyroxy-3,3',5,5'-tetramethylstylbene. These stylbene phenol compounds may be used alone or in combination of two or more thereof.

Of the sulfur-containing epoxy resins represented by the general formula (VII), preferred is an epoxy resin wherein $R^2$, $R^3$, $R^6$ and $R^7$ are each a hydrogen atom and $R^1$, $R^4$, $R^5$ and $R^8$ are each an alkyl group. More preferred is an epoxy resin wherein $R^2$, $R^3$, $R^6$ and $R^7$ are each a hydrogen atom, $R^1$ and $R^8$ are each a t-butyl group, and $R^4$ and $R^5$ are each a methyl group. Such a compound is YSLV-120TE (manufactured by Nippon Steel Chemical Co., Ltd.) or the like as a commercially available product.

These epoxy resins may be used alone or in combination of two or more thereof. The total blended amount thereof is set preferably to 20% or more by weight, more preferably to 30% or more by weight, even more preferably to 50% or more by weight of the total of the epoxy resin(s) in order to exhibit performances thereof.

Examples of the Novolak epoxy resin include an epoxy resin represented by the following general formula (VIII):

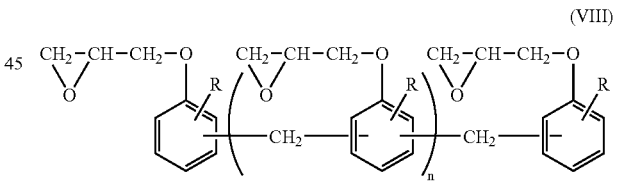

(VIII)

wherein R is selected from a hydrogen atom and substituted or unsubstituted monovalent hydrocarbon groups having 1 to 10 carbon atoms, and n represents an integer of 0 to 10.

The Novolak epoxy resin represented by the general formula (VIII) can easily be obtained by causing a Novolak phenol resin to react with epichlorohydrin. R in the general formula (VIII) is preferably an alkyl group having 1 to 10 carbon atoms, such as a methyl, ethyl, propyl, butyl, isopropyl, or isobutyl group, and an alkoxy group having 1 to 10 carbon atoms, such as a methoxy, ethoxy, propoxy or butoxy group. A hydrogen atom or a methyl group is more preferred. n is preferably an integer of 0 to 3. Of the Novolak resins represented by the general formula (VIII), an o-cresol Novolak epoxy resin is preferred.

In the case of using the Novolak epoxy resin, the blended amount thereof is set preferably to 20% or more by weight, more preferably to 30% or more by weight of the total of the epoxy resin(s) in order to exhibit performances thereof.

Examples of the dicyclopentadiene epoxy resin include an epoxy resin represented by the following general formula (IX)

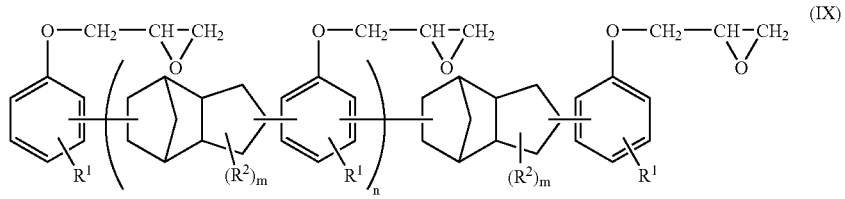

wherein $R^1$ and $R^2$ are each independently selected from a hydrogen atom and substituted or unsubstituted monovalent hydrocarbon groups having 1 to 10 carbon atoms, n represents an integer of 0 to 10 and m represents an integer of 0 to 6.

Examples of $R^1$ in the formula (IX) include a hydrogen atom, and substituted or unsubstituted monovalent hydrocarbon groups having 1 to 5 carbon atoms, such as alkyl groups such as methyl, ethyl, propyl, butyl, isopropyl and t-butyl groups, alkenyl groups such as vinyl, allyl and butenyl groups, halogenated alkyl groups, amino group substituted alkyl groups, and mercapto group substituted alkyl groups. Among these, alkyl groups such as methyl and ethyl groups, and a hydrogen atom are preferred. A methyl group and a hydrogen atom are more preferred. Examples of $R^2$ include a hydrogen atom, and substituted or unsubstituted monovalent hydrocarbon groups having 1 to 5 carbon atoms, such as alkyl groups such as methyl, ethyl, propyl, butyl, isopropyl and t-butyl groups, alkenyl groups such as vinyl, allyl and butenyl groups, halogenated alkyl groups, amino group substituted alkyl groups, and mercapto group substituted alkyl groups. Among these, a hydrogen atom is preferred.

In the case of using the dicyclopentadiene epoxy resin, the blended amount thereof is set preferably to 20% or more by weight, more preferably to 30% or more by weight of the total of the epoxy resin(s) in order to exhibit performances thereof.

Examples of the naphthalene epoxy resin include an epoxy resin represented by the following general formula (X), and examples of the triphenylmethane epoxy resin include an epoxy resin represented by the following general formula (XI):

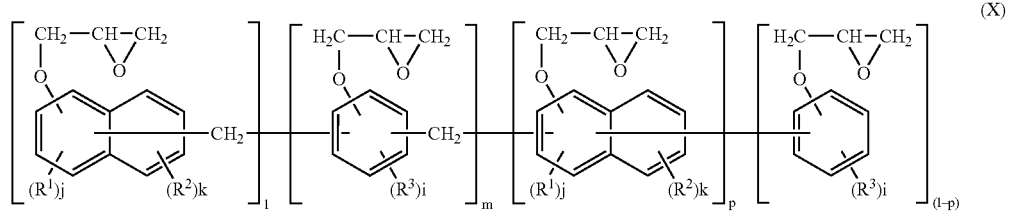

wherein $R^1$ to $R^3$, which may be the same or different, are each selected from a hydrogen atom and substituted or unsubstituted monovalent hydrocarbon groups having 1 to 12 carbon atoms, p is 1 or 0, 1 and m are each an integer of 0 to 11 and are each selected to set (1+m) to an integer of 1 to 11 and set (1+p) to an integer of 1 to 12, and i, j and k represent an integer of 0 to 3, an integer of 0 to 2, and an integer of 0 to 4, respectively.

Examples of the naphthalene epoxy resin represented by the general formula (X) include a random copolymer comprising one structural unit and structural units the number of which is m at random, an alternating copolymer comprising the same alternately, a copolymer comprising the same regularly, and a block copolymer comprising the same in a block form. These may be used alone or in combination of two or more thereof.

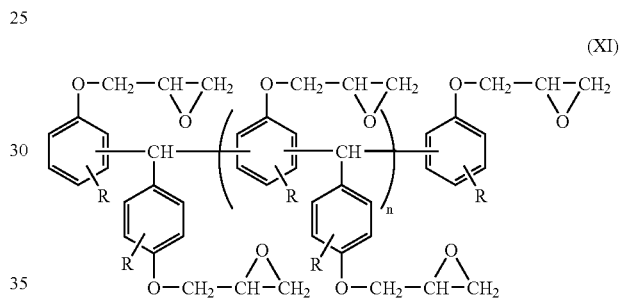

wherein R is selected from a hydrogen atom and substituted or unsubstituted monovalent hydrocarbon groups having 1 to 10 carbon atoms, and n is an integer of 1 to 10.

These two epoxy resins may be used alone or in combination of the two. The total blended amount thereof is set preferably to 20% or more by weight, more preferably to 30% or more, even more preferably to 50% or more by weight of the total of the epoxy resin(s) in order to exhibit performances thereof.

The above-mentioned biphenyl epoxy resin, stylbene epoxy resin, sulfur-containing epoxy resin, Novolak epoxy resin, dicyclopentadiene epoxy resin, naphthalene epoxy resin and triphenylmethane epoxy resin may be used alone or in combination of two or more thereof. The total blended amount thereof is set preferably to 50% or more by weight, more preferably to 60% or more, even more preferably to 80% or more by weight of the total of the epoxy resin(s).

The melting viscosity of the epoxy resin (A) used in the present invention is preferably 2 poises or less, preferably 1 poise or less, even more preferably 0.5 poise or less at 150° C. from the viewpoint of filling ability. The melting viscosity indicates viscosity measured with an ICI cone plate viscometer.

(Curing Agent)

The curing agent (B) used in the present invention is an agent which is ordinarily used in encapsulating epoxy resin molding material, and is not particularly limited. Examples thereof include a Novolak phenol resin, which is obtained by condensing or co-condensing a phenol compound such as phenol, cresol, resorcin, catechol, bisphenol A, bisphenol F, phenylphenol or aminophenol and/or a naphthol compound such as α-naphthol, β-naphthol or dihydroxynaphthalene, and a compound having an aldehyde group such as formaldehyde, benzaldehyde or salicylaldehyde in the presence of an acidic catalyst, an aralkyl phenol resin, such as a phenol/aralkyl resin or naphthol/aralkyl resin, which is synthesized from a phenol compound and/or a naphthol compound and dimethoxy-p-xylene or bis(methoxymethyl)biphenyl, a cylopentadiene phenol Novolak resin which is synthesized by copolymerizing a phenol compound and/or naphthol compound and cyclopentadiene, a cyclopentadiene phenol resin such as naphthol Novolak resin, and a terpene-modified resin. These may be used alone or in combination of two or more thereof.

Among these, a biphenyl phenol resin is preferred from the viewpoint of flame resistance. From the viewpoint of reflow resistance and curing property, an aralkyl phenol resin is preferred. From the viewpoint of giving a low hygroscopicity, a dicyclopentadiene phenol resin is preferred. From the viewpoint of heat resistance, a lowness in the expansion coefficient and a lowness in the warping property, a triphenylmethane phenol resin is preferred, and from the viewpoint of curability, a Novolak phenol resin is preferred. It is preferred that at least one of these phenol resins is contained.

Examples of the biphenyl phenol resin include a phenol resin represented by the following general formula (XII):

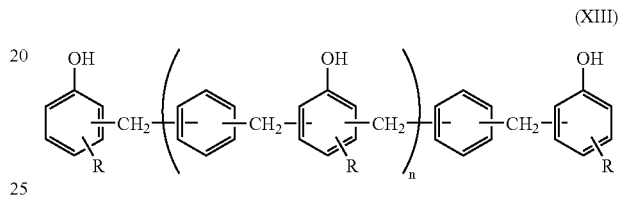

wherein $R^1$ and $R^9$, which may be the same or different, are each selected from a hydrogen atom, alkyl groups having 1 to 10 carbon atoms, such as methyl, ethyl, propyl, butyl, isopropyl and isobutyl, alkoxy groups having 1 to 10 carbon atoms, such as methoxy, ethoxy, propoxy and butoxy groups, aryl groups having 6 to 10 carbon atoms, such as phenyl, tolyl and xylyl groups, and aralkyl groups having 6 to 10 carbon atoms, such as benzyl and phenethyl groups. Among these, a hydrogen atom and a methyl group are preferred. n represents an integer of 0 to 10.

Examples of the biphenyl phenol resin represented by the general formula (XII) include compounds wherein $R^1$ and $R^9$ are each a hydrogen atom. Among these, a condensation product mixture containing 50% or more by weight of a condensation product wherein n is 1 or more is preferred from the viewpoint of melting viscosity. One of the compounds is MEH-7851 (trade name, manufactured by Meiwa Plastic Industries, Ltd.), which is commercially available.

In the case of using the biphenyl phenol resin, the blended amount thereof is set preferably to 30% or more by weight, more preferably to 50% or more by weight, even more preferably to 60% or more by weight of the total of the curing agent(s) in order to exhibit performances thereof.

Examples of the aralkyl phenol resin include a phenol/aralkyl resin and a naphthol/aralkyl resin. Preferred is a phenol/aralkyl resin represented by the following general formula (XIII):

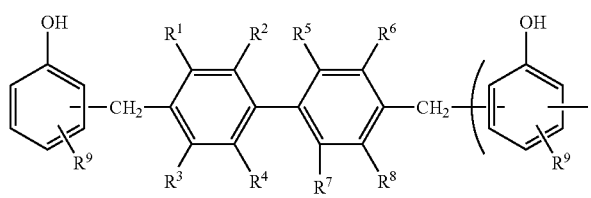

wherein R is selected from a hydrogen and substituted or unsubstituted monovalent hydrocarbon groups having 1 to 10 carbon atoms, and n represents an integer of 0 to 10. More preferred is a phenol/aralkyl resin wherein R in the general formula (XIII) is a hydrogen atom and the average of n's is from 0 to 8. Specific examples thereof include a p-xylene phenol/aralkyl resin and a m-xylene phenol/aralkyl resin. In the case of using these aralkyl phenol resins, the blended amount thereof is set preferably to 30% or more by weight, more preferably to 50% or more by weight of the total of the curing agent(s) in order to exhibit performances thereof.

Examples of the dicyclopentadiene phenol resin include a phenol resin represented by the following general formula (XIV):

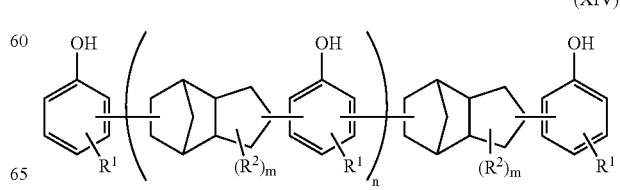

wherein $R^1$ and $R^2$ are each independently selected from a hydrogen atom and substituted or unsubstituted monovalent hydrocarbon groups having 1 to 10 carbon atoms, n represents an integer of 0 to 10, and m represents an integer of 0 to 6.

In the case of using the dicyclopentadiene phenol resin, the blended amount thereof is set preferably to 30% or more by weight, more preferably to 50% or more by weight of the total of the curing agent(s) in order to exhibit performances thereof.

Examples of the triphenylmethane phenol resin include a phenol resin represented by the following general formula (XV):

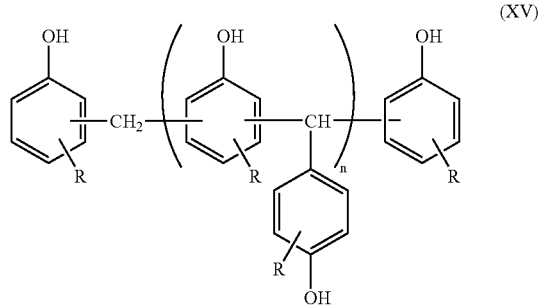

wherein R is selected from a hydrogen and substituted or unsubstituted monovalent hydrocarbon groups having 1 to 10 carbon atoms, and n represents an integer of 1 to 10.

In the case of using the triphenylmethane phenol resin, the blended amount thereof is set preferably to 30% or more by weight, more preferably to 50% or more by weight of the total of the curing agent(s) in order to exhibit performances thereof.

Examples of the Novolak phenol resin include phenol Novolak resin, cresol Novolak resin, and naphthol Novolak resin. Among these, phenol Novolak resin is preferred. In the case of using the Novolak phenol resin, the blended amount thereof is set preferably to 30% or more by weight, more preferably to 50% or more by weight of the total of the curing agent(s) in order to exhibit performances thereof.

The above-mentioned biphenyl phenol resin, aralkyl phenol resin, dicyclopentadiene phenol resin, triphenylmethane phenol resin and Novolak phenol resin may be used alone or in combination of two or more thereof. The blended amount thereof is set preferably to 60% or more by weight, more preferably to 80% or more by weight of the total of the curing agent(s).

The melting viscosity of the curing agent (B) used in the present invention is preferably 2 poises or less, more preferably 1 poise or less at 150° C. from the viewpoint of filling ability. The melting viscosity indicates ICI viscosity.

The equivalent ratio between the epoxy resin (A) and the curing agent (B), that is, the ratio of the number of hydroxyl groups in the curing agent to the number of epoxy groups in the epoxy resin (the number of hydroxyl groups in the curing agent/the number of epoxy groups in the epoxy resin) is not particularly limited, and is set preferably into the range of 0.5 to 2, more preferably into the range of 0.6 to 1.3 in order to control unreacted contents of each of them into a low value. The ratio is set even more preferably into the range of 0.8 to 1.2 in order to obtain an encapsulating epoxy resin molding material excellent in moldability and reflow resistance.

(Inorganic Filler)

The inorganic filler (C) used in the present invention is a material incorporated into the encapsulating epoxy resin molding material in order to decrease the hygroscopicity and the linear expansion coefficient thereof and improve the thermal conductivity and the strength thereof. Examples thereof include powder of fused silica, crystal silica, alumina, zircon, calcium silicate, calcium carbonate, potassium titanate, silicon carbide, silicon nitride, aluminum nitride, boron nitride, beryllia, zirconia, zircon, forsterite, steatite, spinel, mullite or titania, beads obtained by making the powder into a sphere, and glass fiber. Examples of the inorganic filler having a flame resistant effect include aluminum hydroxide, magnesium hydroxide, zinc borate, and zinc molybdate.

These inorganic fillers may be used alone or in combination of two or more thereof. Among these, fused silica is preferred from the viewpoint of a decrease in the filling ability and the linear expansion coefficient, and alumina is preferred from the viewpoint of high thermal conductivity. The shape of the inorganic filler is preferably spherical from the viewpoint of filling ability and mold abrasion property.

It is preferred that the inorganic filler (C) used in the invention has an average particle size of 15 μm or less and a specific surface area of 3.0 to 6.0 $m^2/g$ in order for the encapsulating epoxy resin molding material to satisfy filling ability for under filling for a flip chip package having bumps arrange data fine pitch. The average particle size is preferably 10 μm or less, more preferably 8 μm or less. If the particle size is over 15 μm, the epoxy resin molding material is not easily injected into the gap between a chip and a wiring board jointed to each other through bumps so that the filling ability lowers. The specific surface area is more preferably from 3.5 to 5.5 $m^2/g$, more preferably from 4.0 to 5.0 $m^2/g$. If the specific surface area is less than 3.0 $m^2/g$ and more than 6.0 $m^2/g$, voids are easily generated in the gap between a chip and a wiring board jointed to each other through bumps so that the filling ability lowers.

From the viewpoint of filling ability, coarse particles of the inorganic filler (C) may be cut with a sieve. At this time, preferably, the amount of the component (C) having a size of 53 μm or more is 0.5% or less by weight. More preferably, the amount of the component (C) having a size of 30 μm or more is 0.5% or less by weight. Even more preferably, the amount of the component (C) having a size of 20 μm or more is 0.5% or less by weight.

The blended amount of the inorganic filler (C) is preferably from 60 to 95% by weight of the encapsulating epoxy resin molding material from the viewpoint of filling ability and reliability. The amount is more preferably from 70 to 90% by weight, even more preferably from 75 to 85% by weight. If the amount is less than 60% by weight, the reflow resistance tends to lower. If the amount is more than 95% by weight, the filling ability tends to lower.

(Coupling Agent)

It is preferred to incorporate a coupling agent into the encapsulating epoxy resin molding material of the invention in order to make the adhesive property between the resin component and the filler. If necessary, a coupling can be used together as the coupling agent as long as the advantageous effects of the invention can be attained. The coupling agent may be a material that is ordinarily used in encapsulating epoxy resin molding material, and is not particularly limited. Examples thereof include silane compounds having a primary, secondary or tertiary amino group, various silane compounds such as epoxysilane, mercaptosilane, alkylsilane, phenylsilane, ureidosilane and vinylsilane, titanium based compounds, aluminum chelates, and aluminum/zirconium based compounds. These may be used alone or in combination of two or more thereof.

The total blended amount of the coupling agent(s) is preferably from 0.037 to 4.75% by weight, more preferably from 0.088 to 2.3% by weight of the encapsulating epoxy resin molding material. If the amount is less than 0.037% by weight, the adhesive property to a wiring board tends to lower. If the amount is more than 4.75% by weight, the amount of volatile components becomes large so that molding defects about filling ability, such as voids, tend to be easily generated. Moreover, the moldability for packaging tends to lower.

(Silane Coupling Agent Having a Secondary Amino Group)

As the coupling agent, preferred is (D2) a silane coupling agent having a secondary amino group. If necessary, a different coupling agent may be used together as long as the advantageous effects of the invention can be attained.

The silane coupling agent (D2),which has a secondary amino group, used in the invention is not particularly limited if the agent is a silane compound having in the molecule thereof a secondary amino group. Examples thereof include γ-anilinopropyltrimethoxysilane, γ-anilinopropyltriethoxysilane, γ-anilinopropylmethyldimethoxysilane, γ-anilinopropylmethyldiethoxysilane, γ-anilinopropylethyldiethoxysilane, γ-anilinopropylethyldimethoxysilane, γ-anilinomethyltrimethoxysilane, γ-anilinomethyltriethoxysilane, γ-anilinomethyldimethoxysilane, γ-anilinomethylmethyldiethoxysilane, γ-anilinomethylethyldiethoxysilane, γ-anilinomethylethyldimethoxysilane, N-(p-methoxyphenyl)-γ-aminopropyltrimethoxysilane, N-(p-methoxyphenyl)-γ-aminopropyltriethoxysilane, N-(p-methoxyphenyl)-γ-aminopropylmethyldimethoxysilane, N-(p-methoxyphenyl)-γ-aminopropylmethyldiethoxysilane, N-(p-methoxyphenyl)-γ-aminopropylethyldiethoxysilane, N-(p-methoxyphenyl)-γ-aminopropylethyldimethoxysilane, γ-(N-methyl)aminopropyltrimethoxysilane, γ-(N-ethyl)aminopropyltrimethoxysilane, γ-(N-butyl)aminopropyltrimethoxysilane, γ-(N-benzyl)aminopropyltrimethoxysilane, γ-(N-methyl)aminopropyltriethoxysilane, γ-(N-ethyl)aminopropyltriethoxysilane, γ-(N-butyl)aminopropyltriethoxysilane, γ-(N-benzyl)aminopropyltriethoxysilane, γ-(N-methyl)aminopropylmethyldimethoxysilane, γ-(N-ethyl)aminopropylmethyldimethoxysilane, γ-(N-butyl)aminopropylmethyldimethoxysilane, γ-(N-benzyl)aminopropylmethyldimethoxysilane, N-β-(aminoethyl)-γ-aminopropyltrimethoxysilane, γ-(β-aminoethyl)aminopropyltrimethoxysilane, and N-β-(N-vinylbenzylaminoethyl)-γ-aminopropyltrimethoxysilane From the viewpoint of filling ability, an aminosilane coupling agent represented by the following general formula (I) is preferred:

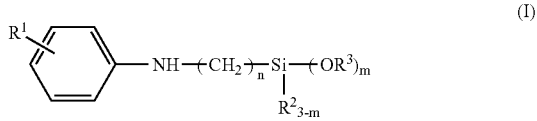

(I)

wherein $R^1$ is selected from an hydrogen atom and alkyl groups having 1 to 6 carbon atoms, and alkoxy groups having 1 to 2 carbon atoms, $R^2$ is selected from alkyl groups having 1 to 6 carbon atoms and a phenyl group, $R^3$ represents a methyl or ethyl group, n represents an integer of 1 to 6, and m represents an integer of 1 to 3.

Examples of the aminosilane coupling agent represented by the general formula (I) include γ-anilinopropyltrimethoxysilane, γ-anilinopropyltriethoxysilane, γ-anilinopropylmethyldimethoxysilane, γ-anilinopropylmethyldiethoxysilane, γ-anilinopropylethyldimethoxysilane, γ-anilinopropylethyldimethoxysilane, γ-anilinomethyltrimethoxysilane, γ-anilinomethyltriethoxysilane, γ-anilinomethylmethyldimethoxysilane, γ-anilinomethylmethyldiethoxysilane, γ-anilinomethylethyldiethoxysilane, γ-anilinomethylethyldimethoxysilane, N-(p-methoxyphenyl)-γ-aminopropyltrimethoxysilane, N-(p-methoxyphenyl)-γ-aminopropyltriethoxysilane, N-(p-methoxyphenyl)-γ-aminopropylmethyldimethoxysilane, N-(p-methoxyphenyl)-γ-aminopropylmethyldiethoxysilane, N-(p-methoxyphenyl)-γ-aminopropylethyldiethoxysilane, and N-(p-methoxyphenyl)-γ-aminopropylethyldimethoxysilane. Particularly, γ-anilinopropyltrimethoxysilane is preferable.

The blended amount of the silane coupling agent (D2), which has a secondary amino group, is preferably from 0.037 to 4.75% by weight, more preferably from 0.088 to 2.3% by weight of the encapsulating epoxy resin molding material. If the amount is less than 0.037% by weight, the fluidity thereof lowers so that molding defects about filling ability, such as voids, tend to be easily generated or the adhesive property to a wiring board tends to lower. If the amount is more than 4.75% by weight, the amount of volatile components becomes large so that molding defects about filling ability, such as voids, tend to be easily generated and further the moldability for packaging tends to lower.

The different coupling agent that can be used together with the silane coupling agent (D2), which has a secondary amino group, is a material which is ordinarily used in encapsulating epoxy resin molding material, and is not particularly limited. Examples thereof include silane compounds having a primary amino group and/or a tertiary amino group, various silane compounds such as epoxysilane, mercaptosilane, alkylsilane, phenylsilane, ureidosilane and vinylsilane, titanium based compounds, aluminum chelates, and aluminum/zirconium based compounds. Examples thereof include silane coupling agents such as vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysialne, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-(N,N-dimethyl)aminopropyltrimethoxysilane, γ-(N,N-diethyl)aminopropyltrimethoxysilane, γ-(N,N-dibutyl)aminopropyltrimethoxysilane, γ-(N-methyl)anilinopropyltrimethoxysilane, γ-(N-ethyl)anilinopropyltrimethoxysilane, γ-(N,N-dimethyl)aminopropyltriethoxysilane, γ-(N,N-diethyl)aminopropyltriethoxysilane, γ-(N,N-dibutyl)aminopropyltriethoxysilane, γ-(N-methyl)anilinopropyltriethoxysilane, γ-(N-ethyl)anilinopropyltriethoxysilane, γ-(N,N-dimethyl)anilinopropyltriethoxysilane, γ-(N,N-diethyl)aminopropylmethyldimethoxysilane, γ-(N,N-dibutyl)aminopropylmethyldimethoxysilane, γ-(N-methyl)anilinopropylmethyldimethoxysilane, γ-(N-ethyl)anilinopropylmethyldimethoxysilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, γ-chloropropyltrimethoxysilane, hexamethyldisilane, and vinyltrimethoxysialne, γ-mercaptopropylmethyldimethoxysilane; titanate coupling agents such as isopropyltriisostearoyl titanate, isopropyltris(dioctylpyrophosphate)titanate, isopropyltri(N-aminoethyl-aminoethyl)titanate, tetraoctylbis(ditridecylphosphate)titanate, tetra(2,2-diallyloxymethyl-1-butyl)bis(ditridecyl)phosphate titanate, bis(dioctylpyrophosphate)oxyacetate titanate, bis(dioctylpyrophosphate)ethylene titanate, isopropyltrioctanoyl titanate, isopropyldimethacrylisostearoyl titanate, isopropyltridecylbenzenesulfonyl titanate, isopropylisostearoyldiacryl titanate, isopropyltri(dioctylphosphate)titanate, isopropyltricumylphenyl titanate and tetraisopropylbis(dioctylphosphate)titanate. These may be used alone or in combination of two or more thereof.

In the case of using the different coupling agent(s), the blended amount of the silane coupling agent (D2), which has a secondary amino group, is set preferably to 30% ormore by weight, more preferably to 50% or more by weight of the total of the coupling agents in order to exhibit performance thereof.

The total blended amount of the coupling agent(s) comprising the silane coupling agent (D2), which has a secondary amino group, is preferably from 0.037 to 4.75% by weight, more preferably from 0.088 to 2.3% by weight of the encapsulating epoxy resin molding material. If the amount is less than 0.037% by weight, the adhesive property to a wiring board tends to lower. If the amount is more than 4.75% by weight, the amount of volatile components becomes large so that molding defects about filling ability, such as voids, tend to be easily generated and further the moldability for packaging tends to lower. The blended amount of the abovementioned coupling agent(s) is preferably from 0.05 to 5% by weight, more preferably form 0.1 to 2.5% by weight of the inorganic filler (C). Reasons why the blended amount is specified are the same as described above.

(Coupling Agent Coverage Ratio)

In the case of using the coupling agent in the invention, the coverage ratio of the coupling agent for the inorganic filler is set preferably into the range of 0.3 to 1.0, more preferably into the range of 0.4 to 0.9, even more preferably into the range of 0.5 to 0.8. If the coverage ratio of the coupling agent is larger than 1.0, air bubbles based on volatile components generated when the material is molded increase so that voids tend to be easily generated in the resultant thin portion. If the coverage ratio of the coupling agent is smaller than 0.3, the adhesive property between the resin and the filler lowers so that the strength of the resultant molded product tends to lower.

The coupling agent coverage ratio X of the epoxy resin molding material is defined as shown in the following equation (xxx):

$$X(\%) = S_c/S_f \qquad \text{(xxx)}$$

$S_c$ and $S_f$ represent the total minimum covering area of the entire coupling agent in the epoxy resin molding material, and the total surface area of the entire filler therein, respectively, and are defined by the following equations (yyy) and (zzz), respectively:

$$S_c = A_1 \times W_1 + A_2 \times W_2 + \ldots + A_n \times M_n \text{ wherein n is the number of the used coupling agents,} \qquad \text{(yyy), and}$$

$$S_f = B_1 \times W_1 + B_2 \times W_2 + \ldots + B_1 \times W_1 \text{ wherein 1 is the number of the used fillers.} \qquad \text{(zzz)}$$

A and M represent the minimum covering area and the used amount of each coupling agent, respectively, and B and W represent the specific surface area and the used amount of each filler.

(Method for Controlling the Coupling Agent Coverage Ratio)

When the minimum covering area of each coupling agent used in the epoxy resin molding material and the specific surface area of each filler used therein are already known, the used amounts of the coupling agents and the fillers which give a target coupling agent coverage ratio can be calculated from the equations (xxx), (yyy) and (zzz).

(Phosphorus Compound)

It is preferred to incorporate (E) a phosphorus compound into the present invention from the viewpoint of filling ability and flame resistance. The phosphorus compound (E) used in the invention is not particularly limited, and examples thereof include phosphorus- and nitrogen-containing compounds such as covered or non-covered red phosphorus and cyclophosphazene, phosphonates such as tricalcium nitrilotrismethylenephosphonate, and dicalcium methane-1-hydroxy-1,1-diphosphonate, phosphine compounds such as triphenylphosphine oxide, 2-(diphenylphosphinyl)hydroquinone, 2,2-[(2-(diphenylphosphinyl)-1,4-phenylene]bis(oxymethylene)]bis-oxirane, and tri-n-octylphosphine oxide, ester compounds having a phosphorus atom, and phosphorus- and nitrogen-containing compounds such as cyclophosphazene. These may be used alone or in combination of two or more thereof. Among these, phosphates and phosphine oxide are preferred from the viewpoint of humidity resistant reliability.

Red phosphorus acts as a flame retardant, and is not particularly limited if the advantageous effects of the present invention can be obtained. Red phosphorus is preferably covered red phosphorus such as red phosphorus covered with a thermosetting resin or red phosphorus covered with inorganic and organic compounds.

The thermosetting resin used in red phosphorus covered with the thermosetting resin is not particularly limited, and example there of include epoxy resin, phenol resin, melamine resin, urethane resin, cyanate resin, urea-formalin resin, aniline-formalin resin, furan resin, polyamide resin, polyamideimide resin, and polyimide resin. These may be used alone or in combination of two or more thereof. It is allowable to use a monomer or oligomer of these resins to attain covering and polymerization simultaneously and cover red phosphorus with the thermosetting resin produced by the polymerization, or to set the thermosetting resin after red phosphorus is covered with the resin. Among these, epoxy resin, phenol resin and melamine resin are preferred from the viewpoint of compatibility thereof with the base resin incorporated into the encapsulating epoxy resin molding material.

The inorganic compound used in red phosphorus covered with the inorganic and organic compounds is not particularly limited, and examples thereof include aluminum hydroxide, magnesium hydroxide, calcium hydroxide, titanium hydroxide, zirconium hydroxide, hydrated zirconium oxide, bismuth hydroxide, barium carbonate, calcium carbonate, zinc oxide, titanium oxide, nickel oxide, and iron oxide. These may be used alone or in combination of two or more thereof. Among these, zirconium hydroxide, hydrated zirconium oxide, aluminum hydroxide and zinc oxide are preferred, which are excellent in phosphate ion supplementing effect.

The organic compound used in red phosphorus covered with the inorganic and organic compounds is not particularly limited, and examples thereof include low molecular weight compounds used for surface treatment, such as coupling agents and chelating agents, and relatively high molecular weight compounds such as thermoplastic resins and thermosetting resins. These may be used alone or in combination of two or more thereof. Among these, thermosetting resins are preferred from the viewpoint of covering effect thereof. Epoxy resin, phenol resin and melamine resin are more preferred from the viewpoint of compatibility thereof with the base material incorporated into the encapsulating epoxy resin molding material.

In the case of covering red phosphorus with the inorganic and organic compounds, the order of covering-treatments therewith is not particularly limited. Red phosphorus may be covered with the inorganic compound and then covered with the organic compound, or may be covered with the organic compound and then covered with the inorganic compound. Red phosphorus may be covered with a mixture of the two at a time. The form of the covering is not particularly limited, and may be a physical adsorption form, a chemical bond form, or some other form. After the covering, the inorganic compound and the organic compound may be separately present, or may be in the state that the two are partially or wholly bonded to each other.

The amounts of the inorganic compound and the organic compound are not particularly limited if the advantageous effects of the present invention can be obtained. The ratio by weight of the inorganic compound to the organic compound (the inorganic compound/the organic compound) is preferably from 1/99 to 99/1, more preferably from 10/90 to 95/5, even more preferably from 30/70 to 90/10. It is preferred to adjust the used amounts of the inorganic compound and the organic compound or monomers or oligomers which are starting materials thereof so as to give such a ratio by weight.

The method for producing covered red phosphorus such as red phosphorus covered with a thermosetting resin or red phosphorus covered with inorganic and organic compounds is not particularly limited. There may be used a known covering method described in, e.g., Japanese Patent Application Laid-Open No. 62-21704, or Japanese Patent Application Laid-Open No. 52-131695. The thickness of the covering film is not particularly limited if the advantageous effects of the present invention can be obtained. The covering may be even on the surface of red phosphorus, or uneven thereon.

The particle size of red phosphorus is not particularly limited if the advantageous effects of the invention can be obtained. The average particle size thereof (such a particle size that the cumulative weight ratio is set to 50% or more by weight in the particle size distribution) is preferably from 1 to 100 μm, more preferably from 5 to 50 μm. If the average particle size is less than 1 μm, the phosphate ion concentration in the resultant molded product becomes high so that the humidity resistance thereof tends to deteriorate. If the size is more than 100 μm, defects based on deformation, short circuits and cutting of wires, and others tend to be easily generated in the case that a highly-integrated, high-density semiconductor device having a narrow pad pitch is used.

The phosphorus- and nitrogen-containing compound acts as a flame retardant, and is not particularly limited if the advantageous effects of the present invention can be obtained. Examples thereof include cyclic phosphazene compounds containing in their main skeleton the following formula(e) (XXV) and/or (XXVI) as a recurring unit or recurring units, or compounds containing the following formula(e) (XXVII) and/or (XXVIII) as a recurring unit or recurring units, wherein positions of the substituents on phosphorus atoms in the phosphazene ring are different:

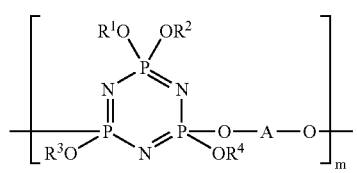
(XXV)

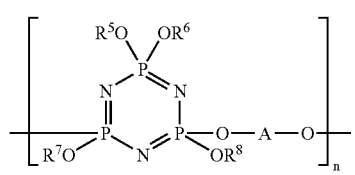
(XXVI)

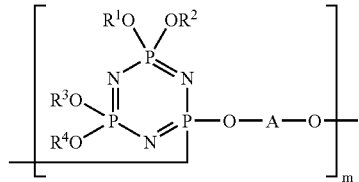
(XXVII)

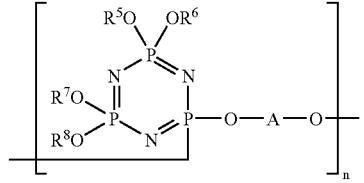
(XXVIII)

In the formula(e) (XXV) and/or (XXVII), m is an integer of 1 to 10, $R^1$ to $R^4$, which may be the same or different, are each selected from alkyl groups having 1 to 12 carbon atoms and aryl groups which may have a substituent, and A represents an alkylene group having 1 to 4 carbon atoms, or an arylene group. In the formula(e) (XXVII) and/or (XXVIII), n is an integer of 1 to 10, $R^5$ to $R^8$, which may be the same or different, are each selected from alkyl groups having 1 to 12 carbon atoms and aryl groups which may have a substituent, and A represents an alkylene group having 1 to 4 carbon atoms, or an arylene groups. m $R^1$'s, m$R^2$'s, m$R^3$'s or, m$R^4$'s in the formulae may be the same or different, and n $R^5$'s, n $R^6$'s, n $R^7$'s or $R^8$'s therein may be the same or different. In the formulae (XXV) to (XXVIII), the alkyl groups having 1 to 12 carbon atoms or the aryl groups which are represented by $R^1$ to $R^8$ and may have a substituent are not particularly limited. Examples thereof include alkyl groups such as methyl, ethyl, propyl, isopropyl, butyl, isobutyl, sec-butyl and tert-butyl groups, aryl groups such as phenyl, 1-naphthyl and 2-naphthyl groups, alkyl-substituted aryl groups such as o-tolyl, m-tolyl, p-tolyl, 2,3-xylyl, 2,4-xylyl, o-cumenyl, m-cumenyl, p-cumenyl and mesityl groups, and aryl-substituted alkyl groups such as benzyl and phenethyl groups. Examples of the substituent substituted thereon include alkyl, alkoxyl, aryl, hydroxyl, amino, epoxy, vinyl, hydroxyalkyl and alkylamino groups.

Among these, aryl groups are preferred and phenyl and hydroxyphenyl groups are more preferred from the viewpoint of the heat resistance and the humidity resistance of the epoxy resin molding material. In particular, at least one of $R^1$ to $R^4$ is preferably a hydroxyphenyl group. All of $R^1$ to $R^8$ may be hydroxyphenyl groups. One of $R^1$ to $R^4$ is more preferably a hydroxyphenyl group. When all of $R^1$ to $R^8$ are hydroxyphenyl groups, the epoxy resin cured product easily becomes brittle. When all of $R^1$ to $R^8$ are phenyl groups, the heat resistance of the epoxy resin cured product lowers easily since the compound is not taken in the crosslinked structure of the epoxy resin.

The alkylene group having 1 to 4 carbon atoms or arylene group which is represented by A in the formulae (XXV) to (XXVIII) is not particularly limited. Examples thereof include methylene, ethylene, propylene, isopropylene, butylene, isobutylene, phenylene, tolylene, xylylene, and naphthylene groups. From the viewpoint of the heat resistance and the humidity resistance of the epoxy resin molding material, an arylene group is preferred, and a phenylene group is more preferred.

The cyclic phosphazene compound is a polymer of any one of formulae (XXV) to (XXVIII), a copolymer of the formula (XXV) and the formula (XXVI), or a copolymer of the formula (XXVII) and the formula (XXVIII). In the case of the copolymer, the copolymer may be a random copolymer, a block copolymer or an alternating copolymer. The copolymerization mole ratio thereof, m/n, is not particularly limited, and is preferably from 1/0 to 1/4, more preferably from 1/0 to 1/1.5 from the viewpoint of an improvement in the heat resistance and the strength of the epoxy resin cured product. The polymerization degree thereof, m+n, is from 1 to 20, preferably from 2 to 8, even more preferably from 3 to 6.

Preferred examples of the cyclic phosphazene compound include a polymer of the following formula (XXIX) and a copolymer of the following formula (XXX):

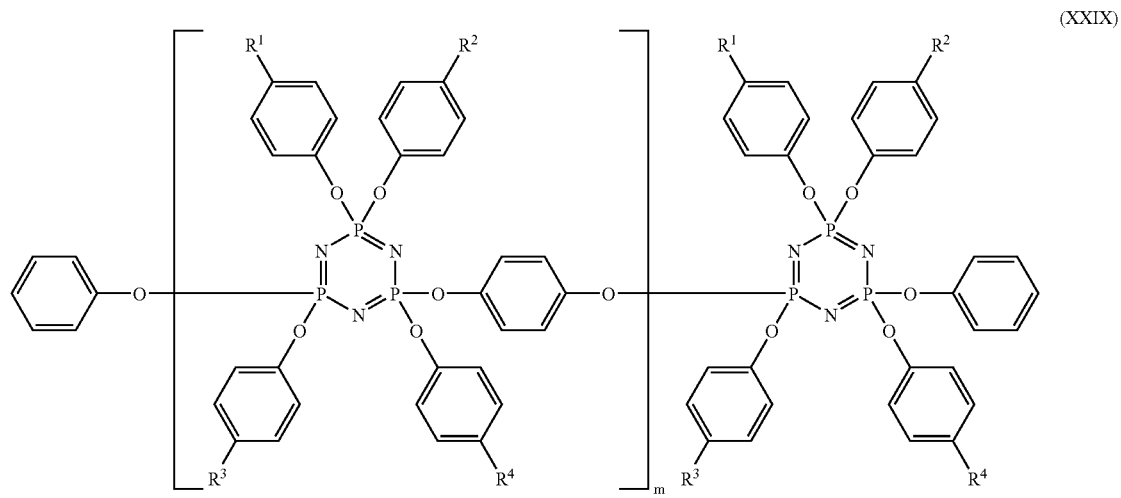

wherein m is an integer of 0 to 9, and $R^1$ to $R^4$ each independently represent a hydrogen atom or a hydroxyl groups.

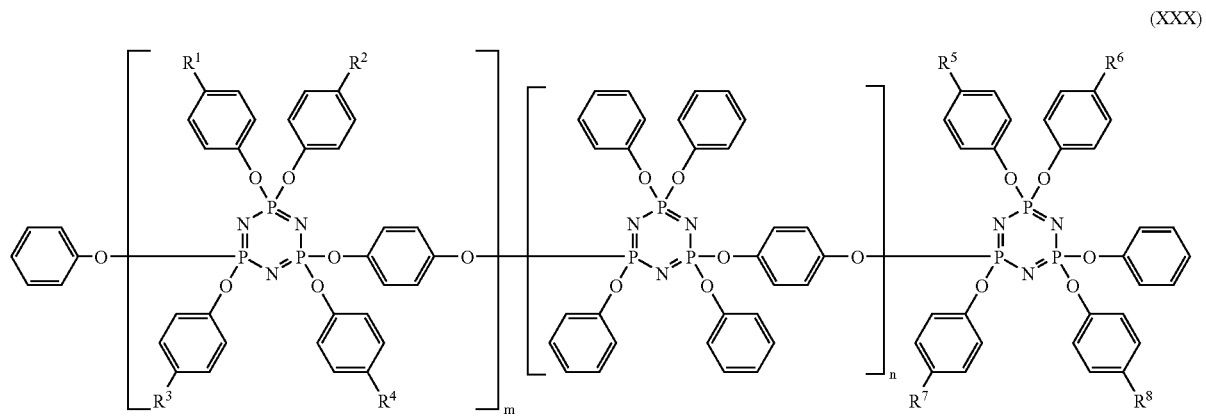

In the formula (XXX), m and n are each an integer of 0 to 9, $R^1$ to $R^4$ are each independently selected from hydrogen or a hydroxyl group, and $R^5$ to $R^8$ are each independently selected from hydrogen or a hydroxyl group. The cyclic phosphazene compound represented by the formula (XXX) may be a compound wherein recurring units (a), the number of which is m, and recurring units (b), the number of which is n, are alternately contained, are contained in a block form, or are contained at random. Preferred is the compound wherein these recurring units are contained at random.

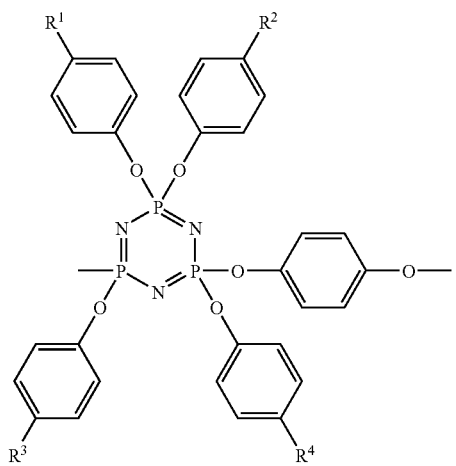

(a)

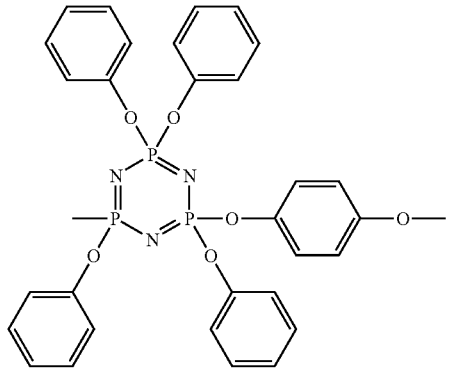

(b)

Particularly preferred is a compound made mainly of a polymer wherein one of $R^1$ to $R^4$ is a hydroxyl group and m is from 3 to 6 in the formula (XXIX) or a compound made mainly of a copolymer wherein one of $R^1$ to $R^4$ is a hydroxyl group, all of $R^5$ to $R^8$ are hydrogen or one of $R^5$ to $R^8$ is a hydroxyl group, m/n is from 1/2 to 1/3 and m+n is from 3 to 6 in the formula (XXX). As a commercially available phosphazene compound, SPE-100 (trade name, manufactured by Otsuka Chemical Co., Ltd.) can be obtained.

The phosphate is not particularly limited if the phosphate is an ester compound made from phosphoric acid and an alcoholic compound or phenolic compound. Examples thereof include trimethyl phosphate, triethyl phosphate, triphenyl phosphate, tricresyl phosphate, trixylenyl phosphate, cresyldiphenyl phosphate, xylenyldiphenyl phosphate, tris(2,6-dimethylphenyl)phosphate, and aromatic condensed phosphates. Among these, an aromatic condensed phosphate represented by the following general formula (II) is preferred from the viewpoint of hydrolysis resistance thereof:

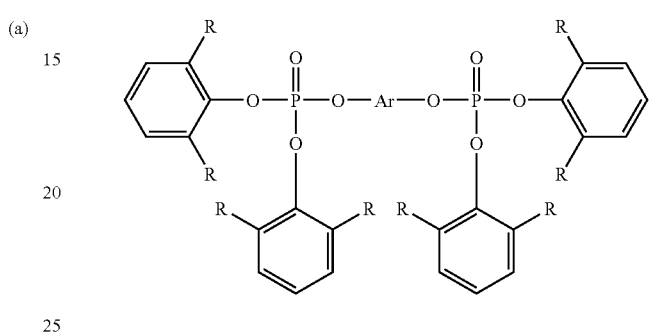

(II)

wherein R's, the number of which is eight, may be the same or different, and each represent an alkylgroup having 1 to 4, and Ar represents an aromatic ring.

Examples of the phosphate of the formula (II) include phosphates represented by the following structural formulae (XVI) to (XX):

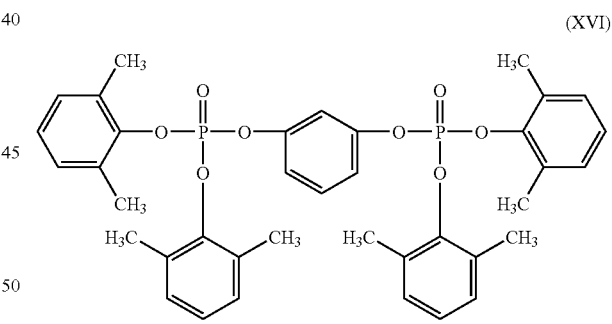

(XVI)

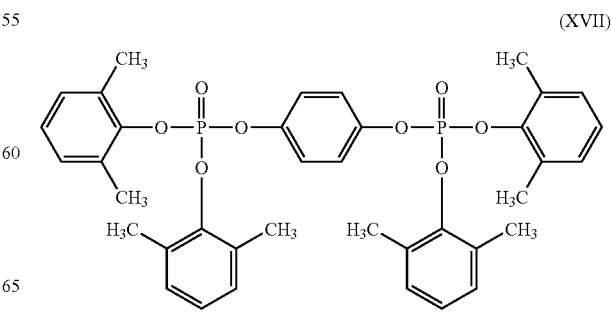

(XVII)

-continued

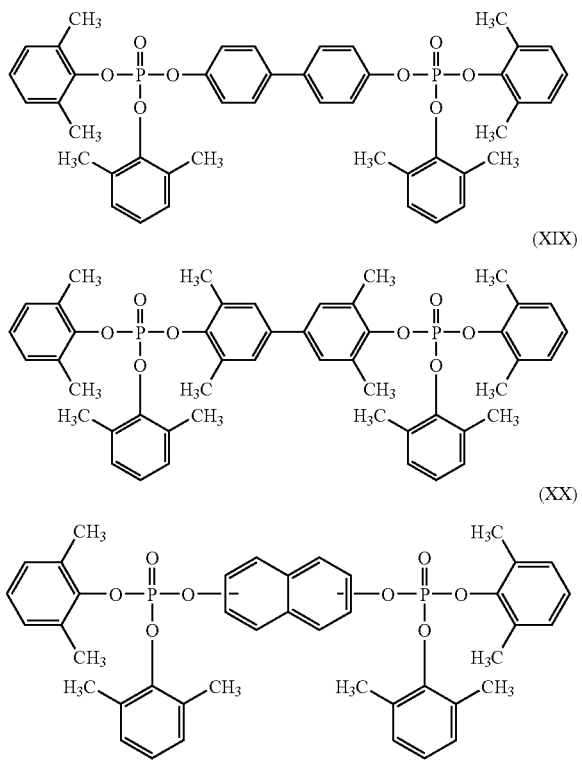

The added amount of the phosphate is preferably from 0.2 to 3.0% by weight of all the blended components except the filler, the added amount being conversed into the ratio of phosphorus atoms. If the ratio is less than 0.2% by weight, the filling ability lowers so that molding defects such as voids are easily generated. Moreover, the flame resistant effect tends to lower. If the ratio is more than 3.0% by weight, the moldability and the humidity resistance lower and further when the epoxy resin molding material is molded, the phosphate oozes out to damage the external appearance.

The phosphine oxide is preferably a compound represented by the following general formula (III):

(III)

wherein $R^1$, $R^2$ and $R^3$, which may be the same or different, each represent a substituted or unsubstituted alkyl group having 1 to 10 carbon atoms, an aryl group, an aralkyl group, or a hydrogen atom provided that the case that all of $R^1$, $R^2$ and $R^3$ are hydrogen atoms is excluded.

About phosphorus compounds represented by the general formula (I), $R^1$ to $R^3$ are preferably substituted or unsubstituted aryl groups, and are in particular preferably phenyl groups from the viewpoint of hydrolysis resistance.

The blended amount of the phosphine oxide is preferably from 0.01 to 0.2%, more preferably from 0.02 to 0.1%, even more preferably from 0.03 to 0.08% by weight of the encapsulating epoxy resin molding material, the blended amount being converted into the ratio of phosphorus atoms. If the ratio is less than 0.01% by weight, the flame resistance lowers. If the ratio is more than 0.2% by weight, the moldability and the humidity resistance lower.

(Curing Accelerator)

It is preferred to incorporate (F) a curing accelerator into the present invention from the viewpoint of curability. The curing accelerator (F) used in the invention is not particularly limited if the curing accelerator is a curing accelerator which is ordinarily used in encapsulating epoxy resin molding material. Examples thereof include cycloamidine compounds such as 1,8-diaza-bicyclo(5,4,0)undecene-7, 1,5-diaza-bicyclo(4,3,0)nonene and 5,6-dibutylamino-1,8-diaza-bicyclo(5,4,0)undecene-7, and compounds which each have intermolecular polarization and are obtained by adding, to any one of these compounds, a compound having a π bond, such as quinone compounds such as maleic anhydride, 1,4-benzoquinone, 2,5-toluquinone, 1,4-naphthoquinone, 2,3-dimethylbenzoquinone, 2,6-dimethylbenzoquinone, 2,3-dimethoxy-5-methyl-1,4-benzoquinone, 2,3-dimethoxy-1,4-benzoquinone, phenyl-1,4-benzoquinone and diazophenylmethane or phenyl resin; tertiary amines such as benzyldimethylamine, triethanolamine, dimethylaminoethanol and tris(dimethylaminomethyl)phenol, and derivatives thereof; imidazoles such as 2-methylimidazole, 2-phenylimidazole and 2-phenyl-4-methylimidazole, and derivatives thereof; organic phosphines such as tributylphosphine, methyldiphenylphosphine, triphenylphosphine, tris(4-methylphenyl)phosphine, diphenylphosphine and phenylphosphine, and phosphorus compounds which each have intermolecular polarization and are obtained by adding to any one of these phosphines a compound having a n bond such as maleic anhydride, any one of the above-mentioned quinone compounds, diazophenylmethane or phenyl resin; and tetraphenylboron salts such as tetraphenylphosphonium tetraphenyl borate, triphenylphosphine tetraphenyl borate, 2-ethyl-4-methylimidazole tetraphenyl borate and N-methylmorpholine tetraphenyl borate, and derivatives thereof. These may be used alone or in combination of two or more thereof. In particular, an adduct of an organic phosphine and a quinone compound is preferred from the viewpoint of filling ability and reflow resistance.

The blended amount of the curing accelerator is not particularly limited if the amount is such an amount that curing accelerating effect can be attained. The amount is preferably from 0.005 to 2% by weight, more preferably from 0.01 to 0.5% by weight of the encapsulating epoxy resin molding material. If the amount is less than 0.005% by weight, the curability in a short time tends to deteriorate. If the amount is more than 2% by weight, the curing speed is too large so that a good molded product tends not to be easily obtained.

(Flame Retardant)

Various flame retardants may be added to the present invention from the viewpoint of flame resistance. The flame retardants may be flame retardants which are ordinarily used in encapsulating epoxy resin molding material, and are not particularly limited. Examples thereof include brominated epoxy resins such as a diglycidyl etherized product of tetrabromobisphenol A and brominated phenol Novolak epoxy resin, antimony oxide, phosphorus compounds such as red phosphorus and the above-mentioned phosphates, nitrogen-containing compounds such as melamine, melaminecyanurate, melamine-modified phenol resin and guanamine-modified phenol resin, phosphorus/nitrogen-containing compounds such as cyclophosphazene, metal compounds such as zinc oxide, iron oxide, molybdenum oxide, ferrocene, the above-mentioned aluminum hydroxide, magnesium hydroxide, and composite metal hydroxides.

Non-halogen or non-antimony flame retardants are preferred from the viewpoint of environmental problems in recent years and high-temperature leaving (or standing) property. Among these, phosphates are preferred from the viewpoint of filling ability. Composite metal hydroxides are preferred from the viewpoint of safety and humidity resistance.

A preferred example of the composite metal hydroxides is a compound represented by the following composition formula (XXI):

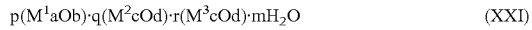

wherein $M^1$, $M^2$ and $M^3$ represent metal elements different from each other, and a, b, c, d, p, q and m each represent a positive number, and r represents 0 or a positive number.

In particular, more preferred is a compound wherein r is 0 in the composition formula (XXI), that is, a compound represented by the following composition formula (XXIa):

wherein $M^1$ and $M^2$ represent metal elements different from each other, and a, b, c, d, m, n and l each represent a positive number.

$M^1$ and $M^2$ in the composition formulae (XXI) and (XXIa) are not particularly limited if they are metal elements different from each other. From the viewpoint of flame resistance, it is preferred that $M^1$ and $M^2$ are selected not to make them identical with each other, $M^1$ is selected from metal elements in the third period, alkaline earth metal elements in the group IIA and metal elements in the groups IVB, IIB, VIII, IB, IIIA and IVA, and $M^2$ is selected from transition metal elements in the groups IIIB to IIB. It is more preferred that $M^1$ is selected from magnesium, calcium, aluminum, tin, titanium, iron, cobalt, nickel, copper and zinc, and $M^2$ is selected from iron, cobalt, nickel, copper and zinc. From the viewpoint of fluidity, $M^1$ and $M^2$ are preferably magnesium, and zinc or nickel, respectively, and $M^1$ and $M^2$ are more preferably magnesium and zinc, respectively.

The mole ratio between p, q and r in the composition formula (XXI) is not particularly limited if the advantageous effects of the invention can be obtained. It is preferred that r is 0 and the mole ratio of p to q, p/q, is from 99/1 to 50/50. In other words, it is preferred that the mole ratio of m to n, m/n, in the composition formula (XXIa) is from 99/1 to 50/50.

The classification of metal elements is performed on the basis of the long periodic table, wherein typical elements are classified into the subgroup A and transition elements are classified into the subgroup B, (source: "Kagaku Dai-jiten (Chemistry Large Dictionary) 4", reduced-size version, the 30th impression printed on Feb. 15, 1987, published by Kyoritsu Shuppan Co., Ltd.).

The shape of the composite metal hydroxide is not particularly limited, and is more preferably a polyhedral shape having an appropriate thickness than a planar shape from the viewpoint of fluidity and filling ability. About the composite metal hydroxide, polyhedral crystal is more easily obtained than about metal hydroxide.

The blended amount of the composite metal hydroxide is not particularly limited, and is preferably from 0.5 to 20% by weight, more preferably from 0.7 to 15% by weight, even more preferably from 1.4 to 12% by weight of the encapsulating epoxy resin molding material. If the amount is less than 0.5% by weight, the flame resistance tends to be insufficient. If the amount is more than 20% by weight, the filling ability and the reflow resistance tend to lower.

(Other Components)

An anionic exchanger can be added to the encapsulating epoxy resin molding material of the present invention in order to improve the humidity resistance and the high-temperature leaving property of a semiconductor element such as an IC. The anionic exchanger is not particularly limited and an anionic exchanger known in the prior art can be used. Examples thereof include hydrotalcite, and a hydrated oxide of an element selected from magnesium, aluminum, titanium, zirconium, bismuth and others. These may be used alone or in combination of two or more thereof. Among these, a hydrotalcite represented by the following composition formula (XXI) is preferred:

wherein $0 \leq X \leq 0.5$, and m is a positive number.

Furthermore, other additives can be incorporated into the encapsulating epoxy resin molding material of the invention if necessary, examples of the additives including releasing agents such as higher aliphatic acids, higher aliphatic acid metal salts, ester waxes, polyolefin waxes, polyethylene and polyethylene oxide, coloring agents such as carbon black, and stress relaxing agents such as silicone oil and silicone rubber powder.

(Heating Loss Ratio)

The heating loss ratio of the epoxy resin molding material is essentially 0.25% or less by weight, more preferably 0.22% or less by weight, even more preferably 0.20% or less by weight. If the heating loss ratio is more than 0.25% by weight, air bubbles based on volatile contents generated when the material is molded increase so that voids are easily generated in the resultant thin portion.

(Definition of the Heating Loss Ratio)

The weight $W_0$ of a resin composition added to a heat resistant container having a weight of A is measured. This is allowed to stand still for 1 hour in an atmosphere of 200° C. temperature. Thereafter, the total weight W of the container and the resin composition is measured. At this time, the heating loss ratio Y is obtained from the following equation:

$Y = 100 \times (W_0 - W)/(W_0 - A)$ (Method for Controlling the Heating Loss Ratio)

Volatile components generated when the heating loss ratio is measured are mainly water and alcohols. It is therefore effective to reduce the water content in the epoxy resin molding material before it is molded, optimize the amount of the coupling agent into a necessary minimum amount, and use a coupling agent which does not generate volatile components easily.

(Physical Properties of the Cured Epoxy Resin Molding Material)

It is preferred to use the encapsulating epoxy resin molding material satisfying at least one of the following conditions: the glass transition temperature based on TMA method is 150° C. or higher; the bending modulus based on JIS-K 6911 is 19 GPa or less; and the mold shrinkage ratio based on JIS-K 6911 is 0.2% or less. The molding material more preferably satisfies two or more of the above-mentioned conditions, and even more preferably satisfies all of the three conditions. The glass transition temperature is preferably 160° C. or higher, more preferably 170° C. or higher from the viewpoint of warp. If the temperature is less than 150° C., the material tends to be largely warped. The bending modulus is preferably 18.5 GPa or less, more preferably 18 GPa or less from the viewpoint of warp. If the bending modulus is more than 19 GPa, the material tends to be largely warped. The molding shrinkage ratio is preferably 0.18% or less, more preferably 0.15% or less from the viewpoint of warp. If the ratio is more than 0.2%, the material tends to be largely warped.

(Preparing/Using Methods)

The encapsulating epoxy resin molding material of the present invention can be prepared by any method that makes it possible to disperse and mix various starting materials homogeneously. A common example of the method is a method of mixing starting materials sufficiently in given blended amounts with a mixer or the like, mixing or melt-kneading the materials with a mixing roll, an extruder, a breaker or crusher, a planetary mixer or the like, cooling the mixture, and optionally defoaming and pulverizing the resultant. If necessary, the molding material may be made into the form of a tablet having a dimension and weight corresponding to molding conditions.

The commonest example of the method for encapsulating a semiconductor device by use of the encapsulating epoxy resin molding material of the invention is low-pressure transfer molding. Other examples thereof include injection molding and compression molding. A dispense manner, casting manner or printing manner may be used. From the viewpoint of filling ability, a molding method which can attain molding in a reduced pressure state is preferred.

The encapsulating epoxy resin molding material of the present invention will be further described by way of some embodiments thereof.

First Embodiment

A first embodiment of the encapsulating epoxy resin molding material according to the invention is an encapsulating epoxy resin molding material comprising (A) an epoxy resin, (B) a curing agent, and (C) an inorganic filler having an average particle size of 12 μm or less and a specific surface area of 3.0 m²/g or more. In this case, the inorganic filler (C) preferably satisfies at least one of the following conditions: the amount of particles having a particle size of 12 μm or less is 50% or more by weight; the amount of particles having a particle size of 24 μm or less is 70% or more by weight; and the amount of particles having a particle size of 32 μm or less is 80% or more by weight; and the amount of particles having a particle size of 48 μm or less is 90% or more by weight. Furthermore, the inorganic filler (C) preferably has an average particle size of 10 μm or less, and preferably has a specific surface area of 3.5 to 5.5 m²/g.

The epoxy resin (A), the curing agent (B) and the inorganic filler (C) are preferably selected from the following viewpoints.

In the selection of the epoxy resin (A), an epoxy resin having a melting viscosity of 2 poises or less at 150° C. is preferably selected, and an epoxy resin having a melting viscosity of 1 poise or less is more preferably selected. When the ratio of the blended inorganic filler (C) is high, this selection is particularly effective. It is particularly preferred from the viewpoint of filling ability and reliability to use at least one selected from a biphenyl epoxy resin, a bisphenol F epoxy resin, a stylbene epoxy resin and a sulfur-containing epoxy resin. In order to decrease a warp in a flip chip package type package, it is preferred to use at least one selected from a naphthalene epoxy resin and a triphenylmethane epoxy resin. In order to make the filling ability and the warp compatible with each other, it is preferred to use the following together: at least one selected from a biphenyl epoxy resin, a bisphenol F epoxy resin, a stylbene epoxy resin and a sulfur-containing epoxy resin and at least one selected from a naphthalene epoxy resin and a triphenylmethane epoxy resin.

In the selection of the curing agent (B), a curing agent having a melting viscosity of 2 poises or less at 150° C. is preferably selected, and a curing agent having a melting viscosity of 1 poise or less is more preferably selected. When the ratio of the blended inorganic filler (C) is high, this selection is particularly effective. Moreover, this selection is particularly effective when at least one selected from Novolak epoxy resins is used as the epoxy resin (A) from the viewpoint of moldability, when a dicyclopentadiene epoxy resin is used from the viewpoint of a lowness in the hygroscopicity, and when at least one selected from a naphthalene epoxy resin and a triphenylmethane epoxy resin is used from the viewpoint of heat resistance and a lowness in the warping property.

In the selection of the inorganic filler (C) which has an average particle size of 15 μm or less and a specific surface area of 3.0 to 6.0 m²/g, it is preferred to select an inorganic filler having an average particle size of 15 μm or less and further having such a size that the filler can be injected, considering the height and the pitch of bumps in a flip chip package type semiconductor device to be used, the height and the pitch being within the scope of the present invention. However, if a filler having a smaller size than it needs is selected, the fluidity and the filling ability lower. In order to avoid this, it is preferred to select a filler having a specific surface area in the range of 3.0 to 6.0 m²/g. In order that both of the average particle size and the specific surface area can satisfy the above-mentioned ranges, it is effective to combine two or more commercially available inorganic fillers to prepare a target inorganic filler.

If necessary, coarse particles of the inorganic filler (C) may be cut with a sieve. The amount of the component (C) having a size of 53 μm or more is preferably 0.5% or less by weight, the amount of the component (C) having a size of 30 μm or more is more preferably 0.5% or less by weight, and the amount of the component (C) having a size of 20 μm or more is even more preferably 0.5% or less by weight.

In the selection of the inorganic filler (C), which has an average particle size of 12 μm or less and a specific surface area of 3.0 m²/g or more, it is preferred to select an inorganic filler having an average particle size of 12 μm or less and further having such a size that the filler can be injected, considering the height and the pitch of bumps in a flip chip package type semiconductor device to be used. However, if a filler having a smaller size than it needs is selected, a fall in the fluidity is caused. Thus, the selection should be avoided. It is effective to select an inorganic filler having a specific surface of 3.0 m²/g or more and an average particle size which makes it possible that the filler is injected and which is as small as possible. In order to satisfy both of the average particle size and the specific surface area in the above-mentioned ranges, it is effective to combine two or more commercially available inorganic fillers. If necessary, coarse particles of the inorganic filler (C) may be cut with a sieve. The amount of the component (C) having a size of 53 μm or more is preferably 0.5% or less by weight, the amount of the component (C) having a size of 30 μm or more is more preferably 0.5% or less by weight, and the amount of the component (C) having a size of 20 μm or more is even more preferably 0.5% or less by weight.

If desired, any one of (D2) a silane coupling agent having a secondary amino group, (E) a phosphorus compound, and (F) a curing accelerator may be added besides the above-mentioned components. The adjustment of the combination of the respective components and the blended amounts thereof makes it possible to yield an encapsulating epoxy resin molding material for a flip chip package type under fill. The adjustment of the combination of the respective components and the blended amounts thereof makes it possible to yield an encapsulating epoxy resin molding material for a flip chip package type under fill.

Second Embodiment

A second embodiment of the encapsulating epoxy resin molding material according to the present invention is an encapsulating epoxy resin molding material comprising (A) an epoxy resin, (B) a curing agent, and 5% or more by weight of (C) an inorganic filler having a maximum particle size of 63 μm or less and particle sizes of 20 μm or more. In this case, the average particle size of the inorganic filler (C) is preferably 10 μm or less. The specific surface area of the inorganic filler (C) is preferably from 3.5 to 5.5 $m^2/g$. The selection of the epoxy resin (A), the curing agent (B) and the inorganic filler (C) is performed from the same viewpoints as in the first embodiment.

If desired, any one of (D2) a silane coupling agent having a secondary amino group, (E) a phosphorus compound, and (F) a curing accelerator may be added besides the above-mentioned components. The adjustment of the combination of the respective components and the blended amounts thereof makes it possible to yield an encapsulating epoxy resin molding material for a flip chip package type under fill.

In the case of using an encapsulating epoxy resin of a conventional solid type to perform encapsulation in the production of a next-generation flip chip type semiconductor device having bumps arranged at a fine pitch, the filling thereof into its under fill portion is unsatisfactory because of the generation of relatively large voids having a diameter of about 0.1 mm. However, the problem can be overcome using, as an encapsulating material, the encapsulating epoxy resin of the present invention, typical examples of which are the first and second embodiments.

Third Embodiment

A third embodiment of the encapsulating epoxy resin molding material according to the present invention is an encapsulating epoxy resin molding material comprising, as essential components, (A) an epoxy resin, (B) a curing agent, and (C) an inorganic filler having an average particle size of 15 μm or less and a specific surface area of 3.0 to 6.0 $m^2/g$. The selection of the epoxy resin (A), the curing agent (B) and the inorganic filler (C) is performed from the same viewpoints as in the first embodiment.

If desired, any one of (D2) a silane coupling agent having a secondary amino group, (E) a phosphorus compound, and (F) a curing accelerator may be added besides the above-mentioned components. The adjustment of the combination of the respective components and the blended amounts thereof makes it possible to yield an encapsulating epoxy resin molding material for a flip chip package type under fill. The molding material used, in particular, in a semiconductor device has one or more of the following structures (a1) to (d1):

(a1) a structure wherein a bump height of a flip chip is 150 μm or less, (b1) a structure wherein a bump pitch of the flip chip is 500 μm or less, (c1) a structure wherein an area of a semiconductor chip is 25 $mm^2$ or more, and (d1) a structure wherein a thickness of a package, in which the semiconductor chip is disposed on a mounting substrate, is 2 mm or less.

Fourth Embodiment

A fourth embodiment of the encapsulating epoxy resin molding material according to the present invention is an encapsulating epoxy resin molding material comprising (A) an epoxy resin, (B) a curing agent, (C) an inorganic filler, and (D) a coupling agent, wherein the specific surface area of the inorganic filler (C) is from 3.0 to 6.0 $m^2/g$. The selection of the epoxy resin (A), the curing agent (B) and the inorganic filler (C) is performed from the same viewpoints as in the first embodiment.

The filler coating ratio of the coupling agent (D) is preferably from 0.3 to 1.0. The heating loss ratio after heating at 200° C./hour is preferably 0.25% or less by weight. If desired, other additives may be added besides the above-mentioned components. The adjustment of the combination of the respective components and the blended amounts thereof makes it possible to yield an encapsulating epoxy resin molding material for a flip chip package type under fill.

Fifth Embodiment

A fifth embodiment of the encapsulating epoxy resin molding material according to the present invention is an encapsulating epoxy resin molding material comprising (A) an epoxy resin, (B) a curing agent, and (C) an inorganic filler, and satisfying at least one of the following conditions: the glass transition temperature based on TMA method is 150° C. or higher; the bending modulus based on JIS-K 6911 is 19 GPa or less; and the mold shrinkage ratio based on JIS-K 6911 is 0.2% or less. The selection of the epoxy resin (A), the curing agent (B) and the inorganic filler (C) is performed from the same viewpoints as in the first embodiment.

In this case, the molding material is used in a semiconductor device having one or more of the following structures (c1), (d1) and (g1):

(c1) a structure wherein an area of a semiconductor chip is 25 $mm^2$ or more, (d1) a structure wherein a thickness of a package, in which the semiconductor chip is disposed on a mounting substrate, is 2 mm or less, and (g1) a structure wherein the encapsulating-material molded area based on a package-molding method is 3000 $mm^2$ or more. Alternatively, the molding material is used in a semiconductor device having one or more of the following structures (c2), (d2) and (g2):

(c2) a structure wherein an area of a semiconductor chip is 50 $mm^2$ or more, (d2) a structure wherein a thickness of a package, in which the semiconductor chip is disposed on a mounting substrate, is 1.5 mm or less, and (g2) a structure wherein the encapsulating-material molded area based on a package-molding method is 5000 $mm^2$ or more.

The warp of the semiconductor device obtained by way of the fifth embodiment is 5.0 mm or less, and the warp of the semiconductor device is preferably 2.0 mm or less.

In the case of using an encapsulating epoxy resin of a conventional solid type to perform encapsulation in the production of a next-generation flip chip type semiconductor device having bumps arrange data fine pitch, the filling thereof into its under fill portion is unsatisfactory because of the generation of relatively large voids having a diameter of about 0.1 mm. However, this problem can be overcome using, as an encapsulating material, the encapsulating epoxy resin of the present invention, typical examples of which are the $1^{st}$ to $5^{th}$ embodiments. In other words, the encapsulating epoxy resin molding material of the invention is used suitably for the production of a semiconductor device having a given structure, which will be described later in the column of semiconductor devices.

According to the fifth embodiment, the encapsulating epoxy resin molding material has filling ability suitable as an under filler for flip chip packaging and further causes a reduction in a substrate warp and a package warp after a substrate is subjected to encapsulation with the material.

Embodiments 1 of the Semiconductor

Embodiments of the semiconductor device of the present invention are described with reference to FIGS. 1 to 4. The semiconductor device of the invention is not limited thereto.

Figure 2:
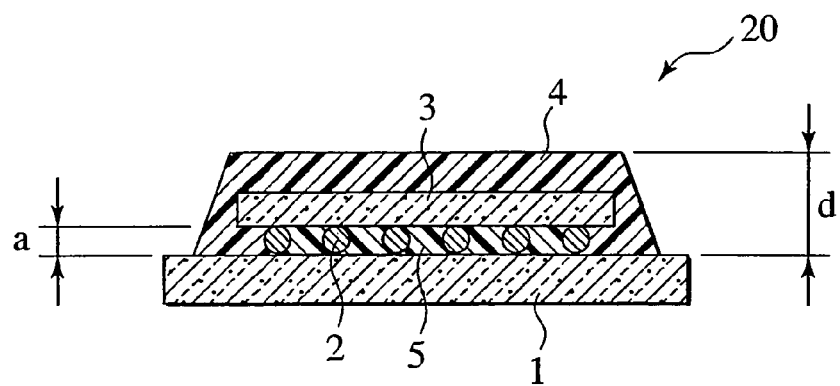
FIG. 2 illustrates a sectional view of a flip chip type BGA (of an over-molded type) encapsulated by an encapsulating epoxy resin molding material (encapsulating material).
Figure 3:
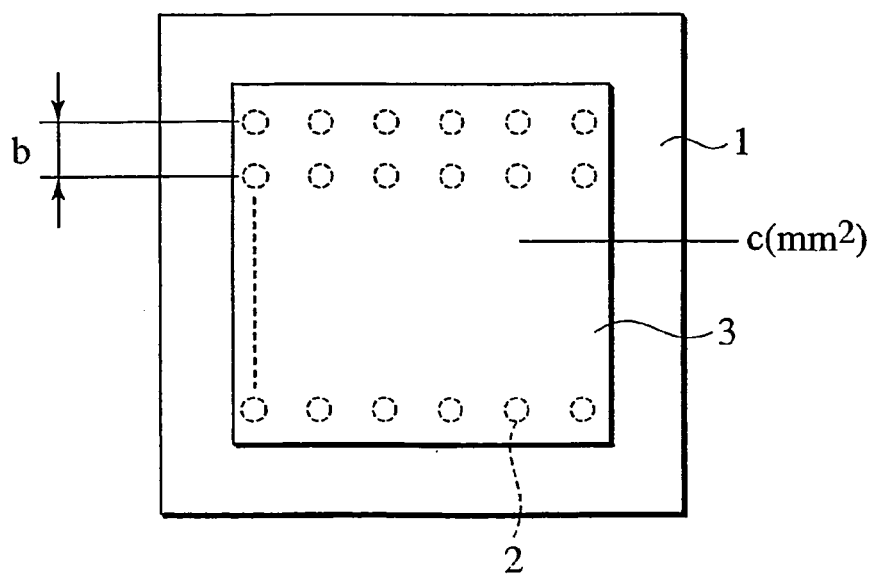
FIG. 3 illustrates a top view (partially perspetive view) when a semiconductor chip 3 is arranged onto a wiring board 1 to interpose solder bumps 2 therebetween.

FIG. 1 illustrates a sectional view of a flip chip type BGA of an under fill type, and FIG. 2 illustrates a sectional view of a flip chip type BGA of an over-molded type. FIG. 3 illustrates a top view (partially perspective view) when a semiconductor chip 3 is arranged over a wiring board 1 of a flip chip type BGA so as to interpose solder bumps 2 therebetween.

A semiconductor device 10 of a flip chip type BGA of an under fill type, illustrated in FIG. 1, is a device obtained by arranging solder bumps 2 onto a wiring board 1 so as to have a given bump pitch b, as illustrated in FIG. 3; connecting and fixing a semiconductor chip 3, through the solder bumps 2 having a bump height a, onto the wiring board 1; and encapsulating an under fill portion 5 formed between the wiring board 1 and the semiconductor chip 3 with an encapsulating epoxy resin molding material (encapsulating material) 4. A semiconductor device 20 of a flip chip type BGA of an over-molded type illustrated in FIG. 2 is produced by the same method as described above except that an under fill portion 5 is encapsulated and simultaneously a semiconductor chip 3 is encapsulated so as to cover the whole of the chip 3 in an encapsulating step.

At the time of producing the embodiments of the semiconductor device of the present invention, it is preferred that the bump height a and the bump pitch b in the semiconductor device, the area c of the semiconductor chip, and the total thickness d of the encapsulating material (i.e., the thickness of a package, in which the semiconductor chip is disposed on a mounting substrate) are set as follows.

The height a of the solder bumps 2 is preferably 150 µm or less, more preferably 100 µm or less, even more preferably 80 µm or less. The pitch b of the solder bumps 2, that is, the interval between the centers of the bumps is preferably 500 µm or less, more preferably 400 µm or less, even more preferably 300 µm or less.

The number of the solder bumps 2 is preferably 100 or more, more preferably 150 or more, even more preferably 200 or more.

The area c of the semiconductor chip 3 is preferably 25 mm² or more, more preferably 50 mm² or more, even more preferably 80 mm² or more.

The total thickness d of the encapsulating material 4 is preferably 2 mm or less, more preferably 1.5 mm or less, even more preferably 1.0 mm or less.

In the case of an under fill type, the total thickness and the height a is the same.

Embodiments 2

FIGS. 4 illustrate a flip chip type BGA wherein bumps 2 are used to connect and fix a semiconductor chip 3 onto a wiring board 1 and then the resultant is encapsulated by an encapsulating epoxy resin molding material (encapsulating material) 4. FIG. 4(x) is a sectional view (over-molded type) and FIG. 4(y) is a top view (partially perspective view).

In the semiconductor device of the invention illustrated in FIGS. 4, the area c of the semiconductor chip 3 is preferably 25 mm² or more, more preferably 50 mm² or more, even more preferably 70 mm² or more.

The total thickness d of the encapsulating material 4 is preferably 2 mm or less, more preferably 1.5 mm or less, even more preferably 1.0 mm or less.

The encapsulating-material molded area g based on a package-molding method is preferably 3000 mm² or more, more preferably 5000 mm² or more.

Other Embodiments of the Semiconductor Device

Other embodiments of the semiconductor device of the invention may be flip chip package type semiconductor devices wherein elements such as active elements such as semiconductor chips, transistors, diodes or thyristors and passive elements such as condensers, resistors, and coils are mounted on a supporting member or a mounting substrate such as a wired tape carrier, a wiring board, or a glass and then the resultant is encapsulated by an encapsulating epoxy resin molding material.

As the encapsulating epoxy resin molding material which constitutes the semiconductor devices, the encapsulating epoxy resin molding material according to embodiments of the present invention can be used. For example, the following is used: an encapsulating epoxy resin molding material comprising (A) an epoxy resin, (B) a curing agent, and (C) an inorganic filler, wherein the inorganic filler satisfies at least one of the following conditions:

(1) the average particle size is 12 µm or less and the specific surface area is 3.0 m²/g or more; and (2) 5% or more by weight of an inorganic filler having a maximum particle size of 63 µm or less and particle sizes of 20 µm or more is contained.

If desired, this encapsulating epoxy resin molding material comprises (D2) a silane coupling agent having a secondary amino group and (E) a curing accelerator.

The inorganic filler (C) is preferably an inorganic filler satisfying the condition (1) from the viewpoint of filling ability, and is preferably an inorganic filler satisfying the condition (2) from the viewpoint of an improvement in the burr (flash) resistance. From the viewpoint of the two, a filler satisfying the conditions (1) and (2) is preferred.

The mounting substrate is not particularly limited, and examples thereof include interposer substrates such as an organic substrate, an organic film, a ceramic substrate and a glass substrate, a glass substrate for liquid crystal, a substrate for a multi chip module (MCM), and a substrate for a hybrid IC.

Embodiments of the semiconductor device of the invention preferably has one or more of the following that are each specified into a given value: (a) a bump height of a flip chip, (b) a bump pitch of the flip chip, (c) an area of a semiconductor chip, (d) a thickness of a package, in which the semiconductor chip is disposed on a mounting substrate, (e) a bump number in the flip chip, and (f) a thickness of an air vent when the material is molded. Specifically, preferred is a semiconductor device having one or more of the following structures (a1) to (f1):

(a1) a structure wherein a bump height of a flip chip is 150 μm or less, (b1) a structure wherein a bump pitch of the flip chip is 500 μm or less, (c1) a structure wherein an area of a semiconductor chip is 25 mm² or more, (d1) a structure wherein a thickness of a package, in which the semiconductor chip is disposed on a mounting substrate, is 2 mm or less, (e1) a structure wherein the flip chip has 100 or more bumps, and (f1) a structure wherein a thickness of an air vent when the material is molded is 40 μm or less.

More preferred is a semiconductor device having one or more of the following structures (a2) to (f2):

(a2) a structure wherein a bump height of a flip chip is 100 μm or less, (b2) a structure wherein a bump pitch of the flip chip is 400 μm or less, (c2) a structure wherein an area of a semiconductor chip is 50 mm² or more, (d2) a structure wherein a thickness of a package, in which the semiconductor chip is disposed on a mounting substrate, is 1.5 mm or less, (e2) a structure wherein the number of the bumps in the flip chip is 150 or more, and (f2) a structure wherein a thickness of an air vent when the material is molded is 30 μm or less.

Even more preferred is a semiconductor device having one or more of the following structures (a3) to (f3):

(a3) a structure wherein a bump height of a flip chip is 150 μm or less, (b3) a structure wherein a bump pitch of the flip chip is 300 μm or less, (c3) a structure wherein an area of a semiconductor chip is 80 mm² or more, (d3) a structure wherein a thickness of a package, in which the semiconductor chip is disposed on a mounting substrate, is 1.0 mm or less, (e3) a structure wherein the number of the bumps in the flip chip is 200 or more, and (f3) a structure wherein a thickness of an air vent when the material is molded is 20 μm or less.

The above has described the semiconductor device by way of the preferred embodiments. Particularly preferred are semiconductor devices having the following combinations out of the structures (a) to (f).

From the viewpoint of filling ability, preferred are semiconductor devices having at least one of the structures (a) and (b) More specifically, preferred are a semiconductor device having the structures (a1) and (b1), a semiconductor device having the structures (a1) and (d1), a semiconductor device having the structures (a1) and (c1), a semiconductor device having the structures (b) and (d), and a semiconductor device having the structures (b1) and (c1). Furthermore, preferred are a semiconductor device having the structures (a2) and (b2), a semiconductor device having the structures (a2) and (d2), a semiconductor device having the structures (a2) and (c2), a semiconductor device having the structures (b2) and (d2), and a semiconductor device having the structures (b2) and (c2). Furthermore, preferred are a semiconductor device having the structures (a3) and (b3), a semiconductor device having the structures (a3) and (d3), a semiconductor device having the structures (a3) and (c3), a semiconductor device having the structures (b3) and (d3), and a semiconductor device having the structures (b3) and (c3).

Examples of such semiconductor devices include bare chip mounted semiconductor devices, such as a chip on board (COB) and a chip on glass (COG), which are each obtained by using the encapsulating epoxy resin molding material of the invention to encapsulate a semiconductor chip connected to wiring formed on a wiring board or a glass by flip chip bonding; hybrid ICs and multi chip modules (MCMs) which are each obtained by using the encapsulating epoxy resin molding material of the invention to encapsulate semiconductor chips, transistors, diodes, thyristors or other active elements connected to wiring formed on a wiring board or a glass by flip chip bonding and/or condensers, resistors, coils or other passive elements connected to the wiring in the same manner; and a ball grid array (BGA), a chip size package (CSP) and a multi chip package (MCP), which are each obtained by mounting a semiconductor chip onto an interposer substrate wherein terminals for connecting to a mother board are formed, connecting the semiconductor chip to wiring formed on the interposer substrate through bumps, and then encapsulating the semiconductor chip mounted side of the resultant with the encapsulating epoxy resin molding material of the invention. These semiconductor devices may be stacked packages wherein two or more elements are stacked and mounted on a mounting substrate, or package-molded type packages wherein two or more elements are encapsulated at a time with the encapsulating epoxy resin molding material.

Embodiment 2 of the Semiconductor Device

As the encapsulating epoxy resin molding material, an encapsulating epoxy resin molding material of the present invention is preferred. That is, it is preferred to use an encapsulating epoxy resin molding material comprising (A) an epoxy resin, (B) a curing agent, and (C) an inorganic filler, and satisfying at least one of the following conditions: the glass transition temperature based on TMA method is 150° C. or higher; the bending modulus based on JIS-K 6911 is 19 GPa or less; and the mold shrinkage ratio based on JIS-K 6911 is 0.2% or less. It is more preferred to satisfy two or more of the above-mentioned conditions, and it is even more preferred to satisfy all of the three conditions. The glass transition temperature is preferably 160° C. or higher, more preferably 170° C. or higher from the viewpoint of warp. If the temperature is less than 150° C., the molding material tends to be largely warped. The bending modulus is preferably 18.5 GPa or less, more preferably 18 GPa or less from the viewpoint of warp. If the bending modulus is more than 19 GPa, the molding material tends to be largely warped. The molding shrinkage ratio is preferably 0.18% or less, more preferably 0.15% or less from the viewpoint of warp. If the ratio is more than 0.2%, the molding material tends to be largely warped.

The warp of the semiconductor device encapsulated by the above-mentioned encapsulating epoxy resin molding material is preferably 5.0 mm or less, more preferably 2.0 mm or less, even more preferably 1.5 mm or less. If the warp is more than 0.5 mm in the case of semiconductor devices based on a package-molding manner, works at the time of cutting and separating the molded product into semiconductor individuals or at the time of the mounting thereof onto a wiring board tend to be damaged.

The mounting substrate is not particularly limited, and examples thereof include interposer substrates such as an organic substrate, an organic film, a ceramic substrate and a glass substrate, a glass substrate for liquid crystal, a substrate for a multi chip module (MCM), and a substrate for a hybrid IC.

Embodiments of the semiconductor device of the invention preferably have one or more of the following that are each specified into a given value: (a) a bump height of a flip chip, (b) a bump pitch of the flip chip, (c) an area of a semiconductor chip, (d) a thickness of a package, in which the semiconductor chip is disposed on a mounting substrate, (e) a bump number in the flip chip, and (g) an encapsulating-material molded area based on a package-molding method.

Specifically, preferred is a semiconductor device having one or more of the following structures (a1) to (g1).

In the invention, the wording "the thickness of a package, in which the semiconductor chip is disposed on a mounting substrate" means the following in the case of an under fill type: the height of bumps therein.

(a1) a structure wherein a bump height of a flip chip is 150 μm or less, (b1) a structure wherein a bump pitch of the flip chip is 500 μm or less, (c1) a structure wherein an area of a semiconductor chip is 25 mm$^2$ or more, (d1) a structure wherein a thickness of a package, in which the semiconductor chip is disposed on a mounting substrate, is 2 mm or less, (e1) a structure wherein the number of the bumps in the flip chip is 100 or more, and (g1) a structure wherein the encapsulating-material molded area based on a package-molding method is 3000 mm$^2$ or more.

More preferred is a semiconductor device having one or more of the following structures (a2) to (g2):

(a2) a structure wherein a bump height of a flip chip is 100 μm or less, (b2) a structure wherein a bump pitch of the flip chip is 400 μm or less, (c2) a structure wherein an area of a semiconductor chip is 50 mm$^2$ or more, (d2) a structure wherein a thickness of a package, in which the semiconductor chip is disposed on a mounting substrate, is 1.5 mm or less, (e2) a structure wherein the number of the bumps in the flip chip is 150 or more, and (g2) a structure wherein the encapsulating-material molded area based on a package-molding method is 5000 mm$^2$ or more.

Even more preferred is a semiconductor device having one or more of the following structures (a3) to (g3):

(a3) a structure wherein a bump height of a flip chip is 80 μm or less, (b3) a structure wherein a bump pitch of the flip chip is 300 μm or less, (c3) a structure wherein an area of a semiconductor chip is 80 mm$^2$ or more, (d3) a structure wherein a thickness of a package, in which the semiconductor chip is disposed on a mounting substrate, is 1.0 mm or less, (e3) a structure wherein the number of the bumps in the flip chip is 200 or more, and (g3) a structure wherein the encapsulating-material molded area based on a package-molding method is 7000 mm$^2$ or more.

The above has described the semiconductor device by way of the preferred embodiments. Particularly preferred are semiconductor devices having the following combinations out of the structures (a) to (g).

From the viewpoint of filling ability, preferred are semiconductor devices having at least one of the structures (a) and (b). More specifically, preferred are a semiconductor device having the structures (a1) and (b1), a semiconductor device having the structures (a1) and (d1), a semiconductor device having the structures (a1) and (c1), a semiconductor device having the structures (b) and (d), and a semiconductor device having the structures (b1) and (c1). Furthermore, preferred are a semiconductor device having the structures (a2) and (b2), a semiconductor device having the structures (a2) and (d2), a semiconductor device having the structures (a2) and (c2), a semiconductor device having the structures (b2) and (d2), and a semiconductor device having the structures (b2) and (c2). Furthermore, preferred are a semiconductor device having the structures (a3) and (b3), a semiconductor device having the structures (a3) and (d3), a semiconductor device having the structures (a3) and (c3), a semiconductor device having the structures (b3) and (d3), and a semiconductor device having the structures (b3) and (c3).

A semiconductor device having at least one of the structures (c), (d), and (g) is preferred from the viewpoint of the warp thereof. More specifically, preferred are a semiconductor having the structures (c1) and (g1), a semiconductor having the structures (c1) and (d1), and a semiconductor having the structures (d1) and (g1). Furthermore, preferred are a semiconductor having the structures (c2) and (g2), a semiconductor having the structures (c2) and (d2), and a semiconductor having the structures (d2) and (g2). Furthermore, preferred are a semiconductor having the structures (c3) and (g3), a semiconductor having the structures (c3) and (d3), and a semiconductor having the structures (d3) and (g3)

EXAMPLES

The following will describe working examples of the present invention. However, the scope of the invention is not limited to these examples. Each encapsulating epoxy resin molding material and each semiconductor device were evaluated on the basis of evaluating methods which will be described later unless otherwise specified.

Examples A

Example A1 to A7, and Comparative Example A1 to A6

Respective materials are pre-mixed (dry blended) in each blend composition shown in Tables 1 to 3, and then the resultant is kneaded with a biaxial roll having a roll surface temperature of about 80° C. for 10 minutes. Next, the kneaded product is cooled and pulverized to produce each of encapsulating epoxy resin molding materials A1 to A13 of Examples A1 to A7 and Comparative Examples A1 to A6. Each of the compositions in the tables is represented in unit of a part or parts by weight.

(A) Epoxy Resin

The following were used: a biphenyl epoxy resin of EPIKOTE YH-4000H (trade name) manufactured by Japan Epoxy Resins Co., Ltd. (epoxy equivalent: 196, melting point: 106° C.), and a brominated epoxy resin of ESB-400 (trade name) manufactured by Sumitomo Chemical Co., Ltd. (an epi-bis epoxy resin having an epoxy equivalent of 400 and a bromine content of 49%, diglycidyl-etherized-product of 2,2'-bis(4-hydroxy-3,5-dibromophenyl)propane, modified with epichlorohydrin).

(B) Curing Agent

As curing agents (B), the following were used: a phenol/benzaldehyde/xylylenedimethoxide polycondensed product represented by the following structural formula (XXII) and having a hydroxyl equivalent of 156 and a softening point of 73° C. (trade name: HE510-05, manufactured by Sumikin Chemical Co.); and a phenol/hydroxybenzaldehyde resin represented by the following structural formula (XXIII) and having a hydroxyl equivalent of 100 and a softening point of 83° C. (trade name: MEH-7500-3S, manufactured by Meiwa Plastic Industries, Ltd.):

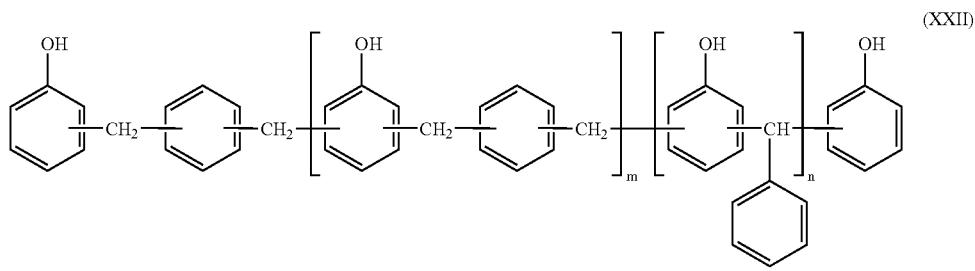

(XXII)

wherein n represents an integer of 0 to 8,

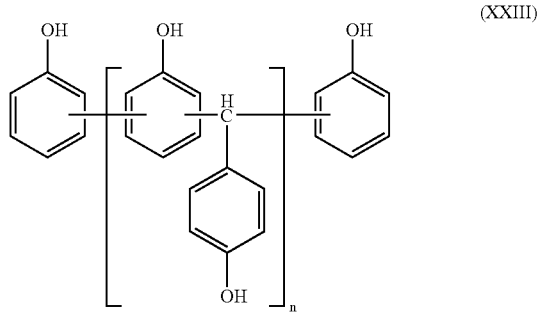

(XXIII)

wherein n represents an integer of 0 to 8.

Thirteen kinds of the produced molding materials were each molded using a transfer molding machine under the following conditions: a mold temperature of 180° C., a molding pressure of 6.9 MPa, and a curing time of 90 seconds. The resultants were each evaluated through spiral flow and gel time tests.

[Production of semiconductor devices A1 (flip chip BGAs)]

Next, the encapsulating epoxy resin molding materials A1 to A13 were used to produce semiconductor devices of Examples A1 to A7 and Comparative Examples A1 to A6. Encapsulation with each of the encapsulating epoxy resin molding materials was performed by using a transfer molding machine to mold the material under conditions of a molding temperature of 180° C., a molding pressure of 6.9 MPa and a curing time of 90 seconds and then curing the molded material at 180° C. for 5 hours.

Examples A1 to A7 (Table 2)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 22 mm×width 14 mm×thickness 0.3 mm. The substrate was dried at 120° C. for 2 hours, and then a semiconductor element of length 9 mm×width 8 mm×thickness 0.4 mm (area: 72 mm$^2$), to which 160 bumps having a bump diameter of 145 μm and a bump pitch of 200 μm were fitted, was mounted on the substrate by IR reflow treatment at 260° C. for 10 seconds.

The bump height after the mounting was 100 μm. Next, the encapsulating epoxy resin molding materials A1 to A7 were each used and molded into a size of length 22 mm×width 14 mm×thickness 0.7 mm on the semiconductor element mounted surface by vacuum transfer molding under the above-mentioned conditions. In this way, flip chip BGA devices of Examples A1 to A7 were each produced.

Comparative Examples A1 to A6 (Table 3)

Semiconductor devices of Comparative Examples A1 to A6 were produced in the same way as in Examples A1 to A7 except that the encapsulating epoxy resin molding materials A8 to A13 were used.

[Production of Semiconductor Devices A2 (Flip Chip BGAs)]

Next, the encapsulating epoxy resin molding materials A1 to A13 were used to produce semiconductor devices of Examples A1 to A7 and Comparative Examples A1 to A6. Encapsulation with each of the encapsulating epoxy resin molding materials was performed by using a transfer molding machine to mold the material under conditions of a molding temperature of 180° C., a molding pressure of 6.9 MPa and a curing time of 90 seconds and then curing the molded material at 180° C. for 5 hours.

Examples A1 to A7 (Table 2)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 22 mm×width 14 mm×thickness 0.3 mm. The substrate was dried at 120° C. for 2 hours, and then a semiconductor element of length 6 mm×width 5 mm×thickness 0.4 mm (area: 30 mm$^2$), to which 120 bumps having a bump diameter of 300

μm and a bump pitch of 490 μm were fitted, was mounted on the substrate by IR reflow treatment at 260° C. for 10 seconds. The bump height after the mounting was 260 μm. Next, the encapsulating epoxy resin molding materials A1 to A7 were each used and molded into a size of length 22 mm×width 14 mm×thickness 1.2 mm on the semiconductor element mounted surface by vacuum transfer molding under the above-mentioned conditions. In this way, flip chip BGA devices of Examples A1 to A7 were each produced.

Comparative Examples A1 to A6 (Table 3)

Semiconductor devices of Comparative Examples A1 to A6 were produced in the same way as in Examples A1 to A7 except that the encapsulating epoxy resin molding materials A8 to A13 were used.

[Production of Semiconductor Devices A3 (Flip Chip BGAs)]

Next, the encapsulating epoxy resin molding materials A1 to A13 were used to produce semiconductor devices of Examples A1 to A7 and Comparative Examples A1 to A6. Encapsulation with each of the encapsulating epoxy resin molding materials was performed by using a transfer molding machine to mold the material under conditions of a molding temperature of 180° C., a molding pressure of 6.9 MPa and a curing time of 90 seconds and then curing the molded material at 180° C. for 5 hours.

Examples A1 to A7 (Table 2)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 22 mm×width 14 mm×thickness 0.3 mm. The substrate was dried at 120° C. for 2 hours, and then a semiconductor element of length 5 mm×width 4 mm×thickness 0.4 mm (area: 20 mm$^2$), to which 40 bumps having a bump diameter of 390 μm and a bump pitch of 700 μm were fitted, was mounted on the substrate by IR reflow treatment at 260° C. for 10 seconds. The bump height after the mounting was 350 μm. Next, the encapsulating epoxy resin molding materials A1 to A7 were each used and molded into a size of length 22 mm×width 14 mm×thickness 2.5 mm on the semiconductor element mounted surface by vacuum transfer molding under the above-mentioned conditions. In this way, flip chip BGA devices of Examples 1 to 7 were each produced.

Comparative Examples A1 to A6 (Table 3)

Semiconductor devices of Comparative Examples A1 to A6 were produced in the same way as in Examples A1 to A7 except that the encapsulating epoxy resin molding materials A8 to A13 were used.

The produced semiconductor devices of Examples A1 to A7 and Comparative Examples A1 to A6 were evaluated through the following tests. The evaluation results are shown in Tables 2 and 3.

TABLE 1

| Items | | | Filler A | Filler B | Filler C | Filler D | Filler E | Filler F | Filler G |
|---|---|---|---|---|---|---|---|---|---|
| Particle size | | ~1 μm | 11 | 11 | 27 | 27 | 10 | 10 | 11 |
| distribution | | ~2 μm | 20 | 20 | 38 | 42 | 20 | 21 | 25 |
| (cumulative weight | | ~4 μm | 30 | 30 | 45 | 54 | 29 | 31 | 41 |
| percentage) | | ~6 μm | 37 | 36 | 50 | 63 | 34 | 37 | 52 |
| | | ~12 μm | 50 | 53 | 73 | 86 | 45 | 48 | 82 |
| | | ~24 μm | 71 | 75 | 87 | 96 | 61 | 68 | 100 |
| | | ~32 μm | 81 | 83 | 93 | 100 | 72 | 80 | 100 |
| | | ~48 μm | 95 | 96 | 98 | 100 | 86 | 94 | 100 |
| | | ~64 μm | 100 | 100 | 100 | 100 | 92 | 97 | 100 |
| | | ~96 μm | 100 | 100 | 100 | 100 | 98 | 100 | 100 |
| Average particle size | | μm | 12 | 11 | 6 | 3 | 18 | 15 | 6 |
| Specific surface area | | m$^2$/g | 3.5 | 3.3 | 4.0 | 3.5 | 3.5 | 3.8 | 2.7 |
| Maximum particle | | μm | 63 | 53 | 53 | 30 | 105 | 75 | 30 |
| Amount of the filler of 20 μm or more in size | | wt. % | 33 | 30 | 15 | 5 | 43 | 37 | 4 |

TABLE 2

| Items | | Example 1 | Example 2 | Example 3 | Example 4 | Example 5 | Example 6 | Example 7 |
|---|---|---|---|---|---|---|---|---|
| encapsulating epoxy resin molding materials A | | 1 | 2 | 3 | 4 | 5 | 6 | 7 |
| Epoxy resin | YX-4000H | 85 | 85 | 85 | 85 | 85 | 85 | 85 |
| | *1 | 15 | 15 | 15 | 15 | 15 | 15 | 15 |
| Curing agent | Structural formula (XXII) | 75 | 75 | 75 | 75 | — | — | — |
| | Structural formula (XXIII) | — | — | — | — | 50 | 50 | 50 |
| Curing accelerator | *2 | 3.5 | 3.5 | 3.5 | 3.5 | 2.5 | 2.5 | 2.5 |
| Coupling agent | *3 | 5 | 5 | 5 | 5 | 5 | 5 | 5 |
| Antimony trioxide | Sb$_2$O$_3$ | 5 | 5 | 5 | 5 | 5 | 5 | 5 |
| Releasing agent | Carnauba wax | 2 | 2 | 2 | 2 | 2 | 2 | 2 |

TABLE 2-continued

| Items | | Example 1 | Example 2 | Example 3 | Example 4 | Example 5 | Example 6 | Example 7 |
|---|---|---|---|---|---|---|---|---|
| Coloring agent | Carbon black | 3 | 3 | 3 | 3 | 3 | 3 | 3 |
| Filler | A | 1850 | — | — | — | — | — | — |
|  | B | — | 1850 | — | — | 1320 | — | — |
|  | C | — | — | 1850 | — | — | 1320 | — |
|  | D | — | — | — | 1400 | — | — | 1179 |
|  | E | — | — | — | — | — | — | — |
|  | F | — | — | — | — | — | — | — |
|  | G | — | — | — | — | — | — | — |
| Spiral flow | cm | 105 | 115 | 95 | 100 | 160 | 145 | 130 |
| Gel time | sec | 38 | 43 | 42 | 45 | 50 | 50 | 52 |
| Burr | — | Good | Good | Good | Good | Good | Good | Good |
| Amount of generated voids | Semiconductor device 1 | 0/20 | 0/20 | 0/20 | 0/20 | 0/20 | 0/20 | 0/20 |
|  | Semiconductor device 2 | 0/20 | 0/20 | 0/20 | 0/20 | 0/20 | 0/20 | 0/20 |
|  | Semiconductor device 3 | 0/20 | 0/20 | 0/20 | 0/20 | 0/20 | 0/20 | 0/20 |

*1: An etherized product of 2,2'-bis(4-hydroxy-3,5-dibromophenyl)propane with epichlorohydrin
*2: Adduct of triphenylphosphine and benzoquinone
*3: γ-Glycidoxypropyltrimethoxysilane

TABLE 3

| Items | | Comparative Example 1 | Comparative Example 2 | Comparative Example 3 | Comparative Example 4 | Comparative Example 5 | Comparative Example 6 |
|---|---|---|---|---|---|---|---|
| Encapsulating epoxy resin moulding material A | | 8 | 9 | 10 | 11 | 12 | 13 |
| Epoxy resin | YX-4000H | 85 | 85 | 85 | 85 | 85 | 85 |
|  | *1 | 15 | 15 | 15 | 15 | 15 | 15 |
| Curing agent | Structural formula (XXII) | 75 | 75 | 75 | — | — | — |
|  | Structural formula (XXIII) | — | — | — | 50 | 50 | 50 |
| Curing accelerator | *2 | 3.5 | 3.5 | 3.5 | 2.5 | 2.5 | 2.5 |
| Coupling agent | *3 | 5 | 5 | 5 | 5 | 5 | 5 |
| Antimony trioxide | $Sb_2O_3$ | 5 | 5 | 5 | 5 | 5 | 5 |
| Releasing agent | Carnauba wax | 2 | 2 | 2 | 2 | 2 | 2 |
| Coloring agent | Carbon black | 3 | 3 | 3 | 3 | 3 | 3 |
| Filler | A | — | — | — | — | — | — |
|  | B | — | — | — | — | — | — |
|  | C | — | — | — | — | — | — |
|  | D | 1850 | — | — | 1320 | — | — |
|  | E | — | — | — | — | — | — |
|  | F | — | 1850 | — | — | 1320 | — |
|  | G | — | — | 1400 | — | — | 1179 |
| Spiral flow | cm | 95 | 100 | 75 | 150 | 160 | 105 |
| Gel time | sec | 37 | 38 | 42 | 49 | 50 | 50 |
| Burr | — | Good | Good | NG | Good | Good | NG |
| Amount of generated voids | Semiconductor device 1 | 20/20 | 10/20 | 15/20 | 20/20 | 8/20 | 11/20 |
|  | Semiconductor device 2 | 15/20 | 0/20 | 0/20 | 13/20 | 0/20 | 0/20 |
|  | Semiconductor device 3 | 0/20 | 0/20 | 0/20 | 0/20 | 0/20 | 0/20 |

*1: An etherized product of 2,2'-bis(4-hydroxy-3,5-dibromophenyl)propane with epichlorohydrin
*2: Adduct of triphenylphosphine and benzoquinone
*3: γ-Glycidoxypropyltrimethoxysilane

[Evaluating Methods]

(1) Spiral Flow (Index of Fluidity)

A spiral flow measuring mold according to EMMI-1-66 was used to mold a material and then the flowing distance thereof was obtained.

(2) Gel Time

A curelastometer manufactured by JSR was used to measure the time (sec.) up to a rise of the torque curve of 3 g of a sample at a temperature of 180° C.

(3) Amount of Generated Voids

An ultrasonic inquiry video system (HYE-HOCUS model, manufactured by Hitachi Construction Machinery Co., Ltd.) was used to observe the inside of semiconductor devices, thereby observing whether voids having a diameter of 0.1 mm or more were generated or not. An evaluation was made on the basis of the ratio of the number of semiconductor devices wherein the voids were generated to the number of the semiconductor devices tested.

(4) Burr

A mold having a slit of 10 μm thickness was used to mold a material from a pot. The length of a burr which flowed in the slit was measured with a vernier micrometer. If the length of the burr in the slit was less than 10 μm, the material was judged good. If the length was 10 μm or more, the material was judged no good.

The encapsulating epoxy resin molding material of the present invention for flip chip packaging has a high filling ability required for an under filler and gives only a small amount of molding defects such as voids. Thus, the industrial value thereof is large.

Examples B

[Production of Encapsulating Epoxy Resin Molding Materials]

Components described below were blended so that the amount of each of the components would be a part or parts by weight shown in Table 4 or 5, and then the resultant was roll-kneaded at a kneading temperature of 80° C. for a kneading time of 10 minutes. In this way, encapsulating epoxy resin molding materials B1 to B19 were produced.

(Epoxy Resins)

As epoxy resins, the following were used: a biphenyl epoxy resin having an epoxy equivalent of 196 and a melting point of 106° C. (trade name: EPIKOTE YX-4000.H, manufactured by Japan Epoxy Resins Co., Ltd.); a bisphenol F epoxy resin having an epoxy equivalent of 186 and a melting point of 75° C. (trade name: YSLV-80XY, manufactured by Nippon Steel Chemical Co., Ltd.); a stylbene epoxy resin having an epoxy equivalent of 210 and a melting point of 120° C. (trade name: ESLV-210, manufactured by Sumitomo Chemical Co., Ltd.); a sulfur-containing epoxy resin having an epoxy equivalent of 245 and a melting point of 110° C. (trade name: YSLV-120TE, manufactured by Nippon Steel Chemical Co., Ltd.); a triphenolmethane epoxy resin 1 having an epoxy equivalent of 170, a softening point of 60° C., and a melt viscosity of 2.4 poises at 150° C. (trade name: EPIKOTE E1032H, manufactured by Japan Epoxy Resins Co., Ltd.); a triphenolmethane epoxy resin 2 having an epoxy equivalent of 170, a softening point of 70° C., and a melt viscosity of 3.1 poises at 150° C. (trade name: EPIKOTE E1032H, manufactured by Japan Epoxy Resins Co., Ltd.); and an o-cresol Novolak epoxy resin having an epoxy equivalent of 195 and a melting point of 65° C. (trade name: ESCN-190, manufactured by Sumitomo Chemical Co., Ltd.).

(Curing Agents)

As curing agents, the following were used: a phenol/aralkyl resin having a softening point of 70° C. and a hydroxyl equivalent of 175 (tradename: Milex (transliteration) XL-225, manufactured by Mitsui Chemicals, Inc.); a biphenyl phenol resin having a softening point of 80° C. and a hydroxyl equivalent of 199 (trade name: MEH-7851, manufactured by Meiwa Plastic Industries, Ltd.); a triphenolmethane phenol resin 1 having a softening point of 83° C., a hydroxyl equivalent of 103, and a melt viscosity of 1.3 poises at 150° C. (trade name: MEH-7500-3S, manufactured by Meiwa Plastic Industries, Ltd.); a triphenolmethane phenol resin 2 having a softening point of 101° C., a hydroxyl equivalent of 101, and a melt viscosity of 3.0 poises at 150° C. (trade name: MEH-7500-SS, manufactured by Meiwa Plastic Industries, Ltd.) and a phenol Novolak resin having a softening point of 80° C. and a hydroxyl equivalent of 106 (trade name: H-1, manufactured by Meiwa Plastic Industries, Ltd.).

(Curing Accelerator)

As an accelerator, an adduct of triphenylphosphine and p-benzoquinone (curing accelerator) was used. As coupling agents, the following were used: a silane coupling agent containing a secondary amino group (γ-anilinopropyltrimethoxysilane (anilinosilane)), and γ-glycidoxypropyltrimethoxysilane (epoxysilane).

(Flame Retardants)

As flame retardants, the following were used: an aromatic condensed phosphate (trade name: PX-200, manufactured by Daihachi Chemical Industry Co., Ltd.); triphenylphosphine oxide, a composite metal hydroxide, Echomag Z-10 manufactured by Tateho Chemical Industries Co., Ltd.), antimony trioxide; and a bisphenol A brominated epoxy resin having an epoxy equivalent of 375, a softening point of 80° C. and a bromine content of 48% by weight (trade name: ESB-400T, manufactured by Sumitomo Chemical Co., Ltd.).

(Inorganic Fillers)

As inorganic fillers, the following were used: a spherical fused silica 1 having an average of 6.7 μm and a specific surface area of 3.0 m$^2$/g; a spherical fused silica 2 having an average of 8.8 μm and a specific surface area of 4.6 m$^2$/g; a spherical fused silica 3 having an average of 12.5 μm and a specific surface area of 3.2 m$^2$/g; a spherical fused silica 4 having an average of 6.0 μm and a specific surface area of 2.7 m$^2$/g; a spherical fused silica 5 having an average of 17 μm and a specific surface area of 3.8 m$^2$/g; and a spherical fused silica 6 having an average of 0.8 μm and a specific surface area of 6.3 m$^2$/g.

(Other Additives)

As other additives, carnauba wax (manufactured by Clariant Co.) and carbon black (trade name: MA-100, manufactured by Mitsubishi Chemical Corp.) were used.

TABLE 4

(Formulation compositions 1 of encapsulating epoxy resin molding material)

Encapsulating epoxy resin molding materials B for Examples

| Blended components | 1 | 2 | 3 | 4 | 5 | 6 | 7 | 8 | 9 | 10 |
|---|---|---|---|---|---|---|---|---|---|---|
| Biphenyl epoxy resin | — | — | — | — | — | — | — | — | — | 85 |
| Bisphenol F epoxy resin | 10 | 10 | 10 | 10 | 10 | 10 | 10 | 10 | 10 | — |
| Stylbene epoxy resin | — | — | — | — | — | — | — | — | — | — |
| Sulfur-containing epoxy resin | — | — | — | — | — | — | — | — | — | — |
| Triphenolmethane epoxy resin 1 | 75 | 75 | 75 | 75 | 75 | 75 | — | 75 | 75 | — |
| Triphenolmethane epoxy resin 2 | — | — | — | — | — | — | 75 | — | — | — |
| o-Cresol Novolak epoxy resin | — | — | — | — | — | — | — | — | — | — |
| Brominated epoxy resin | 15 | 15 | 15 | 15 | 15 | 15 | 15 | 15 | 15 | 15 |
| Phenol/aralkyl resin | — | — | — | — | — | — | — | — | — | — |
| Biphenyl phenol resin | — | — | — | — | — | — | — | — | — | — |
| Triphenolmethane phenol resin | 55 | 55 | 55 | 55 | 55 | 55 | 55 | — | 55 | 49 |
| Triphenolmethane phenol resin 2 | — | — | — | — | — | — | — | 55 | — | — |
| Phenol Novolak resin | — | — | — | — | — | — | — | — | — | — |
| Curing accelerator | 2.0 | 2.0 | 2.0 | 2.0 | 2.0 | 2.0 | 2.0 | 2.0 | 2.0 | 3.0 |
| Aromatic condensed phosphate | — | — | — | — | — | — | — | — | — | — |
| Triphenylphosphine oxide | — | — | — | — | — | — | — | — | — | — |
| Composite metal hydroxide | — | — | — | — | — | — | — | — | — | — |
| Antimony trioxide | 15 | 15 | 15 | 15 | 15 | 15 | 15 | 15 | 15 | 15 |
| Anilinosilane | 4.5 | 4.5 | 4.5 | 4.5 | 4.5 | 4.5 | 4.5 | 4.5 | — | 4.5 |
| Epoxysilane | — | — | — | — | — | — | — | — | 4.5 | — |
| Spherical fused silica 1 | 868 | — | — | — | — | — | — | — | — | — |
| Spherical fused silica 2 | — | 868 | — | — | — | — | 868 | 868 | 868 | 933 |
| Spherical fused silica 3 | — | — | 868 | — | — | — | — | — | — | — |
| Spherical fused silica 4 | — | — | — | 868 | — | — | — | — | — | — |
| Spherical fused silica 5 | — | — | — | — | 868 | — | — | — | — | — |
| Spherical fused silica 6 | — | — | — | — | — | 868 | — | — | — | — |
| Carnauba wax | 2.0 | 2.0 | 2.0 | 2.0 | 2.0 | 2.0 | 2.0 | 2.0 | 2.0 | 2.0 |
| Carbon black | 3.0 | 3.0 | 3.0 | 3.0 | 3.0 | 3.0 | 3.0 | 3.0 | 3.0 | 3.0 |
| Inorganic filler amount (% by weight) | 83 | 83 | 83 | 83 | 83 | 83 | 83 | 83 | 83 | 84 |

TABLE 5

(Formulation compositions 2 of encapsulating epoxy resin molding material)

Encapsulating epoxy resin molding materials B for Examples

| Blended components | 11 | 12 | 13 | 14 | 15 | 16 | 17 | 18 | 19 |
|---|---|---|---|---|---|---|---|---|---|
| Biphenyl epoxy resin | — | — | — | 85 | — | — | — | — | — |
| Bisphenol F epoxy resin | 85 | — | — | — | — | 100 | 10 | 10 | 10 |
| Stylbene epoxy resin | — | 85 | — | — | — | — | — | — | — |
| Sulfur-containing epoxy resin | — | — | 85 | — | — | — | — | — | — |
| Triphenolmethane epoxy resin 1 | — | — | — | — | — | — | 90 | 90 | 90 |
| Triphenolmethane epoxy resin 2 | — | — | — | — | — | — | — | — | — |
| o-Cresol Novolak epoxy resin | — | — | — | — | 85 | — | — | — | — |
| Brominated epoxy resin | 15 | 15 | 15 | 15 | 15 | — | — | — | — |
| Phenol/aralkyl resin | — | — | — | 83 | — | — | — | — | — |
| Biphenyl phenol resin | — | — | — | — | — | 107 | — | — | — |
| Triphenolmethane phenol resin | 51 | 46 | 40 | — | — | — | 60 | 60 | 60 |
| Triphenolmethane phenol resin 2 | — | — | — | — | — | — | — | — | — |
| Phenol Novolak resin | — | — | — | — | 50 | — | — | — | — |
| Curing accelerator | 3.5 | 3.5 | 3.5 | 3.5 | 2.0 | 3.5 | 3.0 | 3.0 | 3.0 |
| Aromatic condensed phosphate | — | — | — | — | — | — | 35 | — | — |
| Triphenylphosphine oxide | — | — | — | — | — | — | — | 35 | — |
| Composite metal hydroxide | — | — | — | — | — | — | — | — | 150 |
| Antimony trioxide | 15 | 15 | 15 | 15 | 15 | 15 | 15 | 15 | 15 |
| Anilinosilane | 4.5 | 4.5 | 4.5 | 4.5 | 4.5 | 4.5 | 4.5 | 4.5 | 4.5 |
| Epoxysilane | — | — | — | — | — | — | — | — | — |
| Spherical fused silica 1 | — | — | — | — | — | — | — | — | — |
| Spherical fused silica 2 | 951 | 922 | 890 | 1121 | 613 | 1756 | 1076 | 1076 | 757 |
| Spherical fused silica 3 | — | — | — | — | — | — | — | — | — |
| Spherical fused silica 4 | — | — | — | — | — | — | — | — | — |
| Spherical fused silica 5 | — | — | — | — | — | — | — | — | — |
| Spherical fused silica 6 | — | — | — | — | — | — | — | — | — |
| Carnauba wax | 2.0 | 2.0 | 2.0 | 2.0 | 2.0 | 2.0 | 2.0 | 2.0 | 2.0 |
| Carbon black | 3.5 | 3.5 | 3.5 | 3.5 | 3.5 | 3.5 | 3.0 | 3.0 | 3.0 |
| Inorganic filler amount (% by weight) | 84 | 84 | 84 | 84 | 78 | 88 | 83 | 83 | 83 |

Properties of the produced encapsulating epoxy resin molding materials B1 to B19 were evaluated about test item shown in tables 3 and 4 (spiral flow, disc flow, hardness at hot time, and flame resistance). The results are shown in Tables 6 and 7.

TABLE 6

(Encapsulating epoxy resin molding material properties 1)

| Properties | Encapsulating epoxy resin molding materials B for Examples |  |  |  |  |  |  |  |  |  |
|---|---|---|---|---|---|---|---|---|---|---|
|  | 1 | 2 | 3 | 4 | 5 | 6 | 7 | 8 | 9 | 10 |
| Spiral flow (cm) | 171 | 175 | 174 | 100 | 175 | 68 | 113 | 107 | 166 | 232 |
| Disc flow | 121 | 130 | 127 | 76 | 127 | 56 | 88 | 81 | 102 | 125 |
| Hardness at hot time (Shore D) | 77 | 77 | 78 | 77 | 78 | 76 | 82 | 83 | 76 | 82 |
| UL-94 test | V-0 | V-0 | V-0 | V-0 | V-0 | V-0 | V-0 | V-0 | V-0 | V-0 |

TABLE 7

(Encapsulating epoxy resin molding material properties 2)

| Properties | Encapsulating epoxy resin molding materials B for Examples |  |  |  |  |  |  |  |  |
|---|---|---|---|---|---|---|---|---|---|
|  | 11 | 12 | 13 | 14 | 15 | 16 | 17 | 18 | 19 |
| Spiral flow (cm) | 237 | 229 | 225 | 206 | 145 | 118 | 180 | 178 | 117 |
| Disc flow | 127 | 115 | 113 | 110 | 100 | 95 | 133 | 132 | 92 |
| Hardness at hot time (Shore D) | 80 | 83 | 79 | 73 | 83 | 75 | 70 | 71 | 78 |
| UL-94 test | V-0 | V-0 | V-0 | V-0 | V-0 | V-0 | V-0 | V-0 | V-0 |

[Production of Semiconductor Devices B1 (Flip Chip BGAs)]

Next, the encapsulating epoxy resin molding materials B1 to B19 were used to produce semiconductor devices of Examples B1 to B16 and Comparative Examples B1 to B3. Encapsulation with each of the encapsulating epoxy resin molding materials was performed by using a transfer molding machine to mold the material under conditions of a mold temperature of 165° C., a molding pressure of 9.8 MPa, a vacuum degree of 530 Pa, and a curing time of 90 seconds and then curing the molded material at 165° C. for 5 hours.

Examples B1 to B16 (Tables 8 and 9)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 40 mm×width 40 mm×thickness 1.3 mm. The substrate was dried at 120° C. for 2 hours, and then a semiconductor element of length 9 mm×width 8 mm×thickness 0.4 mm (area: 72 mm²), which had a bump diameter of 145 μm and a bump pitch of 200 μm, was mounted on the substrate by IR reflow treatment at 260° C. for 10 seconds. The bump height after the mounting was 100 μm. Next, the encapsulating epoxy resin molding materials B1 to B3 and B7 to B19 were each used and molded into a size of length 12 mm×width 12 mm×thickness 0.7 mm on the semiconductor element mounted surface by vacuum transfer molding under the above-mentioned conditions. In this way, flip chip BGA devices of Examples B1 to B16 were each produced.

Comparative Examples B1 to B3 (Table 12)

Semiconductor devices of Comparative Examples B1 to B3 were produced in the same way as in Examples B1 to B16 except that the encapsulating epoxy resin molding materials B4 to B6 were used.

[Production of Semiconductor Devices B2 (Flip Chip BGAs)]

Next, the encapsulating epoxy resin molding materials B1 to B19 were used to produce semiconductor devices of Examples B17 to B32 and Comparative Examples B4 to B6. Encapsulation with each of the encapsulating epoxy resin molding materials was performed by using a transfer molding machine to mold the material under conditions of a mold temperature of 165° C., a molding pressure of 9.8 MPa, a vacuum degree of 530 Pa, and a curing time of 90 seconds and then curing the molded material at 180° C. for 5 hours.

Examples B17 to B32 (Tables 10 and 11)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 40 mm×width 40 mm×thickness 1.3 mm. The substrate was dried at 120° C. for 2 hours, and then a semiconductor element of length 6 mm×width 5 mm×thickness 0.4 mm (area: 30 mm$^2$) which had a bump diameter of 175 µm and a bump pitch of 400 µm, was mounted on the substrate by IR reflow treatment at 260° C. for 10 seconds. The bump height after the mounting was 120 µm. Next, the encapsulating epoxy resin molding materials B1 to B3 and B7 to B19 were each used and molded into a size of length 12 mm×width 12 mm×thickness 1.2 mm on the semiconductor element mounted surface by vacuum transfer molding under the above-mentioned conditions. In this way, flip chip BGA devices of Examples B17 to B32 were each produced.

Comparative Examples B4 to B6 (Table 13)

Semiconductor devices of Comparative Examples B4 to B6 were produced in the same way as in Examples B17 to B32 except that the encapsulating epoxy resin molding materials B4 to B6 were used.

Comparative Examples 7 to 25 (Tables 14 and 15)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 40 mm×width 40 mm×thickness 1.3 mm. The substrate was dried at 120° C. for 2 hours, and then a semiconductor element of length 5 mm×width 4 mm×thickness 0.4 mm (area: 20 mm$^2$), which had a bump diameter of 250 µm and a bump pitch of 700 µm, was mounted on the substrate by IR reflow treatment at 260° C. for 10 seconds. The bump height after the mounting was 180 µm. Next, the encapsulating epoxy resin molding materials B1 to B19 were each used and molded into a size of length 12 mm×width 12 mm×thickness 2.5 mm on the semiconductor element mounted surface by vacuum transfer molding under the above-mentioned conditions. In this way, flip chip BGA devices of Comparative Examples B7 to B25 were each produced.

The amounts of voids generated in the produced semiconductor devices of Examples B1 to B32 and Comparative Examples B1 to B25 were tested and evaluated. The evaluation results are shown in Tables 8 to 15.

TABLE 8

Evaluation results 1 of semiconductor devices (semiconductor devices B1)

| Properties | Examples B | | | | | | | | |
|---|---|---|---|---|---|---|---|---|---|
| | 1 | 2 | 3 | 4 | 5 | 6 | 7 | 8 | 9 |
| Encapsulating epoxy resin molding material B | 1 | 2 | 3 | 7 | 8 | 9 | 10 | 11 | 12 |
| Amount of generated voids | 2/20 | 0/20 | 2/20 | 3/20 | 4/20 | 3/20 | 0/20 | 0/20 | 1/20 |

[Production of Semiconductor Devices B3 (Flip Chip BGAs)]

Next, the encapsulating epoxy resin molding materials B1 to B19 were used to produce semiconductor devices of Comparative Examples B7 to B25. Encapsulation with each of the encapsulating epoxy resin molding materials was performed by using a transfer molding machine to mold the material under conditions of a mold temperature of 165° C., a molding pressure of 9.8 MPa, a vacuum degree of 530 Pa, and a curing time of 90 seconds and then curing the molded material at 180° C. for 5 hours.

TABLE 9

Evaluation results 2 of semiconductor devices (semiconductor devices B1)

| Properties | Examples B | | | | | | |
|---|---|---|---|---|---|---|---|
| | 10 | 11 | 12 | 13 | 14 | 15 | 16 |
| Encapsulating epoxy resin molding material B | 13 | 14 | 15 | 16 | 17 | 18 | 19 |
| Amount of generated voids | 0/20 | 0/20 | 2/20 | 2/20 | 0/20 | 0/20 | 3/20 |

TABLE 10

Evaluation results 3 of semiconductor devices (semiconductor devices B2)

| Properties | Examples B | | | | | | | | |
|---|---|---|---|---|---|---|---|---|---|
| | 17 | 18 | 19 | 20 | 21 | 22 | 23 | 24 | 25 |
| Encapsulating epoxy resin molding material B | 1 | 2 | 3 | 7 | 8 | 9 | 10 | 11 | 12 |
| Amount of generated voids | 1/20 | 0/20 | 1/20 | 3/20 | 3/20 | 2/20 | 0/20 | 0/20 | 0/20 |

TABLE 11

Evaluation results 4 of semiconductor devices (semiconductor devices B2)

| Properties | Examples B | | | | | | |
|---|---|---|---|---|---|---|---|
| | 26 | 27 | 28 | 29 | 30 | 31 | 32 |
| Encapsulating epoxy resin molding material B | 13 | 14 | 15 | 16 | 17 | 18 | 19 |
| Amount of generated voids | 0/20 | 0/20 | 1/20 | 1/20 | 0/20 | 0/20 | 2/20 |

TABLE 12

Evaluation results 5 of semiconductor devices (semiconductor devices B1)

| Properties | Comparative Examples B | | |
|---|---|---|---|
| | 1 | 2 | 3 |
| Encapsulating epoxy resin molding material B | 4 | 5 | 6 |
| Amount of generated voids | 11/20 | unfilled | 18/20 |

TABLE 13

Evaluation results 6 of semiconductor devices (semiconductor devices B2)

| Properties | Comparative Examples B | | |
|---|---|---|---|
| | 4 | 5 | 6 |
| Encapsulating epoxy resin molding material B | 4 | 5 | 6 |
| Amount of generated voids | 8/20 | unfilled | 10/20 |

TABLE 14

Evaluation results 7 of semiconductor devices (semiconductor devices B3)

| Properties | Comparative Examples B | | | | | | | | | |
|---|---|---|---|---|---|---|---|---|---|---|
| | 7 | 8 | 9 | 10 | 11 | 12 | 13 | 14 | 15 | 16 |
| Encapsulating epoxy resin molding material B | 1 | 2 | 3 | 4 | 5 | 6 | 7 | 8 | 9 | 10 |
| Amount of generated voids | 0/20 | 0/20 | 0/20 | 2/20 | 3/20 | 2/20 | 0/20 | 0/20 | 0/20 | 0/20 |

TABLE 15

Evaluation results 8 of semiconductor devices (semiconductor devices B3)

| Properties | Comparative Examples B | | | | | | | | |
|---|---|---|---|---|---|---|---|---|---|
| | 17 | 18 | 19 | 20 | 21 | 22 | 23 | 24 | 25 |
| Encapsulating epoxy resin molding material B | 11 | 12 | 13 | 14 | 15 | 16 | 17 | 18 | 19 |
| Amount of generated voids | 0/20 | 0/20 | 0/20 | 0/20 | 0/20 | 0/20 | 0/20 | 0/20 | 0/20 |

[Reliability Evaluation]

Examples B33 to B48 (Tables 16 and 17), and
Comparative Examples B26 to B28 (Table 17)

Next, the encapsulating epoxy resin molding materials B1 to B19 were each used to evaluate various reliabilities thereof (reflow resistance, humidity resistance and high-temperature leaving property). The evaluation results are shown in Tables 16 and 17. For the evaluation, semiconductor devices 2 produced under the same conditions as described above were used.

B19 each containing all of the components (A) to (C), the amount of generated voids was small. Thus, the filling ability was excellent. The semiconductor devices of Examples B33 and B48 had excellent reflow resistance and humidity resistance.

In the semiconductor devices of Comparative Examples B7 to B25, which did not have one or more of the structures (a) to (d) of the invention, the amount of generated voids was small and thus the filling ability was excellent. Between the encapsulating epoxy resin molding materials B1 to B3 and B7

TABLES 16

Reliability 1 (semiconductor devices B2)

| Properties | | 33 | 34 | 35 | 36 | 37 | 38 | 39 | 40 | 41 | 42 |
|---|---|---|---|---|---|---|---|---|---|---|---|
| | | | | | Examples B | | | | | | |
| Encapsulating epoxy resin molding material B | | 1 | 2 | 3 | 7 | 8 | 9 | 10 | 11 | 12 | 13 |
| Reflow resistance | 72 h | 0/5 | 0/5 | 0/5 | 0/5 | 0/5 | 0/5 | 0/5 | 0/5 | 0/5 | 0/5 |
| | 96 h | 0/5 | 0/5 | 0/5 | 1/5 | 1/5 | 0/5 | 0/5 | 0/5 | 0/5 | 0/5 |
| | 168 h | 1/5 | 2/5 | 1/5 | 3/5 | 5/5 | 0/5 | 0/5 | 0/5 | 0/5 | 0/5 |
| | 336 h | 3/5 | 3/5 | 4/5 | 5/5 | 5/5 | 3/5 | 2/5 | 2/5 | 2/5 | 0/5 |
| Humidity resistance | 100 h | 0/10 | 0/10 | 0/10 | 0/10 | 0/10 | 0/10 | 0/10 | 0/10 | 0/10 | 0/10 |
| | 300 h | 0/10 | 0/10 | 0/10 | 0/10 | 0/10 | 0/10 | 0/10 | 0/10 | 0/10 | 0/10 |
| | 500 h | 0/10 | 0/10 | 0/10 | 0/10 | 0/10 | 0/10 | 0/10 | 0/10 | 0/10 | 0/10 |
| | 1000 h | 0/10 | 0/10 | 0/10 | 0/10 | 0/10 | 0/10 | 0/10 | 0/10 | 0/10 | 0/10 |
| High-temperature leaving property | 100 h | 0/10 | 0/10 | 0/10 | 0/10 | 0/10 | 0/10 | 0/10 | 0/10 | 0/10 | 0/10 |
| | 300 h | 0/10 | 0/10 | 0/10 | 0/10 | 0/10 | 0/10 | 0/10 | 0/10 | 0/10 | 0/10 |
| | 500 h | 2/10 | 2/10 | 3/10 | 1/10 | 2/10 | 8/10 | 5/10 | 6/10 | 3/10 | 5/10 |
| | 1000 h | 10/10 | 10/10 | 10/10 | 7/10 | 7/10 | 10/10 | 10/10 | 10/10 | 8/10 | 10/10 |

TABLES 17

Reliability 2 (semiconductor devices B2)

| Properties | | Examples B | | | | | | Comparative Examples B | | |
|---|---|---|---|---|---|---|---|---|---|---|
| | | 43 | 44 | 45 | 46 | 47 | 48 | 26 | 27 | 28 |
| Encapsulating epoxy resin molding material B | | 14 | 15 | 16 | 17 | 18 | 19 | 4 | 5 | 6 |
| Reflow resistance | 72 h | 0/5 | 3/5 | 0/5 | 0/5 | 0/5 | 0/5 | 0/5 | 5/5 | 0/5 |
| | 96 h | 0/5 | 5/5 | 0/5 | 0/5 | 0/5 | 0/5 | 2/5 | 5/5 | 4/5 |
| | 168 h | 0/5 | 5/5 | 0/5 | 0/5 | 0/5 | 0/5 | 4/5 | 5/5 | 5/5 |
| | 336 h | 0/5 | 5/5 | 0/5 | 1/5 | 2/5 | 5/5 | 5/5 | 5/5 | 5/5 |
| Humidity resistance | 100 h | 0/10 | 0/10 | 0/10 | 0/10 | 0/10 | 0/10 | 3/10 | 10/10 | 5/10 |
| | 300 h | 0/10 | 0/10 | 0/10 | 0/10 | 0/10 | 0/10 | 5/10 | 10/10 | 8/10 |
| | 500 h | 0/10 | 0/10 | 0/10 | 0/10 | 0/10 | 0/10 | 8/10 | 10/10 | 10/10 |
| | 1000 h | 0/10 | 0/10 | 0/10 | 5/10 | 2/10 | 0/10 | 10/10 | 10/10 | 10/10 |
| High-temperature leaving property | 100 h | 0/10 | 0/5 | 0/10 | 0/10 | 0/10 | 0/10 | 0/10 | 0/10 | 0/10 |
| | 300 h | 2/10 | 0/5 | 0/10 | 0/10 | 0/10 | 0/10 | 0/10 | 0/10 | 0/10 |
| | 500 h | 8/10 | 3/5 | 0/10 | 0/10 | 0/10 | 0/10 | 3/10 | 2/10 | 2/10 |
| | 1000 h | 10/10 | 5/5 | 0/10 | 2/10 | 0/10 | 0/10 | 9/10 | 10/10 | 10/10 |

In the semiconductor devices of Comparative Examples B1 to B6, which were encapsulated by the encapsulating epoxy resin molding materials B4 to B6 containing no inorganic filler (C) having an average particle size of 15 μm or less and a specific surface area of 3.0 to 6.0 m²/g, a large amount of voids was generated and unfilled portions were generated. Thus, the filling ability thereof was poor. In the semiconductor devices of Comparative Examples B26 to B28, the reflow resistance and the humidity resistance thereof lowered.

On the other hand, in all of the semiconductor devices of Examples B1 to B32, which were encapsulated by the encapsulating epoxy resin molding materials B1 to B3 and B7 to B19 and the encapsulating epoxy resin molding materials B4 to B6, no significant difference was found out.

Examples B45 to B48 were excellent in high-temperature leaving property, these examples being encapsulated by the encapsulating epoxy resin molding material B16 containing no flame retardant and the encapsulating epoxy resin molding materials B17 and B19, which each contained one of the non-halogen flame retardants.

The encapsulating epoxy resin molding materials for flip chip packaging according to Examples B have a high filling ability required for an under filler and give only a small amount of molding defects such as voids. Moreover, the molding materials are also excellent in reliabilities such as reflow resistance and humidity resistance. Thus, the industrial value thereof is large.

[Evaluating Methods]

(1) Spiral Flow (Index of Fluidity)

A spiral flow measuring mold according to EMMI-1-66 was used to mold an encapsulating epoxy resin molding material by means of a transfer molding machine under conditions of a mold temperature of 180° C., a molding pressure of 6.9 MPa, and a curing time of 90 seconds, and then the flowing distance thereof was obtained.

(2) Disc Flow

A disc flow measuring planar molds having a top part of 200 mm (W)×200 mm (D)×25 mm (H) and a bottom part of 200 mm (W)×200 mm (D)×15 mm (H) was used, and precisely-weighed five grams of a sample (encapsulating epoxy resin molding material) was put onto the center of the bottom part heated to 180° C. After 5 seconds therefrom, the top part heated to 180° C. was tightened thereon, and then the sample was compression-molded at a load of 78 N for a curing time of 90 seconds. The long diameter (mm) and the short diameter (mm) of the molded product were measured with a vernier micrometer. The average value thereof was defined as the disc flow.

(3) Hardness at Hot Time

An encapsulating epoxy resin molding material was molded into a disc having a diameter of 50 mm and a thickness of 3 mm under the above-mentioned conditions. Immediately after the material was molded, the hardness thereof was measured with a Shore D hardness meter.

(4) Flame Resistance

A mold for molding a test piece having a thickness of 1/16 inch was used to mold an encapsulating epoxy resin molding material under the above-mentioned conditions and then cured at 180° C. for 5 hours. The flame resistance thereof was evaluated in accordance with UL-94 testing method.

(5) Amount of Generated Voids

An ultrasonic inquiry video system (HYE-HOCUS model, manufactured by Hitachi Construction Machinery Co., Ltd.) was used to observe the inside of semiconductor devices, thereby observing whether voids having a diameter of 0.1 mm or more were generated or not. An evaluation was made on the basis of the ratio of the number of semiconductor devices wherein voids were generated to the number of the semiconductor devices tested.

(6) Reflow Resistance

Each of the semiconductor devices 3 was humidified at 85° C. and 85% RH and subjected to reflow treatment at 260° C. for 10 seconds at intervals of a given time, and it was observed whether cracks were generated or not. An evaluation was made on the basis of the number of packages wherein cracks were generated out of the number (5) of the packages tested.

(7) Humidity Resistance

Each of the semiconductor devices 3 was subjected to pre-treatment, and then humidified. At intervals of a given time, a snapping defect based on corrosion of the aluminum wiring therein was examined. An evaluation was made on the basis of the number of bad packages out of the number (10) of the packages tested.

In the pre-treatment, each of the flat packages was humidified at 85° C. and 85% RH for 72 hours, and then subjected to vapor phase reflow treatment at 215° C. for 90 seconds. The humidification thereafter was performed at 0.2 MPa and 121° C.

(8) High-Temperature Leaving Property

Each of the semiconductor devices 3 was kept in a thermostat of 200° C. temperature, and was taken out at intervals of a given time. The taken-out semiconductor device was subjected to a continuity test. The high-temperature leaving property thereof was evaluated on the basis of the number of packages poor in continuity out of the number (10) of the packages tested.

Examples C

[Production of Encapsulating Epoxy Resin Molding Materials]

Components described below were blended so that the amount of each of the components would be a part or parts by weight shown in Table 18, and then the resultant was roll-kneaded at a kneading temperature of 80° C. for a kneading time of 10 minutes. In this way, encapsulating epoxy resin molding materials according to Examples C1 to C4 and Comparative Examples C1 to C4 were produced.

(Epoxy Resin)

Epoxy resin A: a biphenyl epoxy resin having an epoxy equivalent of 196 and a melting point 106° C. (trade name: EPIKOTE YX-4000H, manufactured by Japan Epoxy Resins Co., Ltd.)

Epoxy resin B: a biphenyl epoxy resin having an epoxy equivalent of 176 and a melting point 125° C. (trade name: EPIKOTE YL-6121H, manufactured by Japan Epoxy Resins Co., Ltd.)

Epoxy resin C: a triphenolmethane epoxy resin having a softening point of 60° C. and a melt viscosity of 2.4 poises at 150° C. (trade name: EPIKOTE E1032H, manufactured by Japan Epoxy Resins Co., Ltd.)

Epoxy resin D: a bisphenol F epoxy resin having an epoxy equivalent of 186 and a melting point of 75° C. (trade name: YSLV-80XY, manufactured by Nippon Steel Chemical Co., Ltd.)

(Curing Agents)

Phenol resin A: a triphenolmethane phenol resin having a hydroxyl equivalent of 103 and a melt viscosity of 1.3 poises at 150° C. (trade name: MEH-7500-3S, manufactured by Meiwa Plastic Industries, Ltd.)

Phenol resin B: a phenol Novolak resin having a softening point of 80° C. and a hydroxyl equivalent of 106 (trade name: H-1, manufactured by Meiwa Plastic Industries, Ltd.)

(Curing Accelerator)

Curing accelerator A: an adduct of triphenylphosphine and p-benzoquinone

Curing accelerator B: an adduct of tris(4-methylphenyl)phosphine and p-benzoquinone (Releasing Agent)

Releasing agent A: a polyethylene wax (manufactured by Clariant Co.)

Releasing agent B: a montanoic acid ester (manufactured by Clariant Co.)

(Flame Retardant)

Flame retardant: a bisphenol A brominated epoxy resin having an epoxy equivalent of 375, a softening point of 80° C.

and a bromine content of 48% by weight (trade name: ESB-400T, manufactured by Sumitomo Chemical Co., Ltd.).

Flame retardant aid: antimony trioxide (Coloring Agent)

Carbon black: carbon black (trade name: MA-100, manufactured by Mitsubishi Chemical Corp.)

(Other Additives)

Additive A: a polyether modified silicone oil (Dow Corning Toray Silicone Co., Ltd.)
Additive B: an epoxy modified silicone oil (Dow Corning Toray Silicone Co., Ltd.)
Additive C: hydrotalcite
Additive D: bismuth hydroxide (Coupling Agents)

Coupling agent A: γ-anilinopropyltrimethoxysilane (anilinosilane)
Coupling agent B: methyltrimethoxysilane
Coupling agent C: γ-mercaptopropyltrimethoxysilane
Coupling agent D: γ-glycidoxypropyltrimethoxysilane (epoxysilane)

(Inorganic Fillers)

Fused silicas: all spherical fused silicas (1) Void Area Evaluating Method

A semiconductor element of length 9.1 mm×width 8.2 mm×thickness 0.4 mm (area: 74.6 mm$^2$) which had a bump diameter of 200 μm, a bump depth of 135 μm and a bump pitch of 490 μm was fixed onto the central position of a cavity, and an encapsulating epoxy resin molding material was used to perform vacuum transfer molding under the following molding conditions: a mold temperature of 165° C., a molding pressure of 4.4 MPa, a vacuum degree of 0.1 MPa, a cavity inside filling time of 7.5 seconds, and a curing time of 90 seconds. In this way, a molded product of length 14 mm×width 22 mm×thickness 0.7 mm was produced.

Voids generated in the bump portions of the molded product were photographed at a magnification of X. From the area SP of voids on the photograph and the magnification, the actual area of the voids was calculated, using the following equation (xx):

$$SB = SP/X \tag{xx}$$

The encapsulating epoxy resin molding material of the present invention for flip chip packaging has a high filling ability required for an under filler, gives only a small amount of molding defects such as voids, and further is excellent in reliabilities such as reflow resistance and humidity resistance. Thus, the industrial value thereof is large.

TABLE 18

|  | Examples C | | | | | | | |
| --- | --- | --- | --- | --- | --- | --- | --- | --- |
|  | 1 | 2 | 3 | 4 | 5 | 6 | 7 | 8 |
| Epoxy resin A | 6.06 |  |  |  | 5.96 | 5.06 |  |  |
| Epoxy resin B |  | 6.84 | 6.97 |  |  |  |  | 6.26 |
| Epoxy resin C |  |  |  | 5.41 |  |  | 6.74 |  |
| Epoxy resin D |  |  |  | 2.25 |  |  | 0.9 |  |
| Phenol resin | 3.6 | 4.42 | 4.51 | 4.87 | 3.54 | 3.54 | 4.95 | 4.07 |
| Curing accelerator | 0.32 | 0.24 | 0.25 | 0.18 | 0.32 | 0.16 | 0.16 | 0.18 |
| Releasing agent | 0.32 | 0.14 | 0.33 | 0.15 | 0.32 | 0.06 | 0.15 | 0.12 |
| Flame retardant | 1.07 | 1.21 | 1.23 | 1.35 | 1.05 | 0.56 | 1.35 | 1.1 |
| Flame retardant aid | 1.07 | 1.21 | 1.23 | 1.35 | 1.05 | 0.34 | 1.35 | 1.1 |
| Carbon black | 0.36 | 0.24 | 0.25 | 0.27 | 0.35 | 0.15 | 0.27 | 0.22 |
| Additive | 1.72 | 1.93 | 1.97 | 1.71 | 1.68 | 0.06 | 2.16 | 1.76 |
| Coupling agent A *1 | 0.31 | 0.35 | 0.17 | 0.19 | 0.47 |  | 0.39 | 0.32 |
| Coupling agent B *2 | 0.21 | 0.24 | 0.12 | 0.14 | 0.32 | 0.25 | 0.27 | 0.22 |
| Coupling agent C *3 | 0.01 | 0.01 | 0.01 | 0.01 | 0.01 | 0.01 | 0.01 | 0.01 |
| Coupling agent D *4 |  |  |  |  |  | 0.37 |  |  |
| Fused silica A *5 | 76.46 |  |  |  | 76.48 | 80.46 |  |  |
| Fused silica B *6 |  | 66.52 | 66.5 | 65.35 |  |  |  |  |
| Fused silica C *7 |  |  |  |  |  |  | 56.92 |  |
| Fused silica D *8 |  |  |  |  |  |  |  | 76 |
| Fused silica E *9 | 8.49 |  |  |  | 8.47 | 8.93 |  | 8.47 |
| Fused silica F *10 |  | 16.65 | 16.65 | 16.31 |  |  | 24.37 |  |
| Average particle size (μm) | 13.5 | 8.46 | 8.46 | 8.46 | 13.5 | 13.5 | 4.3 | 15.3 |
| Specific surface area (m2/g) | 3.43 | 4.62 | 4.62 | 4.62 | 3.43 | 3.43 | 3.04 | 3.4 |
| Coupling coverage ratio (%) | 0.77 | 0.65 | 0.34 | 0.375 | 1.13 | 0.86 | 1.14 | 0.79 |
| Heating reduction ratio (% by mass) | 0.185 | 0.223 | 0.142 | 0.142 | 0.279 | 0.254 | 0.216 | 0.191 |
| Void area (mm2) | 0.103 | 0.124 | 0.115 | 0.11 | 0.181 | 0.146 | 0.149 | 0.175 |

Abbreviations in the Table have the following meanings.
*1: minimum coverage area: 307.0 m$^2$/g
*2: minimum coverage area: 575.6 m$^2$/g
*3: minimum coverage area: 399.4 m$^2$/g
*4: minimum coverage area: 315.2 m$^2$/g
*5: average particle size: 11.7 μm, specific surface area: 3.2 m$^2$/g
*6: average particle size: 10.8 μm, specific surface area: 4.2 m$^2$/g
*7: average particle size: 9.3 μm, specific surface area: 1.6 m$^2$/g
*8: average particle size: 13.5 μm, specific surface area: 3.2 m$^2$/g
*9: average particle size: 0.6 μm, specific surface area: 5.5 m$^2$/g
*10: average particle size: 0.5 μm, specific surface area: 6.3 m$^2$/g

Examples D

The present invention will be described by way of the following working examples. However, the scope of the invention is not limited to these examples. Each encapsulating epoxy resin molding material and each semiconductor device were evaluated on the basis of evaluating methods which will be described later unless otherwise specified.

[Production of Encapsulating Epoxy Resin Molding Materials]

Components described below were blended so that the amount of each of the components would be a part or parts by weight shown in Table 19 or 20, and then the resultant was kneaded with a kneader at a blending powder supplying amount of 200 kg/h. In this way, encapsulating epoxy resin molding materials D1 to D13 were produced.

(Epoxy Resins)

As epoxy resins, the following were used: a biphenyl epoxy resin having an epoxy equivalent of 196 and a melting point of 106° C. (trade name: EPIKOTE YX-4000H, manufactured by Japan Epoxy Resins Co., Ltd.); a bisphenol F epoxy resin having an epoxy equivalent of 186 and a melting point of 75° C. (trade name: YSLV-80XY, manufactured by Nippon Steel Chemical Co., Ltd.); a sulfur-containing epoxy resin having an epoxy equivalent of 245 and a melting point of 110° C. (trade name: YSLV-120TE, manufactured by Nippon Steel Chemical Co., Ltd.); an o-cresol Novolak epoxy resin having an epoxy equivalent of 195 and a melting point of 65° C. (trade name: ESCN-190, manufactured by Sumitomo Chemical Co., Ltd.); and a triphenolmethane epoxy resin (a polyfunctional epoxy resin) having an epoxy equivalent of 170, a softening point of 70° C., and a melt viscosity of 3.1 poises at 150° C. (trade name: EPIKOTE E1032H, manufactured by Japan Epoxy Resins Co., Ltd.).

(Curing Agents)

As curing agents, the following were used: a phenol/aralkyl resin having a softening point of 70° C. and a hydroxyl equivalent of 175 (trade name: Milex (transliteration) XL-225, manufactured by Mitsui Chemicals, Inc.); a phenol Novolak resin having a softening point of 80° C. and a hydroxyl equivalent of 106 (trade name: H-1, manufactured by Meiwa Plastic Industries, Ltd.); and a polyfunctional phenol resin having a softening point of 83° C. and a hydroxyl equivalent of 103 (trade name: MEH-7500-3S, manufactured by Meiwa Plastic Industries, Ltd.).

(Curing Accelerator)

As an accelerator, an adduct (curing accelerator) of triphenylphosphine and p-benzoquinone was used.

(Coupling Agents)

As coupling agents, the following were used: γ-glycidoxypropyltrimethoxysilane (epoxysilane), and a silane coupling agent containing a secondary amino group (γ-anilinopropyltrimethoxysilane (anilinosilane)).

(Flame Retardants)

As flame retardants, the following were used: antimony trioxide, and a bisphenol A brominated epoxy resin having a softening point of 80° C. and a bromine content of 48% by weight (trade name: ESB-400T, manufactured by Sumitomo Chemical Co., Ltd.).

(Silicones)

As silicones, methylphenylsilicone and silicone rubber were used.

(Inorganic Fillers)

As inorganic fillers, there were used spherical fused silicas having an average particle size of 28 μm, an average particle size of 20 μm, an average particle size of 8 μm, and an average particle size of 0.5 μm, respectively.

(Other Additives)

As other additives, a higher fatty acid wax and carbon black were used.

TABLE 19

| Items | Epoxy resin molding materials D | | | | | | |
|---|---|---|---|---|---|---|---|
| | 1 | 2 | 3 | 4 | 5 | 6 | 7 |
| o-Cresol Novolak epoxy resin | | | | | 7.4 | 6.7 | 4.6 |
| Biphenyl epoxy resin | | | 6.9 | 7 | | | 1.4 |
| Sulfur-containing epoxy resin | | | | | | | |
| Polyfunctional epoxy resin | 4 | 5.5 | | | | | |
| Bisphenol F epoxy resin | 3.6 | 2.3 | | | | | |
| Bisphenol A brominated epoxy resin | 1.3 | 1.4 | 1.2 | 1.2 | 1.3 | 1.2 | 0.7 |
| Phenol Novolak resin | | | | | | | 1.8 |
| Phenol aralkyl resin | | | | | 6.2 | 5.7 | 2.2 |
| Polyfunctional phenol resin | 4.8 | 4.9 | 4.5 | 4.6 | | | |
| Adduct of triphenylphosphine and p-benzoquinone | 0.2 | 0.2 | 0.2 | 0.2 | 0.2 | 0.2 | 0.1 |
| Epoxysilane | | | | | 0.4 | 0.4 | |
| Anilinosilane | 0.4 | 0.2 | 0.4 | 0.2 | | | 0.3 |
| Higher fatty acid wax | 0.1 | 0.1 | 0.1 | 0.1 | 0.1 | 0.1 | 0.1 |
| Carbon black | 0.3 | 0.3 | 0.2 | 0.2 | 0.2 | 0.2 | 0.1 |
| Antimony trioxide | 1.3 | 1.4 | 1.2 | 1.2 | 0.5 | 0.5 | 0.4 |
| Silicone rubber | | | | | | | |
| Methyl phenyl silicone | 1.3 | 1.4 | 1.2 | 1.2 | | | |
| Fused silica having an average particle size of 28 μm | | | | | | | |
| Fused silica having an average particle size of 20 μm | | | | | 75.3 | 76.5 | |
| Fused silica having an average particle size of 8 μm | 66.1 | 65.9 | 67.3 | 67.3 | | | 79.4 |
| Fused silica having an average particle size of 0.5 μm | 16.6 | 16.4 | 16.8 | 16.8 | 8.4 | 8.5 | 8.9 |
| Total | 100 | 100 | 100 | 100 | 100 | 100 | 100 |

TABLE 20

| Items | Epoxy resin molding materials D | | | | | |
|---|---|---|---|---|---|---|
| | 8 | 9 | 10 | 11 | 12 | 13 |
| o-Cresol Novolak epoxy resin | | | | | | |
| Biphenyl epoxy resin | 6.7 | 5.1 | | | 6.3 | 5.2 |
| Sulfur-containing epoxy resin | | | 5.1 | | | |
| Polyfunctional epoxy resin | | | | 7.6 | | |
| Bisphenol F epoxy resin | | | | | | |
| Bisphenol A brominated epoxy resin | 1.2 | 0.6 | 0.9 | 1.3 | 1.1 | 0.9 |
| Phenol Novolak resin | | | | | | |
| Phenol aralkyl resin | 6.6 | 4.9 | 2.9 | | | |
| Polyfunctional phenol resin | | | | 4.9 | 1.9 | 1.5 |

TABLE 20-continued

| | Epoxy resin molding materials D | | | | | |
|---|---|---|---|---|---|---|
| Items | 8 | 9 | 10 | 11 | 12 | 13 |
| Adduct of triphenylphosphine and p-benzoquinone | 0.3 | 0.2 | 0.2 | 0.1 | 0.2 | 0.2 |
| Epoxysilane | 0.4 | | | | | |
| Anilinosilane | | 0.3 | 0.3 | 0.4 | 0.3 | 0.3 |
| Higher fatty acid wax | 0.1 | 0.1 | 0.1 | 0.1 | 0.1 | 0.1 |
| Carbon black | 0.1 | 0.1 | 0.2 | 0.3 | 0.2 | 0.2 |
| Antimony trioxide | 0.5 | 0.3 | 0.4 | 1.3 | 1.1 | 0.9 |
| Silicone rubber | | | | | 3.3 | 2.7 |
| Methyl phenyl silicone | | | | 1.3 | | |
| Fused silica having an average particle size of 28 μm | 50.5 | 61.9 | 67.5 | | | |
| Fused silica having an average particle size of 20 μm | | | | 74.4 | 77.0 | 79.3 |
| Fused silica having an average particle size of 8 μm | 25.2 | 17.7 | 17.9 | | | |
| Fused silica having an average particle size of 0.5 μm | 8.4 | 8.9 | 4.5 | 8.3 | 8.5 | 8.7 |
| Total | 100 | 100.1 | 100 | 100 | 100 | 100 |

Properties of the produced encapsulating epoxy resin molding materials D1 to D13 were evaluated about test items shown in tables (spiral flow, disc flow, hardness at hot time, bending modulus, mold shrinkage ratio, and glass transition temperature) The results are shown in Tables 21 and 22.

TABLE 21

| | | Epoxy resin molding materials D | | | | | | |
|---|---|---|---|---|---|---|---|---|
| Items | Unit | 1 | 2 | 3 | 4 | 5 | 6 | 7 |
| Spiral flow | inch | 90 | 73 | 92 | 93 | 53 | 52 | 45 |
| Disc flow | mm | 125 | 107 | 117 | 114 | 79 | 92 | 88 |
| Shore D hardness at hot time | — | 77 | 85 | 86 | 80 | 82 | 81 | 89 |
| Bending modulus | GPa | 17.8 | 18.3 | 18.5 | 18.5 | 21.6 | 22.3 | 23.8 |
| Mold shrinkage ratio | % | 0.189 | 0.122 | 0.13 | 0.142 | 0.344 | 0.339 | 0.165 |
| Glass transition temperature | ° C. | 163 | 184 | 165 | 161 | 140 | 142 | 146 |

TABLE 22

| | | Epoxy resin molding materials D | | | | | |
|---|---|---|---|---|---|---|---|
| Items | Unit | 8 | 9 | 10 | 11 | 12 | 13 |
| Spiral flow | inch | 58 | 54 | 47 | 77 | 75 | 57 |
| Disc flow | mm | 90 | 100 | 93 | 117 | 95 | 86 |
| Shore D hardness at hot time | — | 84 | 81 | 80 | 84 | 75 | 82 |
| Bending modulus | GPa | 20.8 | 23.4 | 25.6 | 17.1 | 19.7 | 22.2 |
| Mold shrinkage ratio | % | 0.362 | 0.169 | 0.164 | 0.177 | 0.181 | 0.145 |
| Glass transition temperature | ° C. | 118 | 138 | 132 | 185 | 163 | 159 |

[Production of Semiconductor Devices D1 (Flip Chip BGAs)]

Next, the encapsulating epoxy resin molding materials D1 to D13 were used to produce semiconductor devices of Examples D1 to D10 and Comparative Examples D1 to D3. Encapsulation with each of the encapsulating epoxy resin molding materials was performed by using a transfer molding machine to mold the material under conditions of a molding temperature of 180° C., a molding pressure of 6.9 MPa and a curing time of 90 seconds and then curing the molded material at 180° C. for 5 hours.

Examples D1 to D10 (Tables 23 and 24)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 40 mm×width 80 mm×thickness 0.6 mm. The substrate was dried at 120° C. for 2 hours, and then a semiconductor element of length 9 mm×width 8 mm×thickness 0.4 mm (area: 72 mm$^2$) to which 160 bumps having a bump diameter of 145 μm and a bump pitch of 200 μm were fitted, was mounted on the substrate by IR reflow treatment at 260° C. for 10 seconds. The bump height after the mounting was 110 μm. Next, the encapsulating epoxy resin molding materials D1 to D4; D7 and D9 to D13 were each used and molded into a size of length 30 mm×width 70 mm×thickness 0.8 mm on the semiconductor element mounted surface by vacuum transfer molding under the above-mentioned conditions. In this way, flip chip BGA devices of Examples D1 to D10 were each produced.

Comparative Examples D1 to D3 (Table 25)

The encapsulating epoxy resin molding materials D5, D6 and D8 were used to produce semiconductor devices of Comparative Examples D1 to D3 in the same way as in Examples D1 to D10.

TABLE 23

| Items | Example D | | | | |
|---|---|---|---|---|---|
| | 1 | 2 | 3 | 4 | 5 |
| Epoxy resin molding material D | 1 | 2 | 3 | 4 | 7 |
| External form of a substrate for mounting a semiconductor element | Length 40 mm × width 80 mm × thickness 0.6 mm | | | | |
| Semiconductor element external form | Length 9 mm × width 8 mm × thickness 0.4 mm | | | | |
| Semiconductor element bump diameter | 145 μm | | | | |
| Semiconductor element bump pitch | 200 μm | | | | |
| Semiconductor element bump number | 160 | | | | |
| Semiconductor element encapsulation external form | Length 30 mm × width 70 mm × thickness 0.8 mm | | | | |

TABLE 24

| Items | Example D | | | | |
|---|---|---|---|---|---|
| | 6 | 7 | 8 | 9 | 10 |
| Epoxy resin molding material D | 9 | 10 | 11 | 12 | 13 |
| External form of a substrate for mounting a semiconductor element | Length 40 mm × width 80 mm × thickness 0.6 mm | | | | |
| Semiconductor element external form | Length 9 mm × width 8 mm × thickness 0.4 mm | | | | |
| Semiconductor element bump diameter | 145 μm | | | | |
| Semiconductor element bump pitch | 200 μm | | | | |
| Semiconductor element bump number | 160 | | | | |
| Semiconductor element encapsulation external form | Length 30 mm × width 70 mm × thickness 0.8 mm | | | | |

TABLE 25

| Items | Comparative Example D | | |
|---|---|---|---|
| | 1 | 2 | 3 |
| Epoxy resin molding material D | 5 | 6 | 8 |
| External form of a substrate for mounting a semiconductor element | Length 40 mm × width 80 mm × thickness 0.6 mm | | |
| Semiconductor element external form | Length 9 mm × width 8 mm × thickness 0.4 mm | | |
| Semiconductor element bump diameter | 145 μm | | |
| Semiconductor element bump pitch | 200 μm | | |
| Semiconductor element bump number | 160 | | |
| Semiconductor element encapsulation external form | Length 30 mm × width 70 mm × thickness 0.8 mm | | |

[Production of Semiconductor Devices D2 (Flip Chip BGAs)]

Next, the encapsulating epoxy resin molding materials D1 to D13 were used to produce semiconductor devices of Examples D11 to D20 and Comparative Examples D4 to D6. Encapsulation with each of the encapsulating epoxy resin molding materials was performed by using a transfer molding machine to mold the material under conditions of a molding temperature of 180° C., a molding pressure of 6.9 MPa and a curing time of 90 seconds and then curing the molded material at 180° C. for 5 hours.

Examples D11 to D20 (Tables 26 and 27)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 50 mm×width 100 mm×thickness 0.6 mm. The substrate was dried at 120° C. for 2 hours, and then a semiconductor element of length 9 mm×width 8 mm×thickness 0.4 mm (area: 72 mm$^2$), to which 160 bumps having a bump diameter of 145 μm and a bump pitch of 200 μm were fitted, was mounted on the substrate by IR reflow treatment at 260° C. for 10 seconds. The bump height after the mounting was 110 μm. Next, the encapsulating epoxy resin molding materials D1 to D4, D7 and D9 to D13 were each used and molded into a size of length 40 mm×width 90 mm×thickness 0.8 mm on the semiconductor element mounted surface by vacuum transfer molding under the above-mentioned conditions. In this way, flip chip BGA devices of Examples D11 to D20 were each produced.

Comparative Examples D4 to D6 (Table 28)

The encapsulating epoxy resin molding materials D5, D6 and D8 were used to produce semiconductor devices of Comparative Examples D4 to D6 in the same way as in Examples D11 to D20.

TABLE 26

| Items | Example D | | | | |
|---|---|---|---|---|---|
| | 11 | 12 | 13 | 14 | 15 |
| Epoxy resin molding material D | 1 | 2 | 3 | 4 | 7 |
| External form of a substrate for mounting a semiconductor element | Length 50 mm × width 100 mm × thickness 0.6 mm | | | | |
| Semiconductor element external form | Length 9 mm × width 8 mm × thickness 0.4 mm | | | | |
| Semiconductor element bump diameter | 145 μm | | | | |
| Semiconductor element bump pitch | 200 μm | | | | |
| Semiconductor element bump number | 160 | | | | |
| Semiconductor element encapsulation external form | Length 40 mm × width 90 mm × thickness 0.8 mm | | | | |

TABLE 27

| Items | Example D | | | | |
|---|---|---|---|---|---|
| | 16 | 17 | 18 | 19 | 20 |
| Epoxy resin molding material D | 9 | 10 | 11 | 12 | 13 |
| External form of a substrate for mounting a semiconductor element | Length 50 mm × width 100 mm × thickness 0.6 mm | | | | |
| Semiconductor element external form | Length 9 mm × width 8 mm × thickness 0.4 mm | | | | |
| Semiconductor element bump diameter | 145 μm | | | | |
| Semiconductor element bump pitch | 200 μm | | | | |
| Semiconductor element bump number | 160 | | | | |
| Semiconductor element encapsulation external form | Length 40 mm × width 90 mm × thickness 0.8 mm | | | | |

TABLE 28

|  | Comparative Example D | | |
|---|---|---|---|
| Items | 4 | 5 | 6 |
| Epoxy resin molding material D | 5 | 6 | 8 |
| External form of a substrate for mounting a semiconductor element | Length 50 mm × width 100 mm × thickness 0.6 mm | | |
| Semiconductor element external form | Length 9 mm × width 8 mm × thickness 0.4 mm | | |
| Semiconductor element bump diameter | 145 μm | | |
| Semiconductor element bump pitch | 200 μm | | |
| Semiconductor element bump number | 160 | | |
| Semiconductor element encapsulation external form | Length 40 mm × width 90 mm × thickness 0.8 mm | | |

[Production of Semiconductor Devices 3 (Flip Chip BGAs)]

Next, the encapsulating epoxy resin molding materials D1 to D13 were used to produce semiconductor devices of Examples D21 to D30 and Comparative Examples D7 to D9. Encapsulation with each of the encapsulating epoxy resin molding materials was performed by using a transfer molding machine to mold the material under conditions of a molding temperature of 180° C., a molding pressure of 6.9 MPa and a curing time of 90 seconds and then curing the molded material at 180° C. for 5 hours.

Examples D21 to D30 (Tables 29 and 30)

A fine wiring pattern was formed on an insulated base (trade name: E-679, a glass cloth-epoxy resin laminated plate, manufactured by Hitachi Chemical Co., Ltd.), and then an insulated protecting resin (trade name: PSR 4000 AUS5, manufactured by Taiyo Ink Mfg. Co., Ltd.) was applied onto surfaces of the resultant except gold-plated terminals on a semiconductor element mounting side surface thereof and outside-connecting terminals on the opposite side surface, so as to form a semiconductor mounting substrate of length 60 mm×width 120 mm×thickness 0.6 mm. The substrate was dried at 120° C. for 2 hours, and then a semiconductor element of length 9 mm×width 8 mm×thickness 0.4 mm (area: 72 mm$^2$) to which 160 bumps having a bump diameter of 145 μm and a bump pitch of 200 μm were fitted, was mounted on the substrate by IR reflow treatment at 260° C. for 10 seconds. The bump height after the mounting was 110 μm. Next, the encapsulating epoxy resin molding materials D1 to D4, D7 and D9 to D13 were each used and molded into a size of length 50 mm×width 110 mm×thickness 0.8 mm on the semiconductor element mounted surface by vacuum transfer molding under the above-mentioned conditions. In this way, flip chip BGA devices of Examples D21 to D30 were each produced.

Comparative Examples D7 to D9 (Table 31)

The encapsulating epoxy resin molding materials D5, D6 and D8 were used to produce semiconductor devices of Comparative Examples D7 to D9 in the same way as in Examples D21 to D30.

TABLE 29

|  | Example D | | | | |
|---|---|---|---|---|---|
| Items | 21 | 22 | 23 | 24 | 25 |
| Epoxy resin molding material D | 1 | 2 | 3 | 4 | 7 |
| External form of a substrate for mounting a semiconductor element | Length 60 mm × width 120 mm × thickness 0.6 mm | | | | |

TABLE 29-continued

|  | Example D | | | | |
|---|---|---|---|---|---|
| Items | 21 | 22 | 23 | 24 | 25 |
| Semiconductor element external form | Length 9 mm × width 8 mm × thickness 0.4 mm | | | | |
| Semiconductor element bump diameter | 145 μm | | | | |
| Semiconductor element bump pitch | 200 μm | | | | |
| Semiconductor element bump number | 160 | | | | |
| Semiconductor element encapsulation external form | Length 50 mm × width 110 mm × thickness 0.8 mm | | | | |

TABLE 30

|  | Example D | | | | |
|---|---|---|---|---|---|
| Items | 26 | 27 | 28 | 29 | 30 |
| Epoxy resin molding material D | 9 | 10 | 11 | 12 | 13 |
| External form of a substrate for mounting a semiconductor element | Length 60 mm × width 120 mm × thickness 0.6 mm | | | | |
| Semiconductor element external form | Length 9 mm × width 8 mm × thickness 0.4 mm | | | | |
| Semiconductor element bump diameter | 145 μm | | | | |
| Semiconductor element bump pitch | 200 μm | | | | |
| Semiconductor element bump number | 160 | | | | |
| Semiconductor element encapsulation external form | Length 50 mm × width 110 mm × thickness 0.8 mm | | | | |

TABLE 31

|  | Comparative Example D | | |
|---|---|---|---|
| Items | 7 | 8 | 9 |
| Epoxy resin molding material D | 5 | 6 | 8 |
| External form of a substrate for mounting a semiconductor element | Length 60 mm × width 120 mm × thickness 0.6 mm | | |
| Semiconductor element external form | Length 9 mm × width 8 mm × thickness 0.4 mm | | |
| Semiconductor element bump diameter | 145 μm | | |
| Semiconductor element bump pitch | 200 μm | | |
| Semiconductor element bump number | 160 | | |
| Semiconductor element encapsulation external form | Length 50 mm × width 110 mm × thickness 0.8 mm | | |

The produced semiconductor devices of Examples D1 to D30 and Comparative Examples D1 to D9 were evaluated through tests about substrate warp. Their glass transition points, bending moduli, mold shrinkage ratios and filling abilities at the time of molding the semiconductor element were compared. The evaluation results are shown in Tables 32 to 35.

TABLE 32

| Items | Unit | Example D 1 | 2 | 3 | 4 | 5 | 6 | 7 | 8 | 9 | 10 |
|---|---|---|---|---|---|---|---|---|---|---|---|
| Epoxy resin molding material D | — | 1 | 2 | 3 | 4 | 7 | 9 | 10 | 11 | 12 | 13 |
| Glass transition temperature | ° C. | 163 | 184 | 165 | 161 | 146 | 138 | 132 | 185 | 163 | 159 |
| Bending modulus | GPa | 17.8 | 18.3 | 18.5 | 18.5 | 23.8 | 23.4 | 25.6 | 17.1 | 19.7 | 22.2 |
| Mold shrinkage ratio | % | 0.189 | 0.122 | 0.130 | 0.142 | 0.165 | 0.169 | 0.164 | 0.177 | 0.181 | 0.145 |
| substrate warp | mm | 0.9 | 1.1 | 1.1 | 1.0 | 4.5 | 3.8 | 4.2 | 1.1 | 2.4 | 1.8 |
| filling ability when being molded | Area % | 100 | 100 | 100 | 100 | 66 | 100 | 71 | 100 | 100 | 75 |

TABLE 33

| Items | Unit | Example D 11 | 12 | 13 | 14 | 15 | 16 | 17 | 18 | 19 | 20 |
|---|---|---|---|---|---|---|---|---|---|---|---|
| Epoxy resin molding material D | — | 1 | 2 | 3 | 4 | 7 | 9 | 10 | 11 | 12 | 13 |
| Glass transition temperature | ° C. | 163 | 184 | 165 | 161 | 146 | 138 | 132 | 185 | 163 | 159 |
| Bending modulus | GPa | 17.8 | 18.3 | 18.5 | 18.5 | 23.8 | 23.4 | 25.6 | 17.1 | 19.7 | 22.2 |
| Mold shrinkage ratio | % | 0.189 | 0.122 | 0.130 | 0.142 | 0.165 | 0.169 | 0.164 | 0.177 | 0.181 | 0.145 |
| substrate warp | mm | 1.5 | 1.6 | 1.4 | 1.5 | 4.9 | 4.0 | 4.8 | 1.7 | 2.8 | 2.2 |
| filling ability when being molded | Area % | 100 | 100 | 100 | 100 | 54 | 90 | 71 | 98 | 94 | 71 |

TABLE 34

| Items | Unit | Example D 21 | 22 | 23 | 24 | 25 | 26 | 27 | 28 | 29 | 30 |
|---|---|---|---|---|---|---|---|---|---|---|---|
| Epoxy resin molding material D | — | 1 | 2 | 3 | 4 | 7 | 9 | 10 | 11 | 12 | 13 |
| Glass transition temperature | ° C. | 163 | 184 | 165 | 161 | 146 | 138 | 132 | 185 | 163 | 159 |
| Bending modulus | GPa | 17.8 | 18.3 | 18.5 | 18.5 | 23.8 | 23.4 | 25.6 | 17.1 | 19.7 | 22.2 |
| Mold shrinkage ratio | % | 0.189 | 0.122 | 0.130 | 0.142 | 0.165 | 0.169 | 0.164 | 0.177 | 0.181 | 0.145 |
| substrate warp | mm | 1.8 | 2.0 | 1.9 | 1.9 | 5.0 | 4.3 | 5.0 | 2.0 | 3.1 | 2.5 |
| filling ability when being molded | Area % | 100 | 100 | 100 | 100 | 66 | 77 | 52 | 88 | 84 | 58 |

TABLE 35

| Items | Unit | Example D 1 | 2 | 3 | 4 | 5 | 6 | 7 | 8 | 9 |
|---|---|---|---|---|---|---|---|---|---|---|
| Epoxy resin molding material D | — | 5 | 6 | 8 | 5 | 6 | 8 | 5 | 6 | 8 |
| Glass transition temperature | ° C. | 140 | 142 | 118 | 140 | 142 | 118 | 140 | 142 | 118 |
| Bending modulus | GPa | 21.6 | 22.3 | 20.8 | 21.6 | 22.3 | 20.8 | 21.6 | 22.3 | 20.8 |
| Mold shrinkage ratio | % | 0.344 | 0.339 | 0.362 | 0.344 | 0.339 | 0.362 | 0.344 | 0.339 | 0.362 |
| substrate warp | mm | 10.5 | 12.8 | 8.8 | 13.6 | 15.1 | 10.2 | 15.5 | 18.0 | 12.7 |
| filling ability when being molded | Area % | 62 | 84 | 95 | 52 | 77 | 84 | 41 | 63 | 71 |

Comparative Examples 1 to 9, which were encapsulated by the epoxy resin molding materials D5, D6 and D8 each satisfying none of conditions that the glass transition temperature based on TMA method is 150° C. or higher, the bending modulus based on JIS K6911 is 19 GPa or less and the mold shrinkage ratio based on JIS K6911 is 0.2% or less, each gave a large substrate warp and exhibited poor filling ability when the materials were each molded.

On the other hand, Examples 1 to 30, which were encapsulated by the epoxy resin molding materials D1 to D4, D7 and D9 to 10 each satisfying at least one of the above-mentioned conditions, gave a small substrate warp and exhibited good filling ability when the materials were molded. Examples encapsulated by the epoxy resin molding materials D1 to D4 and D11 each satisfying all of the above-mentioned conditions gave a substrate warp of 2.0 mm or less so as to be particularly good. Moreover, when the materials were molded, the amount of generated voids was small so that the filling ability thereof was particularly good.

[Evaluating Method]

(1) Spiral Flow

A spiral flow measuring mold according to EMMI-1-66 was used to mold an encapsulating epoxy resin molding material by means of a transfer molding machine under conditions of a mold temperature of 180° C., a molding pressure of 6.9 MPa, and a curing time of 90 seconds, and then the flowing distance (inch) thereof was obtained.

(2) Disc Flow

A disc flow measuring planar molds having a top part of 200 mm (W)×200 mm (D)×25 mm (H) and a bottom part of 200 mm (W)×200 mm (D)×15 mm (H) was used, and precisely-weighed five grams of a sample (encapsulating epoxy resin molding material) was put onto the center of the bottom part heated to 180° C. After 5 seconds therefrom, the top part heated to 180° C. was tightened thereon, and then the sample was compression-molded at a load of 78 N for a curing time of 90 seconds. The long diameter (mm) and the short diameter (mm) of the molded product were measured with a vernier micrometer. The average value thereof was defined as the disc flow.

(3) Hardness at Hot Time

An encapsulating epoxy resin molding material was molded into a disc having a diameter of 50 mm and a thickness of 3 mm under conditions of molding temperature of 180° C., a molding pressure of 6.9 MPa and a curing time of 90 seconds. Immediately after the material was molded, the hardness thereof was measured with a Shore D hardness meter.

(4) Bending Modulus

A mold for molding a bending test piece according to JIS K6911 was used to mold a material by means of a transfer molding machine under conditions of a molding temperature of 180° C., a molding pressure of 6.9 MPa and a curing time of 90 seconds. Thereafter, the molded material was cured at 180° C. for 5 hours, and the bending modulus thereof was measured in accordance with the bending test method described in JIS K6911.

(5) Mold Shrinkage Ratio

A mold for mold shrinkage ratio measurement according to JIS K6911 was used to mold a material by means of a transfer molding machine under conditions of a molding temperature of 180° C., a molding pressure of 6.9 MPa and a curing time of 90 seconds. Thereafter, the molded material was cured at 180° C. for 5 hours, and the mold shrinkage ratio thereof was measured in accordance with the mold shrinkage ratio test method described in JIS K6911.

(6) Glass Transition Temperature

A mold for producing a test piece, 20 mm×4 mm×4 mm, was used to mold a material by means of a transfer molding machine under conditions of a molding temperature of 180° C., a molding pressure of 6.9 MPa and a curing time of 90 seconds. Thereafter, the molded material was cured at 180° C. for 5 hours, and then a TMA device (TSC 1000) manufactured by Mac Science Corp. was used to measure the glass transition temperature and the thermal expansion coefficient thereof by TMA method (differential expansion method).

(7) Substrate Warp Amount

A flip chip GBA substrate subjected to resin-molding was put onto a horizontal flat face. One end of the substrate along the longitudinal direction thereof was fixed by means of a 50 g balance weight. The rising dimension of the other end from the flat face was read out up to a level of 1/10 mm by use of a metallic square.

(8) Filling Ratio at Molding Time

An ultrasonic inquiry video system (HYE-HOCUS model, manufactured by Hitachi Construction Machinery Co., Ltd.) was used to observe the inside of semiconductor devices. The ratio (% by area) of the filled area to the encapsulating area was calculated.

INDUSTRIAL APPLICABILITY

The encapsulating epoxy resin molding material of the present invention for flip chip packaging has a high filling ability required for an under filler and gives only a small amount of molding defects such as voids. Thus, the industrial value thereof is large. Furthermore, the encapsulating epoxy resin molding material of the present invention for flip chip packaging has a low warp property required for an under filler and exhibits a good flow characteristic. Thus, the industrial value thereof is large.

It would be understood by those skilled in the art that the above are preferred embodiments of this invention and various modifications and revisions can be carried out without disobeying the spirit and the scope of this invention.

The invention claimed is:

1. An encapsulating solid epoxy resin molding material, comprising (A) an epoxy resin, (B) a curing agent, and (C) a silica,
   wherein (C) the silica has a maximum diameter size of at least 32 μm, an average particle size of 12 μm or less and a specific surface area of 3.0 m²/g or more, and
   wherein (C) the silica satisfies the following conditions: the amount of particles having a particle size of 12 μm or less is 50% or more by weight; the amount of particles having a particle size of 24 μm or less is 70% or more by weight; and the amount of particles having a particle size of 32 μm or less is 80% or more by weight; the amount of particles having a particle size of 48 μm or less is 90% or more by weight.

2. The encapsulating solid epoxy resin molding material according to claim 1, wherein the melt viscosity of the epoxy resin (A) is 2 poises or less at 150° C.

3. The encapsulating solid epoxy resin molding material according to claim 1, wherein the epoxy resin (A) comprises at least one of a biphenyl epoxy resin, a bisphenol F epoxy resin, a stylbene epoxy resin, a sulfur-containing epoxy resin, a Novolak epoxy resin, a dicyclopentadiene epoxy resin, a naphthalene epoxy resin and a triphenylmethane epoxy resin.

4. The encapsulating solid epoxy resin molding material according to claim 1, wherein the melt viscosity of the curing agent (B) is 2 poises or less at 150° C.

5. The encapsulating solid epoxy resin molding material according to claim 1, wherein the curing agent (B) comprises at least one of a biphenyl phenol resin, an aralkyl phenol resin, a dicyclopentadiene phenol resin, a triphenylmethane phenol resin, and a Novolak phenol resin.

6. The encapsulating solid epoxy resin molding material according to claim 1, further comprising a curing accelerator (F).

7. The encapsulating solid epoxy resin molding material according to claim 1, wherein the average particle size of (C) the silica is 10 μm or less.

8. The encapsulating solid epoxy resin molding material according to claim 1, wherein the specific surface area of (C) the silica is from 3.5 to 5.5 m²/g.

9. The encapsulating solid epoxy resin molding material according to claim 1, further comprising a coupling agent (D).

10. The encapsulating solid epoxy resin molding material according to claim 9, wherein the coupling agent (D) comprises (D2) a silane coupling agent having a secondary amino group.

11. The encapsulating solid epoxy resin molding material according to claim 10, wherein the silane coupling agent (D2), which has the secondary amino group, comprises a compound represented by the following general formula (I):

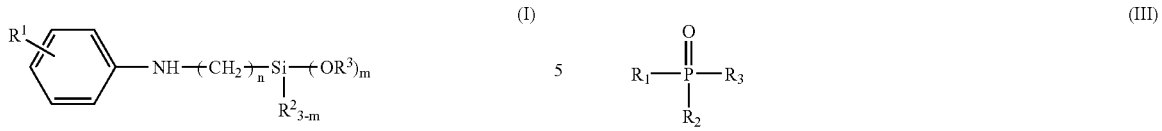
(I)

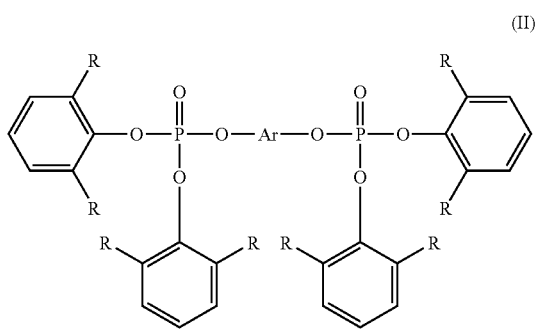
(III)

wherein $R^1$ is selected from a hydrogen atom, an alkyl group having 1 to 6 carbon atoms, and an alkoxy group having 1 to 2 carbon atoms, $R^2$ is selected from an alkyl group having 1 to 6 carbon atoms, and a phenyl group, $R^3$ represents a methyl or ethyl group, n represents an integer of 1 to 6, and m represents an integer of 1 to 3.

12. The encapsulating solid epoxy resin molding material according to claim 1, further comprising a phosphorus compound (F).

13. The encapsulating solid epoxy resin molding material according to claim 12, wherein the phosphorus compound (F) comprises a phosphate.

14. The encapsulating solid epoxy resin molding material according to claim 13, wherein the phosphate comprises a compound represented by the following general formula (II):

(II)

wherein eight R's, which may be the same or different, each represent an alkyl group having 1 to 4 carbon atoms, and Ar represents an aromatic ring.

15. The encapsulating solid epoxy resin molding material according to claim 12, wherein the phosphorus compound (E) comprises phosphine oxide.

16. The encapsulating solid epoxy resin molding material according to claim 15, wherein the phosphine oxide comprises a compound represented by the following general formula (III):

wherein $R^1$, $R^2$ and $R^3$, which may be the same or different, each represent a substituted or unsubstituted alkyl group having 1 to 10 carbon atoms, an aryl group, an aralkyl group, or a hydrogen atom provided that the case that all of $R^1$, $R^2$ and $R^3$ are hydrogen atoms is excluded.

17. The encapsulating solid epoxy resin molding material according to claim 9, wherein the filler coverage ratio of the coupling agent (D) is from 0.3 to 1.0.

18. The encapsulating solid epoxy resin molding material according to claim 9, wherein the heating loss ratio after heating at 200° C./hour is 0.25% or less by weight.

19. The encapsulating solid epoxy resin molding material according to claim 17, wherein the heating loss ratio after heating at 200° C./hour is 0.25% or less by weight.

20. A semiconductor device encapsulated by the encapsulating solid epoxy resin molding material according to claim 1.

21. An encapsulating solid epoxy resin molding material, comprising (A) an epoxy resin, (B) a curing agent, and (C) a silica,
wherein (C) the silica comprises 5% or more by weight of silica having a maximum particle size of 63 μm or less and particle sizes of 20 μm or more.

22. An encapsulating solid epoxy resin molding material, comprising (A) an epoxy resin, (B) a curing agent, and (C) an inorganic filler, and satisfying all of the following conditions: the glass transition temperature based on TMA method is 150° C. or higher; the bending modulus based on JIS-K 6911 is 19 GPa or less; and the mold shrinkage ratio based on JIS-K 6911 is 0.2% or less.

23. The encapsulating solid epoxy resin molding material according to claim 22, wherein the warp of a semiconductor device is 5.0 mm or less.

24. The encapsulating solid epoxy resin molding material according to claim 22, wherein the warp of a semiconductor device is 2.0 mm or less.

25. The encapsulating solid epoxy resin molding material according to claim 22, wherein the content by percentage of the inorganic filler (C) is from 70 to 90% by weight of the epoxy resin molding material.

* * * * *